US009890912B2

(12) United States Patent
Hashiya et al.

(10) Patent No.: US 9,890,912 B2
(45) Date of Patent: *Feb. 13, 2018

(54) LIGHT-EMITTING APPARATUS INCLUDING PHOTOLUMINESCENT LAYER

(71) Applicant: Panasonic Intellectual Property Management Co., Ltd., Osaka (JP)

(72) Inventors: Akira Hashiya, Osaka (JP); Taku Hirasawa, Kyoto (JP); Yasuhisa Inada, Osaka (JP); Yoshitaka Nakamura, Osaka (JP); Mitsuru Nitta, Kyoto (JP); Takeyuki Yamaki, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/214,837

(22) Filed: Jul. 20, 2016

(65) Prior Publication Data
US 2016/0327219 A1 Nov. 10, 2016

Related U.S. Application Data

(63) Continuation of application No. PCT/JP2015/000815, filed on Feb. 20, 2015.

(30) Foreign Application Priority Data

Feb. 28, 2014 (JP) .................................. 2014-037992
Jul. 30, 2014 (JP) .................................. 2014-154511

(51) Int. Cl.
*H01L 33/00* (2010.01)
*F21K 9/64* (2016.01)
(Continued)

(52) U.S. Cl.
CPC .................. *F21K 9/64* (2016.08); *F21S 2/00* (2013.01); *G02B 5/1809* (2013.01);
(Continued)

(58) Field of Classification Search
CPC ......... F21K 9/64; H01L 33/58; H01L 33/505; H01L 33/508; G02B 5/1861; G02B 5/1809; G02B 6/00; F21S 2/00
(Continued)

(56) References Cited

U.S. PATENT DOCUMENTS

| 5,517,039 A | 5/1996 | Holonyak, Jr. et al. |
| 5,732,102 A | 3/1998 | Bouadma |

(Continued)

FOREIGN PATENT DOCUMENTS

| JP | 9-073807 | 3/1997 |
| JP | 11-283751 | 10/1999 |

(Continued)

OTHER PUBLICATIONS

The Extended European Search Report dated Dec. 16, 2016 for the related European Patent Application No. 14883764.4.
(Continued)

*Primary Examiner* — Vu A Vu
(74) *Attorney, Agent, or Firm* — McDermott Will & Emery LLP

(57) ABSTRACT

A light-emitting apparatus includes a light-emitting device and an excitation light source. The light-emitting device includes a photoluminescent layer, a light-transmissive layer. At least one of the photoluminescent layer and the light-transmissive layer has a submicron structure having at least projections or recesses. Light emitted from the photoluminescent layer includes first light having a wavelength $\lambda_a$ in air. The distance $D_{int}$ between adjacent projections or recesses and the refractive index $n_{wav-a}$ of the photolumi-
(Continued)

nescent layer for the first light satisfy $\lambda_a/n_{wav-a} < D_{int} < \lambda_a$. A thickness of the photoluminescent layer, the refractive index $n_{wav-a}$, and the distance $D_{int}$ are set to limit a directional angle of the first light emitted from the light emitting surface. The excitation light source emits excitation light. The light-emitting device is integrally provided with the excitation light source.

18 Claims, 28 Drawing Sheets

(51) Int. Cl.
| | |
|---|---|
| F21S 2/00 | (2016.01) |
| G02B 6/00 | (2006.01) |
| G02B 5/18 | (2006.01) |
| H01L 33/58 | (2010.01) |
| H01L 33/50 | (2010.01) |

(52) U.S. Cl.
  CPC .............. G02B 5/1861 (2013.01); G02B 6/00 (2013.01); H01L 33/505 (2013.01); H01L 33/58 (2013.01); H01L 33/508 (2013.01)

(58) Field of Classification Search
  USPC .......................................................... 257/98
  See application file for complete search history.

(56) References Cited

U.S. PATENT DOCUMENTS

| | | | |
|---|---|---|---|
| 6,728,034 B1 | 4/2004 | Nakanishi et al. | |
| 7,619,357 B2 | 11/2009 | Onishi et al. | |
| 7,699,482 B2 | 4/2010 | Noguchi | |
| 8,619,363 B1 | 12/2013 | Coleman | |
| 2002/0180348 A1 | 12/2002 | Oda et al. | |
| 2003/0021314 A1 | 1/2003 | Yoshida et al. | |
| 2003/0169792 A1 | 9/2003 | Kim | |
| 2004/0141108 A1 | 7/2004 | Tanaka et al. | |
| 2004/0233534 A1 | 11/2004 | Nakanishi et al. | |
| 2006/0039433 A1 | 2/2006 | Simpson | |
| 2006/0088066 A1 | 4/2006 | He | |
| 2007/0031097 A1 | 2/2007 | Heikenfeld et al. | |
| 2007/0103931 A1 | 5/2007 | Lee et al. | |
| 2007/0138479 A1 | 6/2007 | Yamazaki et al. | |
| 2007/0153860 A1 | 7/2007 | Chang-Hasnain et al. | |
| 2008/0069497 A1* | 3/2008 | Tissot ............... G02B 6/29317 | 385/37 |
| 2008/0149916 A1 | 6/2008 | Baba et al. | |
| 2008/0258160 A1 | 10/2008 | Do | |
| 2008/0303419 A1 | 12/2008 | Fukuda | |
| 2009/0021153 A1 | 1/2009 | Lee et al. | |
| 2009/0040745 A1 | 2/2009 | Nemchuk | |
| 2009/0129115 A1 | 5/2009 | Fine et al. | |
| 2009/0190068 A1 | 7/2009 | Kawamura | |
| 2009/0206325 A1 | 8/2009 | Biwa et al. | |
| 2009/0267092 A1 | 10/2009 | Fukshima et al. | |
| 2009/0286337 A1 | 11/2009 | Lee et al. | |
| 2010/0074284 A1 | 3/2010 | Aizawa et al. | |
| 2010/0142189 A1 | 6/2010 | Hong et al. | |
| 2010/0164365 A1 | 7/2010 | Yoshino et al. | |
| 2010/0246210 A1 | 9/2010 | Yashiro | |
| 2010/0277887 A1 | 11/2010 | Su et al. | |
| 2011/0101359 A1 | 5/2011 | Kim et al. | |
| 2011/0198645 A1 | 8/2011 | Jo et al. | |
| 2012/0018705 A1 | 1/2012 | Takazoe et al. | |
| 2012/0106127 A1* | 5/2012 | Hattori ..................... F21V 9/16 | 362/84 |
| 2012/0119638 A1 | 5/2012 | Sato et al. | |
| 2012/0176766 A1 | 7/2012 | Natsumeda | |
| 2012/0224378 A1 | 9/2012 | Koike et al. | |
| 2012/0286258 A1 | 11/2012 | Naraoka et al. | |
| 2013/0069046 A1 | 3/2013 | Ishizuya | |
| 2013/0181195 A1 | 7/2013 | Cho et al. | |
| 2013/0208327 A1 | 8/2013 | Bolle et al. | |
| 2013/0277703 A1 | 10/2013 | Matsuzaki | |
| 2013/0308102 A1 | 11/2013 | Natsumeda et al. | |
| 2014/0022818 A1* | 1/2014 | Natsumeda ............ H04N 9/315 | 362/607 |
| 2014/0071683 A1 | 3/2014 | Hamada et al. | |
| 2014/0092620 A1* | 4/2014 | Tissot .................. G02B 6/0003 | 362/553 |
| 2014/0185316 A1 | 7/2014 | Kim et al. | |
| 2014/0306176 A1 | 10/2014 | Chiu et al. | |
| 2014/0362604 A1 | 12/2014 | Masuda | |
| 2015/0249183 A1 | 9/2015 | Hirasawa et al. | |
| 2015/0249186 A1 | 9/2015 | Inada et al. | |
| 2015/0249187 A1 | 9/2015 | Inada et al. | |
| 2016/0265746 A1 | 9/2016 | Hirasawa et al. | |
| 2016/0265747 A1 | 9/2016 | Nagao et al. | |
| 2016/0265749 A1 | 9/2016 | Inada | |
| 2016/0327703 A1* | 11/2016 | Hirasawa ............. G02B 6/0036 | |
| 2016/0327706 A1* | 11/2016 | Hirasawa ............. G02B 6/0036 | |
| 2016/0327715 A1* | 11/2016 | Inada ................... G03B 21/204 | |
| 2016/0327716 A1* | 11/2016 | Inada ................... H01L 27/156 | |
| 2016/0327717 A1* | 11/2016 | Hashiya ............... G02B 5/1809 | |
| 2016/0327739 A1* | 11/2016 | Nakamura .......... G02B 5/1866 | |
| 2017/0012232 A1 | 1/2017 | Kataishi et al. | |
| 2017/0075169 A1 | 3/2017 | Hayama | |

FOREIGN PATENT DOCUMENTS

| | | |
|---|---|---|
| JP | 2001-059905 | 3/2001 |
| JP | 2001-155520 | 6/2001 |
| JP | 2007-103901 | 4/2007 |
| JP | 2007-240641 | 9/2007 |
| JP | 2008-130279 | 6/2008 |
| JP | 2008-521211 | 6/2008 |
| JP | 2008-227458 | 9/2008 |
| JP | 2009-140894 | 6/2009 |
| JP | 2010-015874 | 1/2010 |
| JP | 2010-033772 | 2/2010 |
| JP | 2010-097178 | 4/2010 |
| JP | 2010-199357 | 9/2010 |
| JP | 2010-210824 | 9/2010 |
| JP | 2010-231941 | 10/2010 |
| JP | 2010-237311 | 10/2010 |
| JP | 2011-166148 | 8/2011 |
| JP | 2012-093454 | 5/2012 |
| JP | 2012-109334 | 6/2012 |
| JP | 2012-109400 | 6/2012 |
| JP | 2012-182376 | 9/2012 |
| JP | 2013-183020 | 9/2013 |
| JP | 2014-075584 | 4/2014 |
| JP | 2014-082401 | 5/2014 |
| JP | 2014-092645 | 5/2014 |
| JP | 2014-523603 | 9/2014 |
| WO | 2007/034827 | 3/2007 |
| WO | 2007/091687 | 8/2007 |
| WO | 2009/005311 | 1/2009 |
| WO | 2009/099211 | 8/2009 |
| WO | 2011/040528 | 4/2011 |
| WO | 2012/049905 | 4/2012 |
| WO | 2012/108384 | 8/2012 |
| WO | 2012/137584 | 10/2012 |
| WO | 2013/084442 | 6/2013 |
| WO | 2013/125567 | 8/2013 |
| WO | 2013/172025 | 11/2013 |
| WO | 2014/024218 | 2/2014 |
| WO | 2014/119783 | 8/2014 |
| WO | 2015/045886 | 4/2015 |

OTHER PUBLICATIONS

Specification of U.S. Appl. No. 15/446,453, filed Mar. 1, 2017.
Non-Final Office Action issued in U.S. Appl. No. 15/216,669, dated Apr. 14, 2017.
International Search Report of PCT application No. PCT/JP2015/000815 dated Apr. 7, 2015.
Non-final Office Action issued in U.S. Appl. No. 14/618,591, dated Nov. 9, 2015.

(56) References Cited

OTHER PUBLICATIONS

Final Office Action issued in U.S. Appl. No. 14/618,591, dated May 19, 2016.
Non-final Office Action issued in U.S. Appl. No. 14/618,254, dated Feb. 3, 2016.
Non-Final Office Action issued in U.S. Appl. No. 14/621,729, dated Mar. 9, 2016.
Final Office Action issued in U.S. Appl. No. 14/621,729, dated Sep. 28, 2016.
International Search Report of PCT application No. PCT/JP2015/000810 dated Apr. 7, 2015.
International Search Report of PCT application No. PCT/JP2015/000811 dated Apr. 7, 2015.
International Search Report of PCT application No. PCT/JP2015/000812 dated Apr. 7, 2015.
International Search Report of PCT application No. PCT/JP2015/000813 dated May 19, 2015.
International Search Report of PCT application No. PCT/JP2015/000814 dated May 26, 2015.
International Search Report of PCT application No. PCT/JP2014/004324 dated Nov. 25, 2014; with English translation.
Specification of U.S. Appl. No. 15/166,123, filed May 26, 2016.
Specification of U.S. Appl. No. 15/169,771, filed Jun. 1, 2016.
Specification of U.S. Appl. No. 15/206,273, filed Jul. 10, 2016.
Specification of U.S. Appl. No. 15/214,523, filed Jul. 20, 2016.
Specification of U.S. Appl. No. 15/214,803, filed Jul. 20, 2016.
Specification of U.S. Appl. No. 15/215,592, filed Jul. 21, 2016.
Specification of U.S. Appl. No. 15/215,595, filed Jul. 21, 2016.
Specification of U.S. Appl. No. 15/215,599, filed Jul. 21, 2016.
Specification of U.S. Appl. No. 15/216,669, filed Jul. 21, 2016.
Specification of U.S. Appl. No. 15/216,686, filed Jul. 21, 2016.
Specification of U.S. Appl. No. 15/219,462, filed Jul. 26, 2016.
Non-Final Office Action issued in U.S. Appl. No. 15/169,771, dated Aug. 16, 2017.
Non-Final Office Action issued in U.S. Appl. No. 15/214,803, dated Aug. 8, 2017.
Non-Final Office Action issued in U.S. Appl. No. 15/215,595, dated Jul. 28, 2017.
Notice of Allowance issued in U.S. Appl. No. 15/215,595, dated Sep. 22, 2017.
Non-Final Office Action issued in U.S. Appl. No. 15/215,599, dated Aug. 25, 2017.
Non-Final Office Action issued in U.S. Appl. No. 15/219,462, dated Sep. 26, 2017.
Notice of Allowance issued in U.S. Appl. No. 15/169,771, dated Oct. 24, 2017.

* cited by examiner

US 9,890,912 B2

LIGHT-EMITTING APPARATUS INCLUDING PHOTOLUMINESCENT LAYER

BACKGROUND

1. Technical Field

The present disclosure relates to a light-emitting apparatus including a photoluminescent layer.

2. Description of the Related Art

Optical devices, such as lighting fixtures, displays, and projectors, that output light in the necessary direction are required for many applications. Photoluminescent materials, such as those used for fluorescent lamps and white light-emitting diodes (LEDs), emit light in all directions. Thus, those materials are used in combination with optical elements such as reflectors and lenses to output light only in a particular direction. For example, Japanese Unexamined Patent Application Publication No. 2010-231941 discloses an illumination system including a light distributor and an auxiliary reflector to provide sufficient directionality.

SUMMARY

In one general aspect, the techniques disclosed here feature a light-emitting apparatus that includes a light-emitting device and an excitation light source. The excitation light source is integrally provided with the light-emitting device and emits excitation light. The light-emitting device includes: a photoluminescent layer having a first surface perpendicular to a thickness direction thereof, an area of the first surface being larger than a sectional area of the photoluminescent layer perpendicular to the first surface; and a light-transmissive layer located on the photoluminescent layer. At least one of the photoluminescent layer and the light-transmissive layer has a submicron structure having at least projections or recesses arranged perpendicular to the thickness direction of the photoluminescent layer. The photoluminescent layer receives the excitation light and emits light including first light having a wavelength $\lambda_a$ in air. At least one of the photoluminescent layer and the light-transmissive layer has a light emitting surface perpendicular to the thickness direction of the photoluminescent layer, the first light being emitted from the light emitting surface. A distance $D_{int}$ between adjacent projections or recesses and a refractive index $n_{wav-a}$ of the photoluminescent layer for the first light satisfy $\lambda_a/n_{wav-a} < D_{int} < \lambda_a$. A thickness of the photoluminescent layer, the refractive index $n_{wav-a}$, and the distance $D_{int}$ are set to limit a directional angle of the first light emitted from the light emitting surface.

It should be noted that general or specific embodiments may be implemented as a device, an apparatus, a system, a method, or any elective combination thereof.

BRIEF DESCRIPTION OF THE DRAWINGS

FIG. 17A illustrates a one-dimensional periodic structure having a period $p_x$ in the x direction, FIG. 17B illustrates a two-dimensional periodic structure having a period $p_x$ in the x direction and a period $p_y$ in the y direction, FIG. 17C illustrates the wavelength dependence of light absorptivity in the structure in FIG. 17A, and FIG. 17D illustrates the wavelength dependence of light absorptivity in the structure in FIG. 17B;

DETAILED DESCRIPTION

Figure 1A:
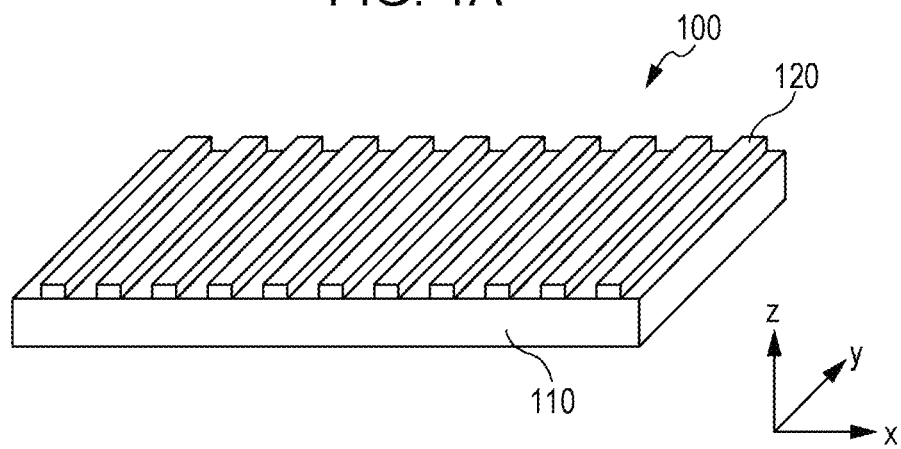
FIG. 1A is a perspective view of the structure of a light-emitting device according to an embodiment.

The present disclosure includes the following light-emitting devices and light-emitting apparatuses:

[Item 1] A light-emitting device including
a photoluminescent layer,
a light-transmissive layer located on or near the photoluminescent layer, and
a submicron structure that is formed on at least one of the photoluminescent layer and the light-transmissive layer and that extends in a plane of the photoluminescent layer or the light-transmissive layer,
wherein the submicron structure has projections or recesses,
light emitted from the photoluminescent layer includes first light having a wavelength $\lambda_a$ in air, and
the distance $D_{int}$ between adjacent projections or recesses and the refractive index $n_{wav\text{-}a}$ of the photoluminescent layer for the first light satisfy $\lambda_a/n_{wav\text{-}a} < D_{int} < \lambda_a$.

[Item 2] The light-emitting device according to Item 1, wherein the submicron structure includes at least one periodic structure comprising the projections or recesses, and the at least one periodic structure includes a first periodic structure having a period $p_a$ that satisfies $\lambda_a/n_{wav-a} < p_a < \lambda_a$.

[Item 3] The light-emitting device according to Item 1 or 2, wherein the refractive index $n_{t-a}$ of the light-transmissive layer for the first light is lower than the refractive index $n_{wav-a}$ of the photoluminescent layer for the first light.

[Item 4] The light-emitting device according to any one of Items 1 to 3, wherein the first light has the maximum intensity in a first direction determined in advance by the submicron structure.

[Item 5] The light-emitting device according to Item 4, wherein the first direction is normal to the photoluminescent layer.

[Item 6] The light-emitting device according to Item 4 or 5, wherein the first light emitted in the first direction is linearly polarized light.

[Item 7] The light-emitting device according to any one of Items 4 to 6, wherein the directional angle of the first light with respect to the first direction is less than 15 degrees.

[Item 8] The light-emitting device according to any one of Items 4 to 7, wherein second light having a wavelength $\lambda_b$ different from the wavelength $\lambda_a$ of the first light has the maximum intensity in a second direction different from the first direction.

[Item 9] The light-emitting device according to any one of Items 1 to 8, wherein the light-transmissive layer has the submicron structure.

[Item 10] The light-emitting device according to any one of Items 1 to 9, wherein the photoluminescent layer has the submicron structure.

[Item 11] The light-emitting device according to any one of Items 1 to 8, wherein
the photoluminescent layer has a flat main surface, and
the light-transmissive layer is located on the flat main surface of the photoluminescent layer and has the submicron structure.

[Item 12] The light-emitting device according to Item 11, wherein the photoluminescent layer is supported by a transparent substrate.

[Item 13] The light-emitting device according to any one of Items 1 to 8, wherein
the light-transmissive layer is a transparent substrate having the submicron structure on a main surface thereof, and
the photoluminescent layer is located on the submicron structure.

[Item 14] The light-emitting device according to Item 1 or 2, wherein the refractive index $n_{t-a}$ of the light-transmissive layer for the first light is higher than or equal to the refractive index $n_{wav-a}$ of the photoluminescent layer for the first light, and each of the projections or recesses in the submicron structure has a height or depth of 150 nm or less.

[Item 15] The light-emitting device according to any one of Items 1 and 3 to 14, wherein
the submicron structure includes at least one periodic structure comprising the projections or recesses, and the at least one periodic structure includes a first periodic structure having a period $p_a$ that satisfies $\lambda_a/n_{wav-a} < p_a < \lambda_a$, and
the first periodic structure is a one-dimensional periodic structure.

[Item 16] The light-emitting device according to Item 15, wherein
light emitted from the photoluminescent layer includes second light having a wavelength $\lambda_b$ different from the wavelength $\lambda_a$ in air, the at least one periodic structure further includes a second periodic structure having a period $p_b$ that satisfies $\lambda_b/n_{wav-b} < p_b < \lambda_b$, wherein $n_{wav-b}$ denotes a refractive index of the photoluminescent layer for the second light, and
the second periodic structure is a one-dimensional periodic structure.

[Item 17] The light-emitting device according to any one of Items 1 and 3 to 14, wherein the submicron structure includes at least two periodic structures comprising the projections or recesses, and the at least two periodic structures include a two-dimensional periodic structure having periodicity in different directions.

[Item 18] The light-emitting device according to any one of Items 1 and 3 to 14, wherein
the submicron structure includes periodic structures comprising the projections or recesses, and
the periodic structures include periodic structures arranged in a matrix.

[Item 19] The light-emitting device according to any one of Items 1 and 3 to 14, wherein
the submicron structure includes periodic structures comprising the projections or recesses, and
the periodic structures include a periodic structure having a period $p_{ex}$ that satisfies $\lambda_{ex}/n_{wav-ex} < p_{ex} < \lambda_{ex}$, wherein $\lambda_{ex}$ denotes the wavelength of excitation light in air for a photoluminescent material contained in the photoluminescent layer, and $n_{wav-ex}$ denotes the refractive index of the photoluminescent layer for the excitation light.

[Item 20] A light-emitting device including
photoluminescent layers and light-transmissive layers,
wherein at least two of the photoluminescent layers are independently the photoluminescent layer according to any one of Items 1 to 19, and at least two of the light-transmissive layers are independently the light-transmissive layer according to any one of Items 1 to 19.

[Item 21] The light-emitting device according to Item 20, wherein the photoluminescent layers and the light-transmissive layers are stacked on top of each other.

[Item 22] A light-emitting device including
a photoluminescent layer,
a light-transmissive layer located on or near the photoluminescent layer, and
a submicron structure that is formed on at least one of the photoluminescent layer and the light-transmissive layer and that extends in a plane of the photoluminescent layer or the light-transmissive layer,
wherein light for forming a quasi-guided mode in the photoluminescent layer and the light-transmissive layer is emitted.

[Item 23] A light-emitting device including
a waveguide layer capable of guiding light, and
a periodic structure located on or near the waveguide layer,
wherein the waveguide layer contains a photoluminescent material, and
the waveguide layer includes a quasi-guided mode in which light emitted from the photoluminescent material is guided while interacting with the periodic structure.

[Item 24] A light-emitting device including
a photoluminescent layer,
a light-transmissive layer located on or near the photoluminescent layer, and
a submicron structure that is formed on at least one of the photoluminescent layer and the light-transmissive layer and that extends in a plane of the photoluminescent layer or the light-transmissive layer, wherein the submicron structure has projections or recesses, and the distance $D_{int}$ between adjacent projections or recesses, the wavelength $\lambda_{ex}$ of excitation light in air for a photoluminescent material contained in the photoluminescent layer, and the refractive index $n_{wav-ex}$ of a medium having the highest refractive index for the excitation light out of media present in an optical path to the photoluminescent layer or the light-transmissive layer satisfy $\lambda_{ex}/n_{wav-ex} < D_{int} < \lambda_{ex}$.

[Item 25] The light-emitting device according to Item 24, wherein the submicron structure includes at least one periodic structure comprising the projections or recesses, and the at least one periodic structure includes a first periodic structure having a period $p_{ex}$ that satisfies $\lambda_{ex}/n_{wav-ex} < p_{ex} < \lambda_{ex}$.

[Item 26] A light-emitting device including
a light-transmissive layer,
a submicron structure that is formed in the light-transmissive layer and extends in a plane of the light-transmissive layer, and
a photoluminescent layer located on or near the submicron structure,
wherein the submicron structure has projections or recesses,
light emitted from the photoluminescent layer includes first light having a wavelength $\lambda_a$ in air,
the submicron structure includes at least one periodic structure comprising the projections or recesses, and
the refractive index $n_{wav-a}$ of the photoluminescent layer for the first light and the period $p_a$ of the at least one periodic structure satisfy $\lambda_a/n_{wav-a} < p_a < \lambda_a$.

[Item 27] A light-emitting device including
a photoluminescent layer,
a light-transmissive layer having a higher refractive index than the photoluminescent layer, and
a submicron structure that is formed in the light-transmissive layer and extends in a plane of the light-transmissive layer,
wherein the submicron structure has projections or recesses,
light emitted from the photoluminescent layer includes first light having a wavelength $\lambda_a$ in air,
the submicron structure includes at least one periodic structure comprising the projections or recesses, and
the refractive index $n_{wav-a}$ of the photoluminescent layer for the first light and the period $p_a$ of the at least one periodic structure satisfy $\lambda_a/n_{wav-a} < p_a < \lambda_a$.

[Item 28] A light-emitting device including
a photoluminescent layer, and
a submicron structure that is formed in the photoluminescent layer and extends in a plane of the photoluminescent layer,
wherein the submicron structure has projections or recesses,
light emitted from the photoluminescent layer includes first light having a wavelength $\lambda_a$ in air,
the submicron structure includes at least one periodic structure comprising the projections or recesses, and
the refractive index $n_{wav-a}$ of the photoluminescent layer for the first light and the period $p_a$ of the at least one periodic structure satisfy $\lambda_a/n_{wav-a} < p_a < \lambda_a$.

[Item 29] The light-emitting device according to any one of Items 1 to 21 and 24 to 28, wherein the submicron structure has both the projections and the recesses.

[Item 30] The light-emitting device according to any one of Items 1 to 22 and 24 to 27, wherein the photoluminescent layer is in contact with the light-transmissive layer.

[Item 31] The light-emitting device according to Item 23, wherein the waveguide layer is in contact with the periodic structure.

[Item 32] A light-emitting apparatus including
the light-emitting device according to any one of Items 1 to 31, and
an excitation light source for irradiating the photoluminescent layer with excitation light.

[Item 33] A light-emitting apparatus including a light-emitting device and an excitation light source, wherein
the excitation light source is integrally provided with the light-emitting device and emits excitation light, and
the light-emitting device includes:
a photoluminescent layer having a first surface perpendicular to a thickness direction thereof, an area of the first surface being larger than a sectional area of the photoluminescent layer perpendicular to the first surface; and
a light-transmissive layer located on the photoluminescent layer, wherein
at least one of the photoluminescent layer and the light-transmissive layer has a submicron structure having at least projections or recesses arranged perpendicular to the thickness direction of the photoluminescent layer,
the photoluminescent layer receives the excitation light and emits light including first light having a wavelength $\lambda_a$ in air,
at least one of the photoluminescent layer and the light-transmissive layer has a light emitting surface perpendicular to the thickness direction of the photoluminescent layer, the first light being emitted from the light emitting surface,
a distance $D_{int}$ between adjacent projections or recesses and a refractive index $n_{wav-a}$ of the photoluminescent layer for the first light satisfy $\lambda_a/n_{wav-a} < D_{int} < \lambda_a$, and
a thickness of the photoluminescent layer, the refractive index $n_{wav-a}$, and the distance $D_{int}$ are set to limit a directional angle of the first light emitted from the light emitting surface.

[Item 34] The light-emitting apparatus according to Item 33, wherein the submicron structure includes at least one periodic structure comprising the projections or recesses, and the at least one periodic structure includes a first periodic structure having a period $p_a$ that satisfies $\lambda_a/n_{wav-a} < p_a < \lambda_a$.

[Item 35] The light-emitting apparatus according to Item 33 or 34, wherein
the light-emitting device further includes a low-refractive-index layer between the photoluminescent layer and the excitation light source and between the light-transmissive layer and the excitation light source, and
the low-refractive-index layer has a lower refractive index for the first light than the photoluminescent layer.

[Item 36] The light-emitting apparatus according to Item 35, wherein the low-refractive-index layer has second projections facing the excitation light source.

[Item 37] The light-emitting apparatus according to Item 33 or 34, wherein a light output side of the excitation light source is in direct contact with the photoluminescent layer or the light-transmissive layer.

[Item 38] The light-emitting apparatus according to Item 35 or 36, wherein a light output side of the excitation light source is in direct contact with the low-refractive-index layer.

[Item 39] The light-emitting apparatus according to any one of Items 33 to 38, wherein the light-emitting device further includes a selective reflective layer that selectively reflects light passing through the photoluminescent layer.

[Item 40] A light-emitting apparatus including a light-emitting device and an excitation light source, wherein the excitation light source is integrally provided with the light-emitting device and emits excitation light, and
the light-emitting device includes:
a light-transmissive layer having a submicron structure; and
a photoluminescent layer that is located on the submicron structure and emits light in response to the excitation light, wherein
the photoluminescent layer has a first surface perpendicular to a thickness direction thereof, an area of the first surface being larger than a sectional area of the photoluminescent layer perpendicular to the first surface,
the light emitted from the photoluminescent layer includes first light having a wavelength $\lambda_a$ in air,
at least one of the photoluminescent layer and the light-transmissive layer has a light emitting surface perpendicular to the thickness direction of the photoluminescent layer, the first light being emitted from the light emitting surface,
the submicron structure includes at least one periodic structure comprising at least projections or recesses arranged perpendicular to the thickness direction of the photoluminescent layer,
a refractive index $n_{wav-a}$ of the photoluminescent layer for the first light and a period $p_a$ of the at least one periodic structure satisfy $\lambda_a/n_{wav-a}<p_a<\lambda_a$, and
a thickness of the photoluminescent layer, the refractive index $n_{wav-a}$ and the period $p_a$ are set to limit a directional angle of the first light emitted from the light emitting surface.

[Item 41] A light-emitting apparatus including a light-emitting device and an excitation light source, wherein the excitation light source is integrally provided with the light-emitting device and emits excitation light, and
the light-emitting device includes:
a photoluminescent layer emitting light in response to the excitation light; and
a light-transmissive layer that has a higher refractive index than the photoluminescent layer, and has a submicron structure, wherein
the light emitted from the photoluminescent layer includes first light having a wavelength $\lambda_a$ in air,
the photoluminescent layer has a first surface perpendicular to a thickness direction thereof, an area of the first surface being larger than a sectional area of the photoluminescent layer perpendicular to the first surface,
at least one of the photoluminescent layer and the light-transmissive layer has a light emitting surface perpendicular to the thickness direction of the photoluminescent layer, the first light being emitted from the light emitting surface,
the submicron structure includes at least one periodic structure comprising at least projections or recesses arranged perpendicular to the thickness direction of the photoluminescent layer,
a refractive index $n_{wav-a}$ of the photoluminescent layer for the first light and a period $p_a$ of the at least one periodic structure satisfy $\lambda_a/n_{wav-a}<p_a<\lambda_a$, and
a thickness of the photoluminescent layer, the refractive index $n_{wav-a}$, and the period $p_a$ are set to limit a directional angle of the first light emitted from the light emitting surface.

[Item 42] The light-emitting apparatus according to any one of Items 33 to 41, wherein the photoluminescent layer is in contact with the light-transmissive layer.

[Item 43] A light-emitting apparatus comprising a light-emitting device and an excitation light source, wherein the excitation light source is integrally provided with the light-emitting device and emits excitation light,
the light-emitting device includes a photoluminescent layer emitting light in response to the excitation light, and has a submicron structure,
the photoluminescent layer has a first surface perpendicular to a thickness direction thereof, an area of the first surface being larger than a sectional area of the photoluminescent layer perpendicular to the first surface,
the submicron structure includes at least one periodic structure comprising at least projections or recesses arranged perpendicular to the thickness direction of the photoluminescent layer,
the light emitted from the photoluminescent layer includes first light having a wavelength $\lambda_a$ in air,
the photoluminescent layer has a light emitting surface perpendicular to the thickness direction of the photoluminescent layer, the first light being emitted from the light emitting surface,
a refractive index $n_{wav-a}$ of the photoluminescent layer for the first light and a period $p_a$ of the at least one periodic structure satisfy $\lambda_a/n_{wav-a}<p_a<\lambda_a$, and
a thickness of the photoluminescent layer, the refractive index $n_{wav-a}$, and the period $p_a$ are set to limit a directional angle of the first light emitted from the light emitting surface.

[Item 44] The light-emitting apparatus according to any one of Items 33 to 43, wherein the submicron structure has both the projections and the recesses.

[Item 45] The light-emitting apparatus according to any one of Items 33 to 44, wherein the photoluminescent layer includes a phosphor.

[Item 46] The light-emitting apparatus according to any one of Items 33 to 45, wherein 380 nm$\leq\lambda_a\leq$780 nm is satisfied.

[Item 47] The light-emitting apparatus according to any one of Items 33 to 46, wherein the thickness of the photoluminescent layer, the refractive index $n_{wav-a}$, and the distance $D_{int}$ are set to allow an electric field to be formed in the photoluminescent layer, in which antinodes of the electric field are located in areas, the areas each corresponding to respective one of the projections and/or recesses.

[Item 48] The light-emitting apparatus according to any one of Items 33 to 47, wherein the light-transmissive layer is located indirectly on the photoluminescent layer.

[Item 49] The light-emitting apparatus according to any one of Items 33 to 48, wherein the thickness of the photoluminescent layer, the refractive index $n_{wav-a}$, and the distance $D_{int}$ are set to allow an electric field to be formed in the photoluminescent layer, in which antinodes of the electric field are located at, or adjacent to, at least the projections or recesses.

[Item 50] The light-emitting apparatus according to any one of Items 33 to 49, wherein the light-emitting device further includes a substrate that has a refractive index $n_{s-a}$ for the first light and is located on the photoluminescent layer, wherein $\lambda_a/n_{wav-a}<D_{int}<\lambda_a/n_{s-a}$ is satisfied.

A light-emitting device according to an embodiment of the present disclosure includes a photoluminescent layer, a light-transmissive layer located on or near the photoluminescent layer, and a submicron structure that is formed on at least one of the photoluminescent layer and the light-transmissive layer and that extends in a plane of the photoluminescent layer or the light-transmissive layer. The submicron structure has projections or recesses, light emitted from the photoluminescent layer includes first light having a wavelength $\lambda_a$ in air, and the distance $D_{int}$ between adjacent projections or recesses and the refractive index $n_{wav-a}$ of the photoluminescent layer for the first light satisfy $\lambda_a/n_{wav-a} < D_{int} < \lambda_a$. The wavelength $\lambda_a$ is, for example, within the visible wavelength range (for example, 380 to 780 nm).

The photoluminescent layer contains a photoluminescent material. The term "photoluminescent material" refers to a material that emits light in response to excitation light. The term "photoluminescent material" encompasses fluorescent materials and phosphorescent materials in a narrow sense, encompasses inorganic materials and organic materials (for example, dyes), and encompasses quantum dots (that is, tiny semiconductor particles). The photoluminescent layer may contain a matrix material (host material) in addition to the photoluminescent material. Examples of matrix materials include resins and inorganic materials such as glasses and oxides.

The light-transmissive layer located on or near the photoluminescent layer is made of a material with high transmittance to the light emitted from the photoluminescent layer, for example, inorganic materials or resins. For example, the light-transmissive layer is desirably formed of a dielectric material (particularly, an insulator having low light absorptivity). For example, the light-transmissive layer may be a substrate that supports the photoluminescent layer. If the surface of the photoluminescent layer facing air has the submicron structure, the air layer can serve as the light-transmissive layer.

In a light-emitting device according to an embodiment of the present disclosure, a submicron structure (for example, a periodic structure) on at least one of the photoluminescent layer and the light-transmissive layer forms a unique electric field distribution inside the photoluminescent layer and the light-transmissive layer, as described in detail later with reference to the results of calculations and experiments. This electric field distribution is formed by an interaction between guided light and the submicron structure and may also be referred to as a "quasi-guided mode".

The quasi-guided mode can be utilized to improve the luminous efficiency, directionality, and polarization selectivity of photoluminescence, as described later. The term "quasi-guided mode" may be used in the following description to describe novel structures and/or mechanisms contemplated by the inventors. However, such a description is for illustrative purposes only and is not intended to limit the present disclosure in any way.

For example, the submicron structure has projections, and the distance (the center-to-center distance) $D_{int}$ between adjacent projections satisfies $\lambda_a/n_{wav-a} < D_{int} < \lambda_a$. Instead of the projections, the submicron structure may have recesses. For simplicity, the following description will be directed to a submicron structure having projections. The symbol $\lambda$ denotes the wavelength of light, and the symbol $\lambda_a$ denotes the wavelength of light in air. The symbol $n_{wav}$ denotes the refractive index of the photoluminescent layer. If the photoluminescent layer is a medium containing materials, the refractive index $n_{wav}$ denotes the average refractive index of the materials weighted by their respective volume fractions.

Although it is desirable to use the symbol $n_{wav-a}$ to refer to the refractive index for light having a wavelength $\lambda_a$ because the refractive index n generally depends on the wavelength, it may be abbreviated for simplicity. The symbol $n_{wav}$ basically denotes the refractive index of the photoluminescent layer; however, if a layer having a higher refractive index than the photoluminescent layer is adjacent to the photoluminescent layer, the refractive index $n_{wav}$ denotes the average refractive index of the layer having a higher refractive index and the photoluminescent layer weighted by their respective volume fractions. This is optically equivalent to a photoluminescent layer composed of layers of different materials.

The effective refractive index $n_{eff}$ of the medium for light in the quasi-guided mode satisfies $n_a < n_{eff} < n_{wav}$, wherein $n_a$ denotes the refractive index of air. If light in the quasi-guided mode is assumed to be light propagating through the photoluminescent layer while being totally reflected at an angle of incidence $\theta$, the effective refractive index $n_{eff}$ can be written as $n_{eff} = n_{wav} \sin \theta$. The effective refractive index $n_{eff}$ is determined by the refractive index of the medium present in the region where the electric field of the quasi-guided mode is distributed.

For example, if the submicron structure is formed in the light-transmissive layer, the effective refractive index $n_{eff}$ depends not only on the refractive index of the photoluminescent layer but also on the refractive index of the light-transmissive layer. Because the electric field distribution also varies depending on the polarization direction of the quasi-guided mode (that is, the TE mode or the TM mode), the effective refractive index $n_{eff}$ can differ between the TE mode and the TM mode.

The submicron structure is formed on at least one of the photoluminescent layer and the light-transmissive layer. If the photoluminescent layer and the light-transmissive layer are in contact with each other, the submicron structure may be formed on the interface between the photoluminescent layer and the light-transmissive layer. In such a case, the photoluminescent layer and the light-transmissive layer have the submicron structure. The photoluminescent layer may have no submicron structure. In such a case, a light-transmissive layer having a submicron structure is located on or near the photoluminescent layer.

A phrase like "a light-transmissive layer (or its submicron structure) located on or near the photoluminescent layer", as used herein, typically means that the distance between these layers is less than half the wavelength $\lambda_a$. This allows the electric field of a guided mode to reach the submicron structure, thus forming a quasi-guided mode. However, the distance between the submicron structure of the light-transmissive layer and the photoluminescent layer may exceed half the wavelength $\lambda_a$ if the light-transmissive layer has a higher refractive index than the photoluminescent layer. If the light-transmissive layer has a higher refractive index than the photoluminescent layer, light reaches the light-transmissive layer even if the above relationship is not satisfied. In the present specification, if the photoluminescent layer and the light-transmissive layer have a positional relationship that allows the electric field of a guided mode to reach the submicron structure and form a quasi-guided mode, they may be associated with each other.

The submicron structure, which satisfies $\lambda_a/n_{wav-a} < D_{int} < \lambda_a$, as described above, is characterized by a submicron size. The submicron structure includes at least one periodic structure, as in the light-emitting devices according to the embodiments described in detail later. The at least one periodic structure has a period $p_a$ that satisfies $\lambda_a/n_{wav-a} < p_a < \lambda_a$. Thus, the submicron structure includes a periodic structure in which the distance $D_{int}$ between adjacent projections is constant at $p_a$. If the submicron structure includes a periodic structure, light in the quasi-guided mode propagates while repeatedly interacting with the periodic structure so that the light is diffracted by the submicron structure. Unlike the phenomenon in which light propagating through free space is diffracted by a periodic structure, this is the phenomenon in which light is guided (that is, repeatedly totally reflected) while interacting with the periodic structure. This can efficiently diffract light even if the periodic structure causes a small phase shift (that is, even if the periodic structure has a small height).

The above mechanism can be utilized to improve the luminous efficiency of photoluminescence by the enhancement of the electric field due to the quasi-guided mode and also to couple the emitted light into the quasi-guided mode. The angle of travel of the light in the quasi-guided mode is varied by the angle of diffraction determined by the periodic structure. This can be utilized to output light of a particular wavelength in a particular direction (that is, significantly improve the directionality). Furthermore, high polarization selectivity can be simultaneously achieved because the effective refractive index $n_{eff}$ ($=n_{wav}$ sin θ) differs between the TE mode and the TM mode. For example, as demonstrated by the experimental examples below, a light-emitting device can be provided that outputs intense linearly polarized light (for example, the TM mode) of a particular wavelength (for example, 610 nm) in the front direction. The directional angle of the light output in the front direction is, for example, less than 15 degrees. The term "directional angle" refers to the angle of one side with respect to the front direction, which is assumed to be 0 degrees.

Conversely, a submicron structure having a lower periodicity results in a lower directionality, luminous efficiency, polarization, and wavelength selectivity. The periodicity of the submicron structure may be adjusted depending on the need. The periodic structure may be a one-dimensional periodic structure, which has a higher polarization selectivity, or a two-dimensional periodic structure, which allows for a lower polarization.

The submicron structure may include periodic structures. For example, these periodic structures may have different periods or different periodic directions (axes). The periodic structures may be formed on the same plane or may be stacked on top of each other. The light-emitting device may include photoluminescent layers and light-transmissive layers, and each of the layers may have submicron structures.

The submicron structure can be used not only to control the light emitted from the photoluminescent layer but also to efficiently guide excitation light into the photoluminescent layer. That is, the excitation light can be diffracted and coupled into the quasi-guided mode to guide light in the photoluminescent layer and the light-transmissive layer by the submicron structure to efficiently excite the photoluminescent layer. A submicron structure may be used that satisfies $\lambda_{ex}/n_{wav-ex} < D_{int} < \lambda_{ex}$, wherein $\lambda_{ex}$ denotes the wavelength in air of the light that excites the photoluminescent material, and $n_{wav-ex}$ denotes the refractive index of the photoluminescent layer for the excitation light. The symbol $n_{wav-ex}$ denotes the refractive index of the photoluminescent layer for the emission wavelength of the photoluminescent material. Alternatively, a submicron structure may be used that includes a periodic structure having a period $p_{ex}$ that satisfies $\lambda_{ex}/n_{wav-ex} < p_{ex} < \lambda_{ex}$. The excitation light has a wavelength $\lambda_{ex}$ of 450 nm, for example, but may have a shorter wavelength than visible light. If the excitation light has a wavelength within the visible range, it may be output together with the light emitted from the photoluminescent layer.

1. UNDERLYING KNOWLEDGE FORMING BASIS OF THE PRESENT DISCLOSURE

The underlying knowledge forming the basis for the present disclosure will be described before describing specific embodiments of the present disclosure. As described above, photoluminescent materials such as those used for fluorescent lamps and white LEDs emit light in all directions and thus require optical elements such as reflectors and lenses to emit light in a particular direction. These optical elements, however, can be eliminated (or the size thereof can be reduced) if the photoluminescent layer itself emits directional light. This results in a significant reduction in the size of optical devices and equipment. With this idea in mind, the inventors have conducted a detailed study on the photoluminescent layer to achieve directional light emission.

The inventors have investigated the possibility of inducing light emission with particular directionality so that the light emitted from the photoluminescent layer is localized in a particular direction. Based on Fermi's golden rule, the emission rate Γ, which is a measure characterizing light emission, is represented by the equation (1):

$$\Gamma(r) = \frac{2\pi}{\hbar} \langle (d \cdot E(r)) \rangle^2 \rho(\lambda) \qquad (1)$$

In the equation (1), r is the vector indicating the position, λ is the wavelength of light, d is the dipole vector, E is the electric field vector, and ρ is the density of states. For many substances other than some crystalline substances, the dipole vector d is randomly oriented. The magnitude of the electric field E is substantially constant irrespective of the direction if the size and thickness of the photoluminescent layer are sufficiently larger than the wavelength of light. Hence, in most cases, the value of $\langle (d \cdot E(r)) \rangle^2$ does not depend on the direction. Accordingly, the emission rate Γ is constant irrespective of the direction. Thus, in most cases, the photoluminescent layer emits light in all directions.

As can be seen from the equation (1), to achieve anisotropic light emission, it is necessary to align the dipole vector d in a particular direction or to enhance the component of the electric field vector in a particular direction. One of these approaches can be employed to achieve directional light emission. In the present disclosure, the results of a detailed study and analysis on structures for utilizing a quasi-guided mode in which the electric field component in a particular direction is enhanced by the confinement of light in the photoluminescent layer will be described below.

2. STRUCTURE FOR ENHANCING ELECTRIC FIELD ONLY IN PARTICULAR DIRECTION

The inventors have investigated the possibility of controlling light emission using a guided mode with an intense electric field. Light can be coupled into a guided mode using a waveguide structure that itself contains a photoluminescent material. However, a waveguide structure simply formed using a photoluminescent material outputs little or no light in the front direction because the emitted light is coupled into a guided mode. Accordingly, the inventors have investigated the possibility of combining a waveguide containing a photoluminescent material with a periodic structure (including projections or recesses or both). When the electric field of light is guided in a waveguide while overlapping with a periodic structure located on or near the waveguide, a quasi-guided mode is formed by the effect of the periodic structure. That is, the quasi-guided mode is a guided mode restricted by the periodic structure and is characterized in that the antinodes of the amplitude of the electric field have the same period as the periodic structure. Light in this mode is confined in the waveguide structure to enhance the electric field in a particular direction. This mode also interacts with the periodic structure to undergo diffraction so that the light in this mode is converted into light propagating in a particular direction and can thus be output from the waveguide. The electric field of light other than the quasi-guided mode is not enhanced because little or no such light is confined in the waveguide. Thus, most light is coupled into a quasi-guided mode with a large electric field component.

That is, the inventors have investigated the possibility of using a photoluminescent layer containing a photoluminescent material as a waveguide (or a waveguide layer including a photoluminescent layer) in combination with a periodic structure located on or near the waveguide to couple light into a quasi-guided mode in which the light is converted into light propagating in a particular direction, thereby providing a directional light source.

Figure 30:
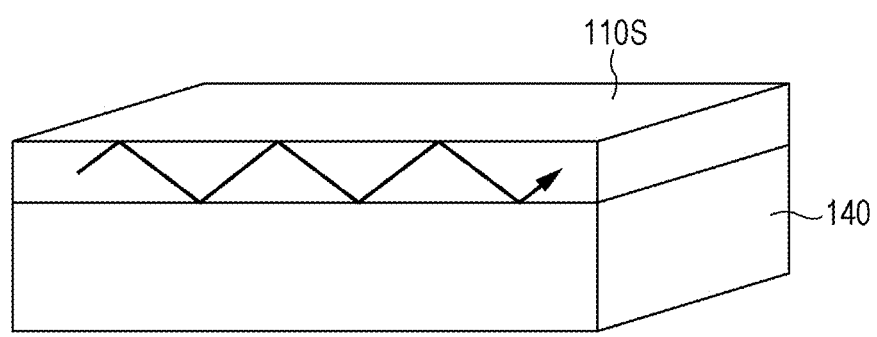
FIG. 30 is a schematic perspective view of a slab waveguide.

As a simple waveguide structure, the inventors have studied slab waveguides. A slab waveguide has a planar structure in which light is guided. FIG. 30 is a schematic perspective view of a slab waveguide 110S. There is a mode of light propagating through the waveguide 110S if the waveguide 110S has a higher refractive index than a transparent substrate 140 that supports the waveguide 110S. If such a slab waveguide includes a photoluminescent layer, the electric field of light emitted from an emission point overlaps largely with the electric field of a guided mode. This allows most of the light emitted from the photoluminescent layer to be coupled into the guided mode. If the photoluminescent layer has a thickness close to the wavelength of the light, a situation can be created where there is only a guided mode with a large electric field amplitude.

If a periodic structure is located on or near the photoluminescent layer, the electric field of the guided mode interacts with the periodic structure to form a quasi-guided mode. Even if the photoluminescent layer is composed of a plurality of layers, a quasi-guided mode is formed as long as the electric field of the guided mode reaches the periodic structure. Not all parts of the photoluminescent layer needs to be formed of a photoluminescent material, provided that at least a portion of the photoluminescent layer functions to emit light.

If the periodic structure is made of a metal, a mode due to the guided mode and plasmon resonance is formed. This mode has different properties from the quasi-guided mode. This mode is less effective in enhancing emission because a large loss occurs due to high absorption by the metal. Thus, it is desirable to form the periodic structure using a dielectric material having low absorptivity.

Figure 1B:
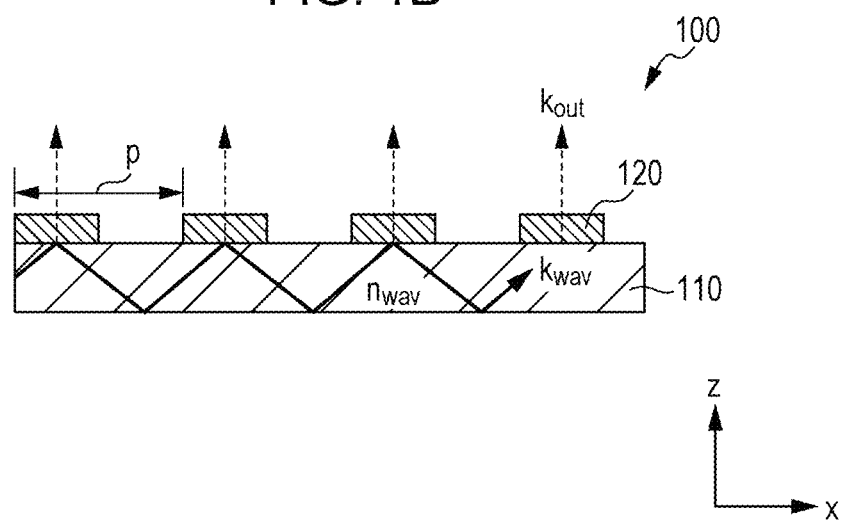
FIG. 1B is a fragmentary cross-sectional view of the light-emitting device illustrated in FIG. 1A.

The inventors have studied the coupling of light into a quasi-guided mode that can be output as light propagating in a particular angular direction using a periodic structure formed on a waveguide (for example, a photoluminescent layer). FIG. 1A is a schematic perspective view of a light-emitting device 100 including a waveguide (for example, a photoluminescent layer) 110 and a periodic structure (for example, a light-transmissive layer) 120. The light-transmissive layer 120 is hereinafter also referred to as a periodic structure 120 if the light-transmissive layer 120 forms a periodic structure (that is, if a periodic submicron structure is formed on the light-transmissive layer 120). In this example, the periodic structure 120 is a one-dimensional periodic structure in which stripe-shaped projections extending in the y direction are arranged at regular intervals in the x direction. FIG. 1B is a cross-sectional view of the light-emitting device 100 taken along a plane parallel to the xz plane. If a periodic structure 120 having a period p is provided in contact with the waveguide 110, a quasi-guided mode having a wave number $k_{wav}$ in the in-plane direction is converted into light propagating outside the waveguide 110. The wave number $k_{out}$ of the light can be represented by the equation (2):

$$k_{out} = k_{wav} - m\frac{2\pi}{p} \quad (2)$$

wherein m is an integer indicating the diffraction order.

For simplicity, the light guided in the waveguide 110 is assumed to be a ray of light propagating at an angle $\theta_{wav}$. This approximation gives the equations (3) and (4):

$$\frac{k_{wav}\lambda_0}{2\pi} = n_{wav}\sin\theta_{wav} \quad (3)$$

$$\frac{k_{out}\lambda_0}{2\pi} = n_{out}\sin\theta_{out} \quad (4)$$

In these equations, $\lambda_0$ denotes the wavelength of the light in air, $n_{wav}$ denotes the refractive index of the waveguide 110, $n_{out}$ denotes the refractive index of the medium on the light output side, and $\theta_{out}$ denotes the angle at which the light is output from the waveguide 110 to a substrate or air. From the equations (2) to (4), the output angle $\theta_{out}$ can be represented by the equation (5):

$$n_{out}\sin\theta_{out} = n_{wav}\sin\theta_{wav} - m\lambda_0/p \quad (5)$$

If $n_{wav}\sin\theta_{wav} = m\lambda_0/p$ in the equation (5), this results in $\theta_{out}=0$, meaning that the light can be emitted in the direction perpendicular to the plane of the waveguide 110 (that is, in the front direction).

Based on this principle, light can be coupled into a particular quasi-guided mode and be converted into light having a particular output angle using the periodic structure to output intense light in that direction.

There are some constraints to achieving the above situation. To form a quasi-guided mode, the light propagating through the waveguide 110 has to be totally reflected. The conditions therefor are represented by the inequality (6):

$$n_{out} < n_{wav}\sin\theta_{wav} \quad (6)$$

To diffract the quasi-guided mode using the periodic structure and thereby output the light from the waveguide 110, $-1 < \sin\theta_{out} < 1$ has to be satisfied in the equation (5). Hence, the inequality (7) has to be satisfied:

$$-1 < \frac{n_{wav}}{n_{out}}\sin\theta_{wav} - \frac{m\lambda_0}{n_{out}p} < 1 \quad (7)$$

Taking into account the inequality (6), the inequality (8) may be satisfied:

$$\frac{m\lambda_0}{2n_{out}} < p \quad (8)$$

To output the light from the waveguide 110 in the front direction ($\theta_{out}=0$), as can be seen from the equation (5), the equation (9) has to be satisfied:

$$p = m\lambda_0/(n_{wav}\sin\theta_{wav}) \quad (9)$$

As can be seen from the equation (9) and the inequality (6), the required conditions are represented by the inequality (10):

$$\frac{m\lambda_0}{n_{wav}} < p < \frac{m\lambda_0}{n_{out}} \quad (10)$$

If the periodic structure 120 as illustrated in FIGS. 1A and 1B is provided, it may be designed based on first-order diffracted light (that is, m=1) because higher-order diffracted light having m of 2 or more has low diffraction efficiency. In this embodiment, the period p of the periodic structure 120 is determined so as to satisfy the inequality (11), which is given by substituting m=1 into the inequality (10):

$$\frac{\lambda_0}{n_{wav}} < p < \frac{\lambda_0}{n_{out}} \quad (11)$$

If the waveguide (photoluminescent layer) 110 is not in contact with a transparent substrate, as illustrated in FIGS. 1A and 1B, $n_{out}$ is equal to the refractive index of air (approximately 1.0). Thus, the period p may be determined so as to satisfy the inequality (12):

$$\frac{\lambda_0}{n_{wav}} < p < \lambda_0 \quad (12)$$

Figure 1C:
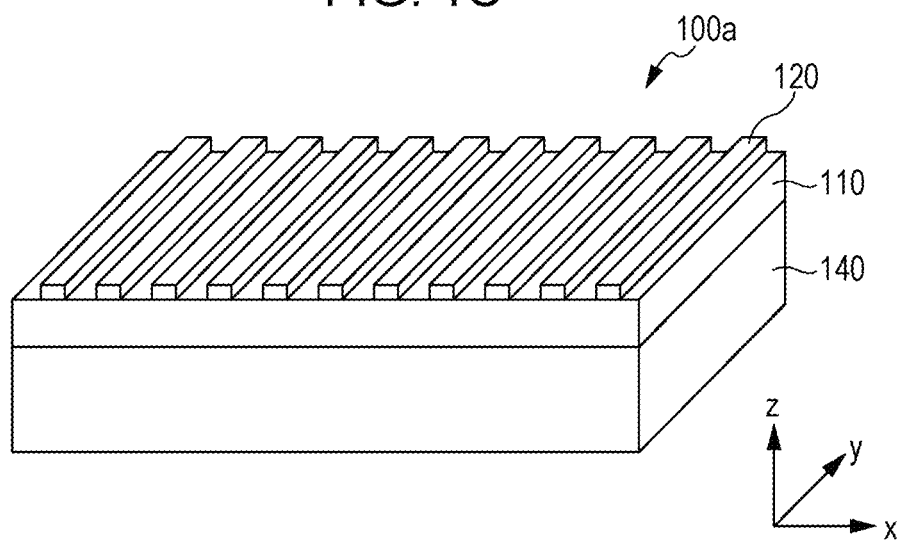
FIG. 1C is a perspective view of the structure of a light-emitting device according to another embodiment.
Figure 1D:
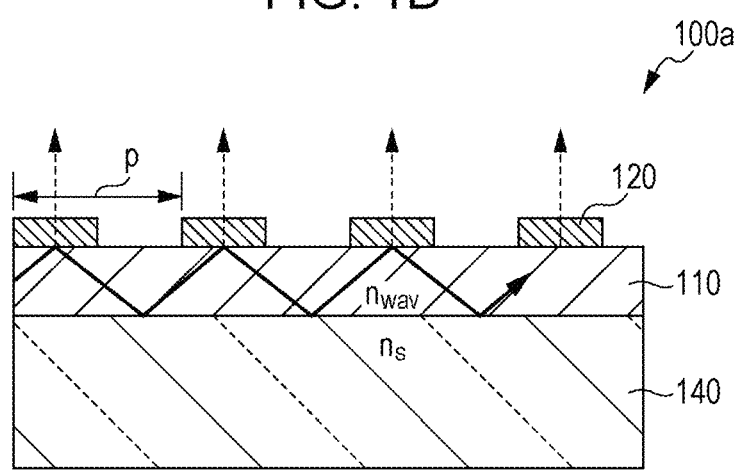
FIG. 1D is a fragmentary cross-sectional view of the light-emitting device illustrated in FIG. 1C.

Alternatively, a structure as illustrated in FIGS. 1C and 1D may be employed in which the photoluminescent layer 110 and the periodic structure 120 are formed on a transparent substrate 140. The refractive index $n_s$ of the transparent substrate 140 is higher than the refractive index of air. Thus, the period p may be determined so as to satisfy the inequality (13), which is given by substituting $n_{out}=n_s$ into the inequality (11):

$$\frac{\lambda_0}{n_{wav}} < p < \frac{\lambda_0}{n_s} \quad (13)$$

Although m=1 is assumed in the inequality (10) to give the inequalities (12) and (13), m≥2 may be assumed. That is, if both surfaces of the light-emitting device 100 are in contact with air layers, as shown in FIGS. 1A and 1B, the period p may be determined so as to satisfy the inequality (14):

$$\frac{m\lambda_0}{n_{wav}} < p < m\lambda_0 \quad (14)$$

wherein m is an integer of 1 or more.

Similarly, if the photoluminescent layer 110 is formed on the transparent substrate 140, as in the light-emitting device 100a illustrated in FIGS. 1C and 1D, the period p may be determined so as to satisfy the inequality (15):

$$\frac{m\lambda_0}{n_{wav}} < p < \frac{m\lambda_0}{n_s} \quad (15)$$

By determining the period p of the periodic structure so as to satisfy the above inequalities, the light emitted from the photoluminescent layer 110 can be output in the front direction, thus providing a directional light-emitting device.

3. VERIFICATION BY CALCULATIONS 3-1. Period and Wavelength Dependence

The inventors verified, by optical analysis, whether the output of light in a particular direction as described above is actually possible. The optical analysis was performed by calculations using DiffractMOD available from Cybernet Systems Co., Ltd. In these calculations, the change in the absorption of external light incident perpendicular to a light-emitting device by a photoluminescent layer was calculated to determine the enhancement of light output perpendicular to the light-emitting device. The calculation of the process by which external incident light is coupled into a quasi-guided mode and is absorbed by the photoluminescent layer corresponds to the calculation of a process opposite to the process by which light emitted from the photoluminescent layer is coupled into a quasi-guided mode and is converted into propagating light output perpendicular to the light-emitting device. Similarly, the electric field distribution of a quasi-guided mode was calculated from the electric field of external incident light.

Figure 2:
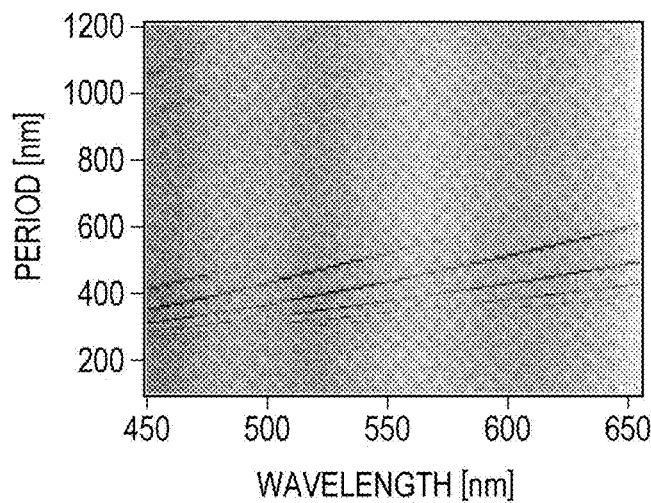
FIG. 2 is a graph showing the calculation results of the enhancement of light output in the front direction with varying emission wavelengths and varying a period of a periodic structure.

FIG. 2 shows the calculation results of the enhancement of light output in the front direction with varying emission wavelengths and varying periods of the periodic structure, where the photoluminescent layer was assumed to have a thickness of 1 μm and a refractive index $n_{wav}$ of 1.8, and the periodic structure was assumed to have a height of 50 nm and a refractive index of 1.5. In these calculations, the periodic structure was assumed to be a one-dimensional periodic structure uniform in the y direction, as shown in FIG. 1A, and the polarization of the light was assumed to be the TM mode, which has an electric field component parallel to the y direction. The results in FIG. 2 show that there are enhancement peaks at certain combinations of wavelength and period. In FIG. 2, the magnitude of the enhancement is expressed by different shades of color; a darker color (black) indicates a higher enhancement, whereas a lighter color (white) indicates a lower enhancement.

Figure 3:
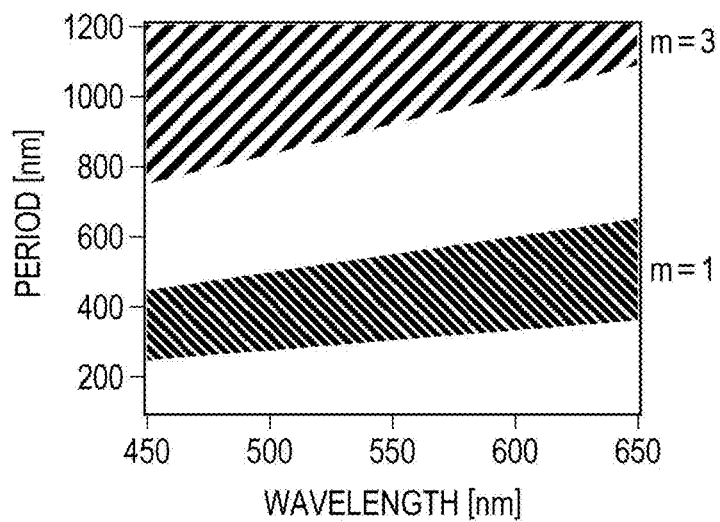
FIG. 3 is a graph illustrating the conditions for m=1 and m=3 in the inequality (10)

In the above calculations, the periodic structure was assumed to have a rectangular cross section as shown in FIG. 1B. FIG. 3 is a graph illustrating the conditions for m=1 and m=3 in the inequality (10). A comparison between FIGS. 2 and 3 shows that the peaks in FIG. 2 are located within the regions corresponding to m=1 and m=3. The intensity is higher for m=1 because first-order diffracted light has a higher diffraction efficiency than third- or higher-order diffracted light. There is no peak for m=2 because of low diffraction efficiency in the periodic structure.

In FIG. 2, a plurality of lines are observed in each of the regions corresponding to m=1 and m=3 in FIG. 3. This indicates the presence of a plurality of quasi-guided modes.

3-2. Thickness Dependence

Figure 4:
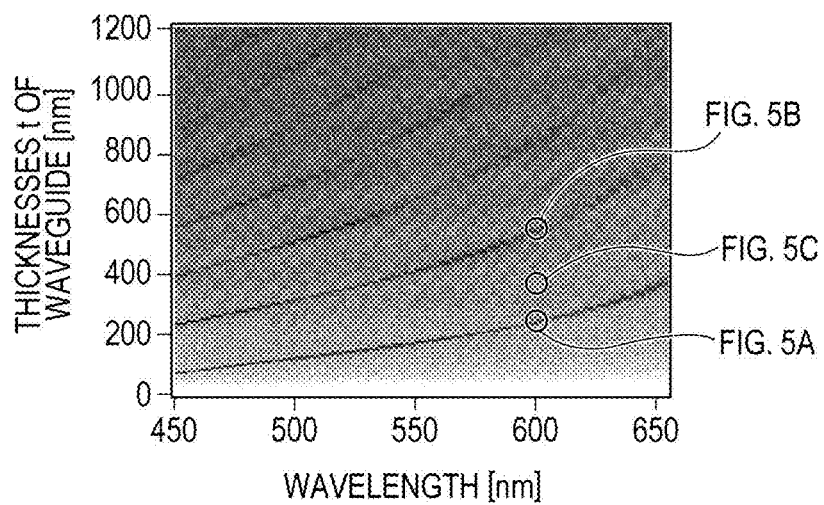
FIG. 4 is a graph showing the calculation results of the enhancement of light output in the front direction with varying emission wavelengths and varying thicknesses t of a photoluminescent layer.

FIG. 4 is a graph showing the calculation results of the enhancement of light output in the front direction with varying emission wavelengths and varying thicknesses t of the photoluminescent layer, where the photoluminescent layer was assumed to have a refractive index $n_{wav}$ of 1.8, and the periodic structure was assumed to have a period of 400 nm, a height of 50 nm, and a refractive index of 1.5. FIG. 4 shows that the enhancement of the light peaks at a particular thickness t of the photoluminescent layer.

Figure 5A:
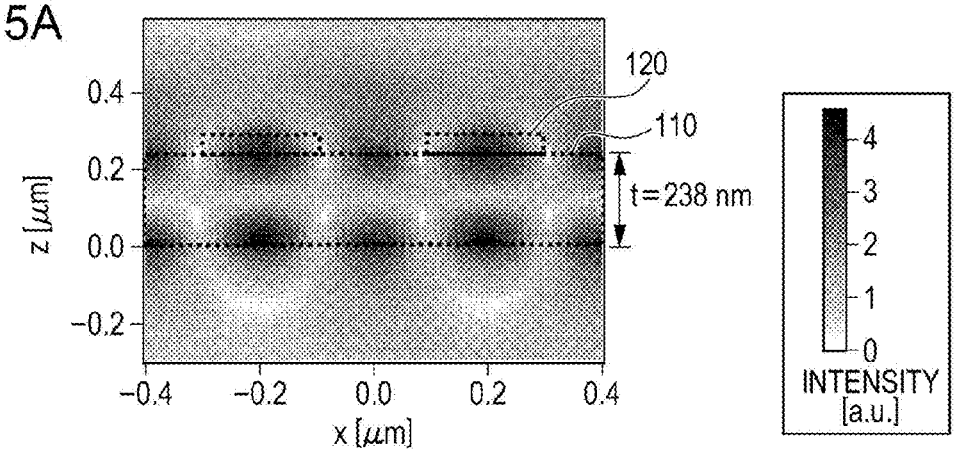
FIG. 5A is a graph showing the calculation results of the electric field distribution of a mode to guide light in the x direction for a thickness t of 238 nm.
Figure 5B:
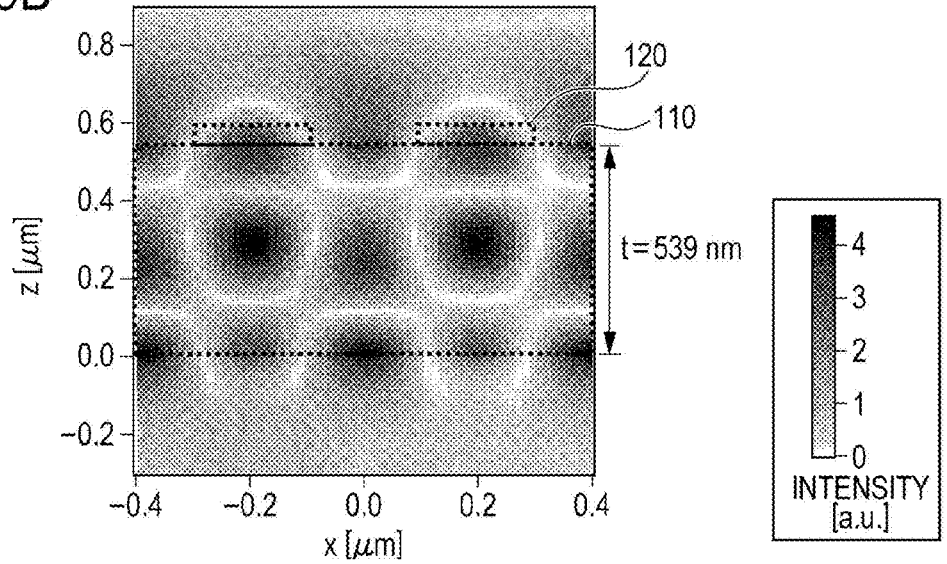
FIG. 5B is a graph showing the calculation results of the electric field distribution of a mode to guide light in the x direction for a thickness t of 539 nm.
Figure 5C:
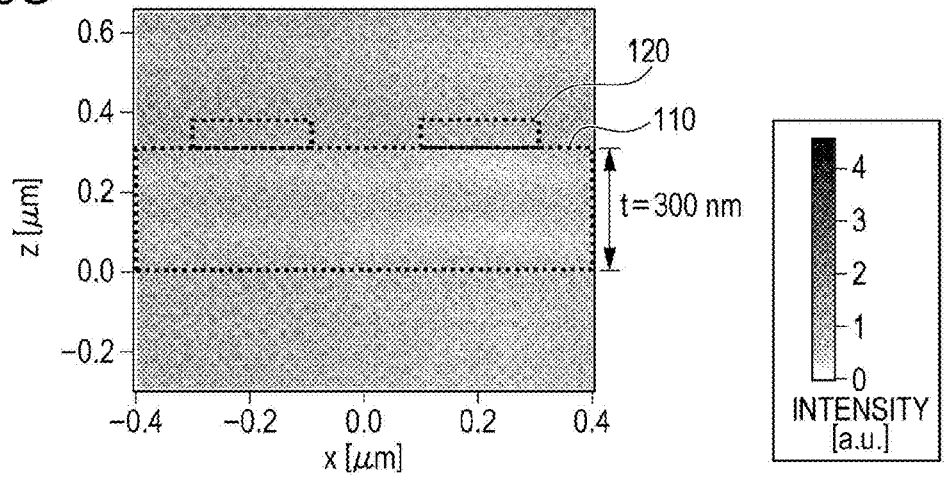
FIG. 5C is a graph showing the calculation results of the electric field distribution of a mode to guide light in the x direction for a thickness t of 300 nm.

FIGS. 5A and 5B show the calculation results of the electric field distributions of a mode to guide light in the x direction for a wavelength of 600 nm and thicknesses t of 238 nm and 539 nm, respectively, at which there are peaks in FIG. 4. For comparison, FIG. 5C shows the results of similar calculations for a thickness t of 300 nm, at which there is no peak. In these calculations, as in the above calculations, the periodic structure was a one-dimensional periodic structure uniform in the y direction. In each figure, a black region indicates a higher electric field intensity, whereas a white region indicates a lower electric field intensity. Whereas the results for t=238 nm and t=539 nm show high electric field intensity, the results for t=300 nm shows low electric field intensity as a whole. This is because there are guided modes for t=238 nm and t=539 nm so that light is strongly confined. Furthermore, regions with the highest electric field intensity (that is, antinodes) are necessarily present in or directly below the projections, indicating the correlation between the electric field and the periodic structure 120. Thus, the resulting guided mode depends on the arrangement of the periodic structure 120. A comparison between the results for t=238 nm and t=539 nm shows that these modes differ in the number of nodes (white regions) of the electric field in the z direction by one.

3-3. Polarization Dependence

Figure 6:
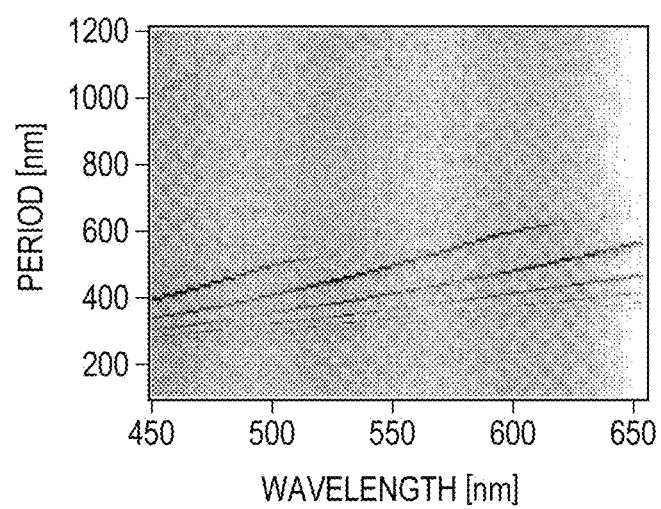
FIG. 6 is a graph showing the calculation results of the enhancement of light performed under the same conditions as in FIG. 2 except that the polarization of the light was assumed to be the TE mode, which has an electric field component perpendicular to the y direction.

To examine the polarization dependence, the enhancement of light was calculated under the same conditions as in FIG. 2 except that the polarization of the light was assumed to be the TE mode, which has an electric field component perpendicular to the y direction. FIG. 6 shows the results of these calculations. Although the peaks in FIG. 6 differ slightly in position from the peaks for the TM mode (FIG. 2), they are located within the regions shown in FIG. 3. This demonstrates that the structure according to this embodiment is effective for both of the TM mode and the TE mode.

3-4. Two-Dimensional Periodic Structure

Figure 7A:
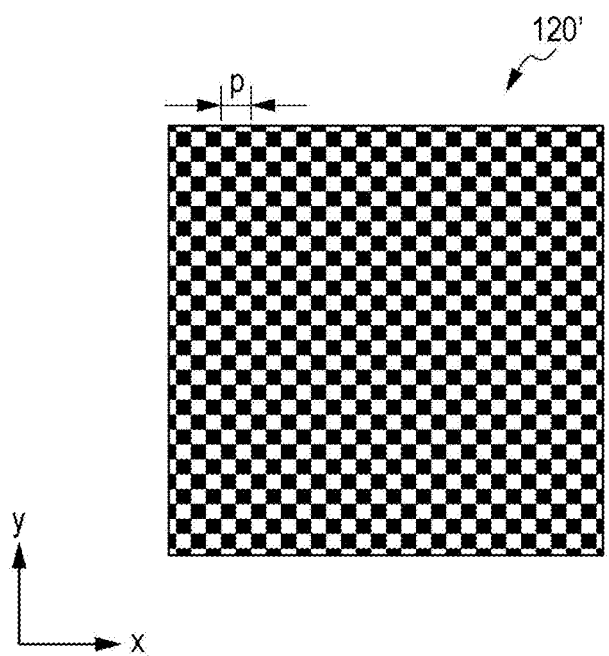
FIG. 7A is a plan view of a two-dimensional periodic structure.
Figure 7B:
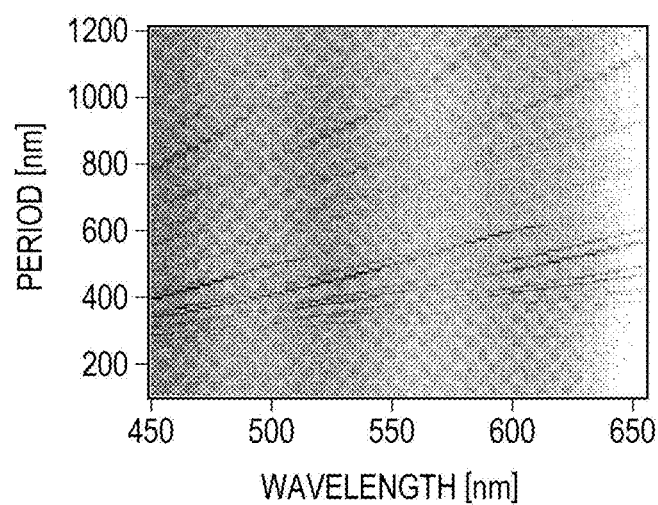
FIG. 7B is a graph showing the results of calculations performed as in FIG. 2 for the two-dimensional periodic structure.

The effect of a two-dimensional periodic structure was also studied. FIG. 7A is a partial plan view of a two-dimensional periodic structure 120' including recesses and projections arranged in both of the x direction and the y direction. In FIG. 7A, the black regions indicate the projections, and the white regions indicate the recesses. For a two-dimensional periodic structure, both of the diffraction in the x direction and the diffraction in the y direction have to be taken into account. Although the diffraction in only the x direction or the y direction is similar to that in a one-dimensional periodic structure, a two-dimensional periodic structure can be expected to give different results from a one-dimensional periodic structure because diffraction also occurs in a direction containing both of an x component and a y component (for example, a direction inclined at 45 degrees). FIG. 7B shows the calculation results of the enhancement of light for the two-dimensional periodic structure. The calculations were performed under the same conditions as in FIG. 2 except for the type of periodic structure. As shown in FIG. 7B, peaks matching the peaks for the TE mode in FIG. 6 were observed in addition to peaks matching the peaks for the TM mode in FIG. 2. These results demonstrate that the two-dimensional periodic structure also converts and outputs the TE mode by diffraction. For a two-dimensional periodic structure, the diffraction that simultaneously satisfies the first-order diffraction conditions in both of the x direction and the y direction also has to be taken into account. Such diffracted light is output in the direction at the angle corresponding to $\sqrt{2}$ times (that is, $2^{1/2}$ times) the period p. Thus, peaks will occur at $\sqrt{2}$ times the period p in addition to peaks that occur in a one-dimensional periodic structure. Such peaks are observed in FIG. 7B.

Figure 18A:
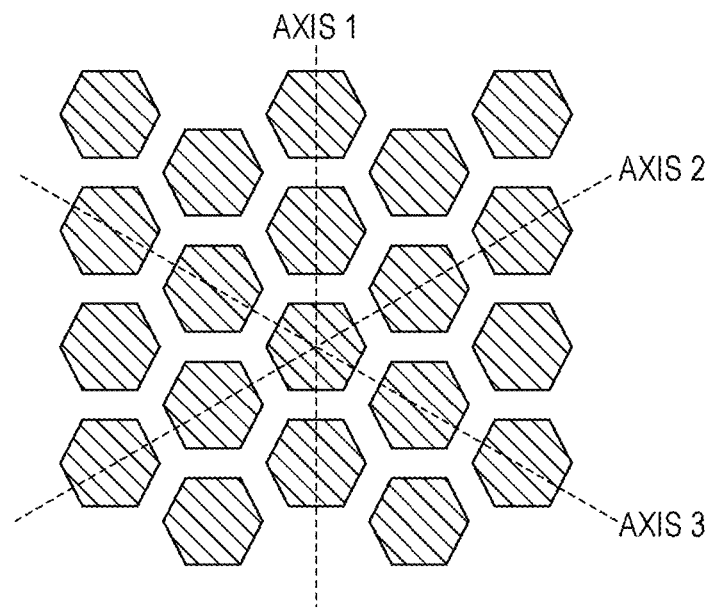
FIG. 18A is a schematic view of a two-dimensional periodic structure.
Figure 18B:
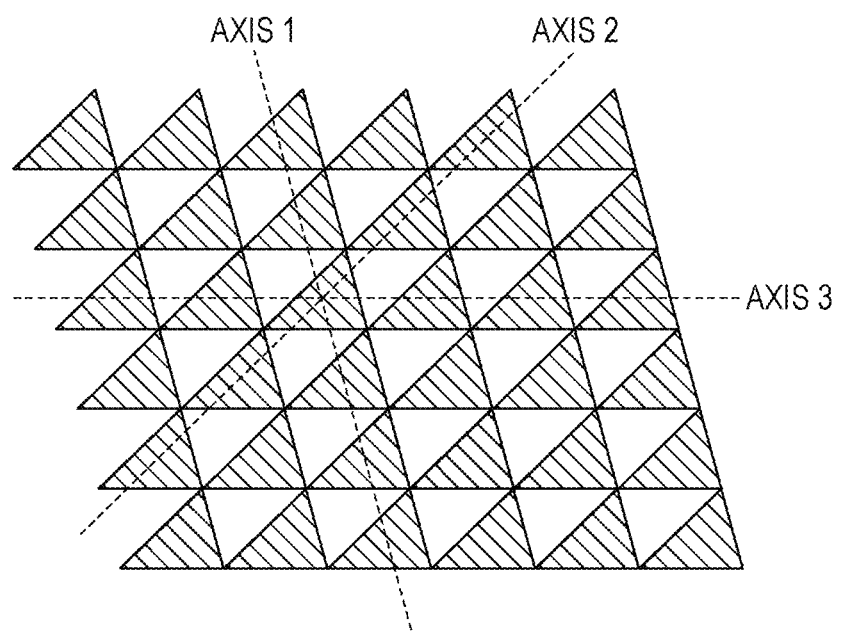
FIG. 18B is a schematic view of another two-dimensional periodic structure.

The two-dimensional periodic structure does not have to be a square grid structure having equal periods in the x direction and the y direction, as illustrated in FIG. 7A, but may be a hexagonal grid structure, as illustrated in FIG. 18A, or a triangular grid structure, as illustrated in FIG. 18B.

The two-dimensional periodic structure may have different periods in different directions (for example, in the x direction and the y direction for a square grid structure).

In this embodiment, as demonstrated above, light in a characteristic quasi-guided mode formed by the periodic structure and the photoluminescent layer can be selectively output only in the front direction through diffraction by the periodic structure. With this structure, the photoluminescent layer can be excited with excitation light such as ultraviolet light or blue light to output directional light.

4. STUDY ON CONSTRUCTIONS OF PERIODIC STRUCTURE AND PHOTOLUMINESCENT LAYER

The effects of changes in various conditions such as the constructions and refractive indices of the periodic structure and the photoluminescent layer will now be described.

4-1. Refractive Index of Periodic Structure

Figure 8:
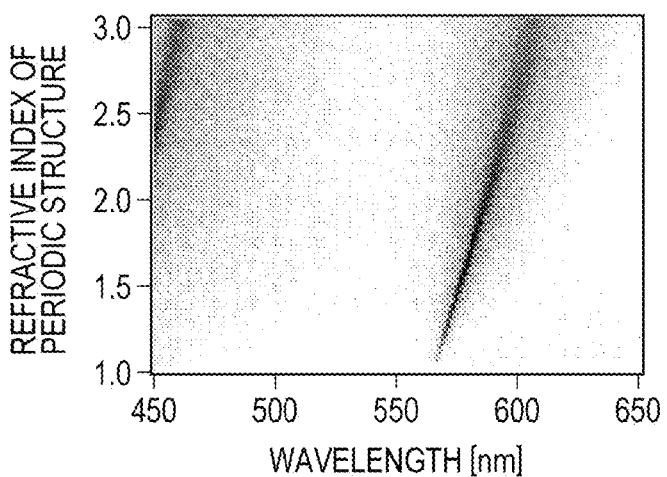
FIG. 8 is a graph showing the calculation results of the enhancement of light output in the front direction with varying emission wavelengths and varying refractive indices of the periodic structure.
Figure 9:
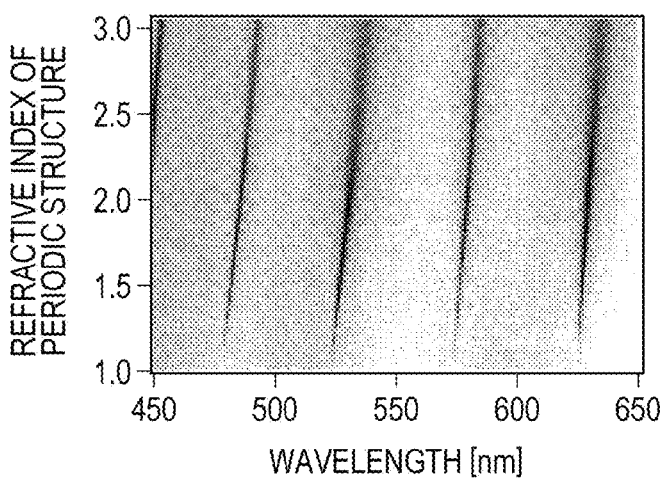
FIG. 9 is a graph showing the results obtained under the same conditions as in FIG. 8 except that the photoluminescent layer was assumed to have a thickness of 1,000 nm.

The refractive index of the periodic structure was studied. In the calculations performed herein, the photoluminescent layer was assumed to have a thickness of 200 nm and a refractive index $n_{wav}$ of 1.8, the periodic structure was assumed to be a one-dimensional periodic structure uniform in the y direction, as shown in FIG. 1A, having a height of 50 nm and a period of 400 nm, and the polarization of the light was assumed to be the TM mode, which has an electric field component parallel to the y direction. FIG. 8 shows the calculation results of the enhancement of light output in the front direction with varying emission wavelengths and varying refractive indices of the periodic structure. FIG. 9 shows the results obtained under the same conditions except that the photoluminescent layer was assumed to have a thickness of 1,000 nm.

The results show that a photoluminescent layer having a thickness of 1,000 nm (FIG. 9) results in a smaller shift in the wavelength at which the light intensity peaks (referred to as a peak wavelength) with the change in the refractive index of the periodic structure than a photoluminescent layer having a thickness of 200 nm (FIG. 8). This is because the quasi-guided mode is more affected by the refractive index of the periodic structure as the photoluminescent layer is thinner. Specifically, a periodic structure having a higher refractive index increases the effective refractive index and thus shifts the peak wavelength toward longer wavelengths, and this effect is more noticeable as the photoluminescent layer is thinner. The effective refractive index is determined by the refractive index of the medium present in the region where the electric field of the quasi-guided mode is distributed.

The results also show that a periodic structure having a higher refractive index results in a broader peak and a lower intensity. This is because a periodic structure having a higher refractive index outputs light in the quasi-guided mode at a higher rate and is therefore less effective in confining the light, that is, has a lower Q value. To maintain a high peak intensity, a structure may be employed in which light is moderately output using a quasi-guided mode that is effective in confining the light (that is, has a high Q value). This means that it is undesirable to use a periodic structure made of a material having a much higher refractive index than the photoluminescent layer. Thus, in order to increase the peak intensity and Q value, the refractive index of a dielectric material constituting the periodic structure (that is, the light-transmissive layer) can be lower than or similar to the refractive index of the photoluminescent layer. This is also true if the photoluminescent layer contains materials other than photoluminescent materials.

4-2. Height of Periodic Structure

Figure 10:
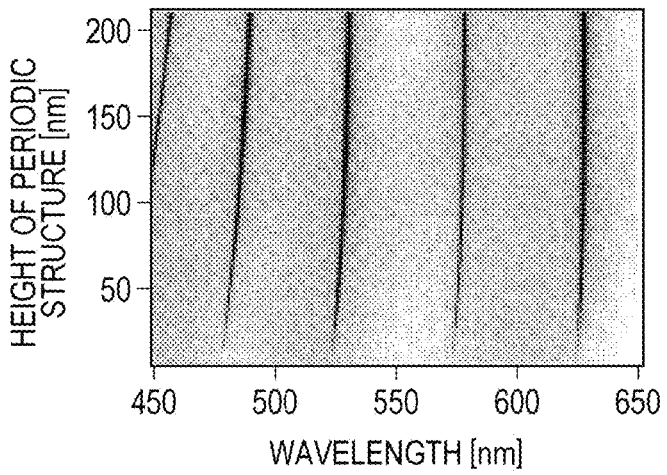
FIG. 10 is a graph showing the calculation results of the enhancement of light output in the front direction with varying emission wavelengths and varying heights of the periodic structure.
Figure 11:
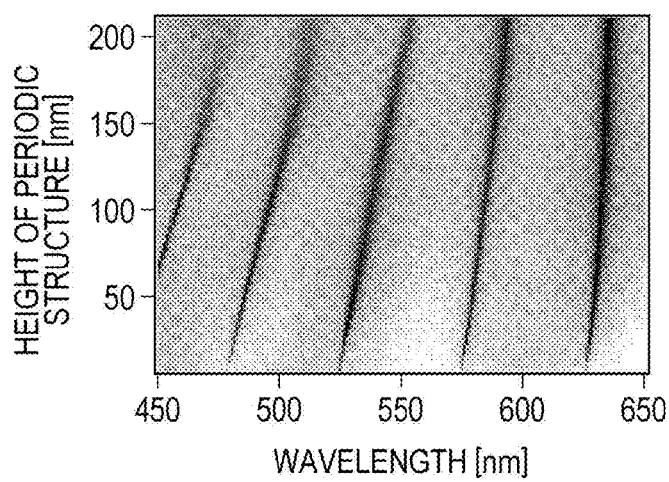
FIG. 11 is a graph showing the results of calculations performed under the same conditions as in FIG. 10 except that the periodic structure was assumed to have a refractive index $n_p$ of 2.0.

The height of the periodic structure was then studied. In the calculations performed herein, the photoluminescent layer was assumed to have a thickness of 1,000 nm and a refractive index $n_{wav}$ of 1.8, the periodic structure was assumed to be a one-dimensional periodic structure uniform in the y direction, as shown in FIG. 1A, having a refractive index $n_p$ of 1.5 and a period of 400 nm, and the polarization of the light was assumed to be the TM mode, which has an electric field component parallel to the y direction. FIG. 10 shows the calculation results of the enhancement of light output in the front direction with varying emission wavelengths and varying heights of the periodic structure. FIG. 11 shows the results of calculations performed under the same conditions except that the periodic structure was assumed to have a refractive index $n_p$ of 2.0. Whereas the results in FIG. 10 show that the peak intensity and the Q value (that is, the peak line width) do not change above a certain height of the periodic structure, the results in FIG. 11 show that the peak intensity and the Q value decrease with increasing height of the periodic structure. If the refractive index $n_{wav}$ of the photoluminescent layer is higher than the refractive index $n_p$ of the periodic structure (FIG. 10), the light is totally reflected, and only a leaking (that is, evanescent) portion of the electric field of the quasi-guided mode interacts with the periodic structure. If the periodic structure has a sufficiently large height, the influence of the interaction between the evanescent portion of the electric field and the periodic structure remains constant irrespective of the height. In contrast, if the refractive index $n_{wav}$ of the photoluminescent layer is lower than the refractive index $n_p$ of the periodic structure (FIG. 11), the light reaches the surface of the periodic structure without being totally reflected and is therefore more influenced by a periodic structure with a larger height. As shown in FIG. 11, a height of approximately 100 nm is sufficient, and the peak intensity and the Q value decrease above a height of 150 nm. Thus, if the refractive index $n_{wav}$ of the photoluminescent layer is lower than the refractive index $n_p$ of the periodic structure, the periodic structure may have a height of 150 nm or less to achieve a high peak intensity and Q value.

4-3. Polarization Direction

Figure 12:
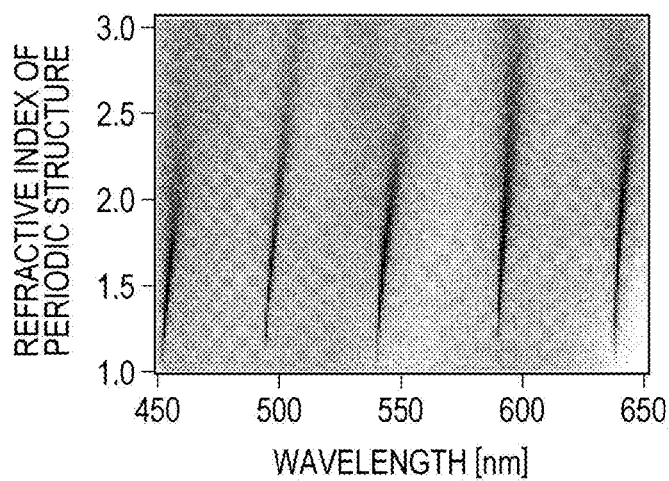
FIG. 12 is a graph showing the results of calculations performed under the same conditions as in FIG. 9 except that the polarization of the light was assumed to be the TE mode, which has an electric field component perpendicular to the y direction.

The polarization direction was then studied. FIG. 12 shows the results of calculations performed under the same conditions as in FIG. 9 except that the polarization of the light was assumed to be the TE mode, which has an electric field component perpendicular to the y direction. The TE mode is more influenced by the periodic structure than the TM mode because the electric field of the quasi-guided mode leaks more largely for the TE mode than for the TM mode. Thus, the peak intensity and the Q value decrease more significantly for the TE mode than for the TM mode if the refractive index $n_p$ of the periodic structure is higher than the refractive index $n_{wav}$ of the photoluminescent layer.

4-4. Refractive Index of Photoluminescent Layer

Figure 13:
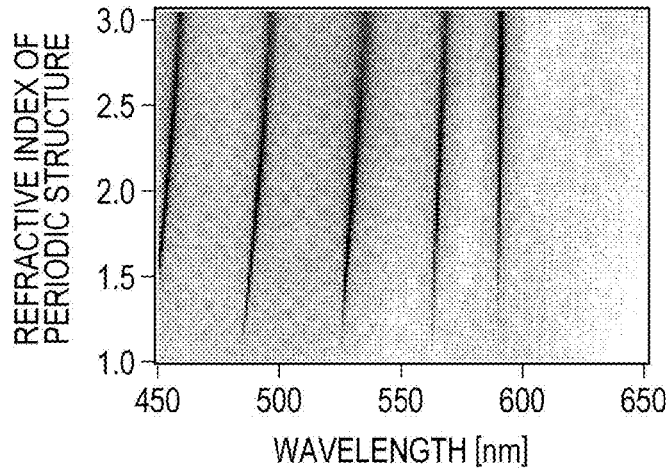
FIG. 13 is a graph showing the results of calculations performed under the same conditions as in FIG. 9 except that the photoluminescent layer was assumed to have a refractive index $n_{wav}$ of 1.5.

The refractive index of the photoluminescent layer was then studied. FIG. 13 shows the results of calculations performed under the same conditions as in FIG. 9 except that the photoluminescent layer was assumed to have a refractive index $n_{wav}$ of 1.5. The results for the photoluminescent layer having a refractive index $n_{wav}$ of 1.5 are similar to the results in FIG. 9. However, light having a wavelength of 600 nm or more was not output in the front direction. This is because, from the inequality (10), $\lambda_0 < n_{wav} \times p/m = 1.5 \times 400$ nm/1=600 nm.

The above analysis demonstrates that a high peak intensity and Q value can be achieved if the periodic structure has a refractive index lower than or similar to the refractive index of the photoluminescent layer or if the periodic structure has a higher refractive index than the photoluminescent layer and a height of 150 nm or less.

5. MODIFIED EXAMPLES

Modified Examples of the present embodiment will be described below.

5-1. Structure Including Substrate

As described above, the light-emitting device may have a structure in which the photoluminescent layer 110 and the periodic structure 120 are formed on the transparent substrate 140, as illustrated in FIGS. 1C and 1D. Such a light-emitting device 100a may be produced by forming a thin film of the photoluminescent material for the photoluminescent layer 110 (optionally containing a matrix material; the same applies hereinafter) on the transparent substrate 140 and then forming the periodic structure 120 thereon. In this structure, the refractive index $n_s$ of the transparent substrate 140 has to be lower than or equal to the refractive index $n_{wav}$ of the photoluminescent layer 110 so that the photoluminescent layer 110 and the periodic structure 120 function to output light in a particular direction. If the transparent substrate 140 is provided in contact with the photoluminescent layer 110, the period p has to be set so as to satisfy the inequality (15), which is given by replacing the refractive index $n_{out}$ of the output medium in the inequality (10) by $n_s$.

Figure 14:
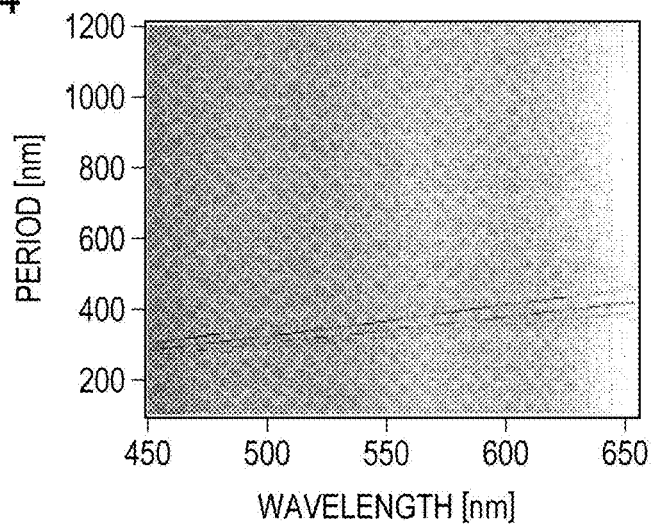
FIG. 14 is a graph showing the results of calculations performed under the same conditions as in FIG. 2 except that the photoluminescent layer and the periodic structure were assumed to be located on a transparent substrate having a refractive index of 1.5.
Figure 15:
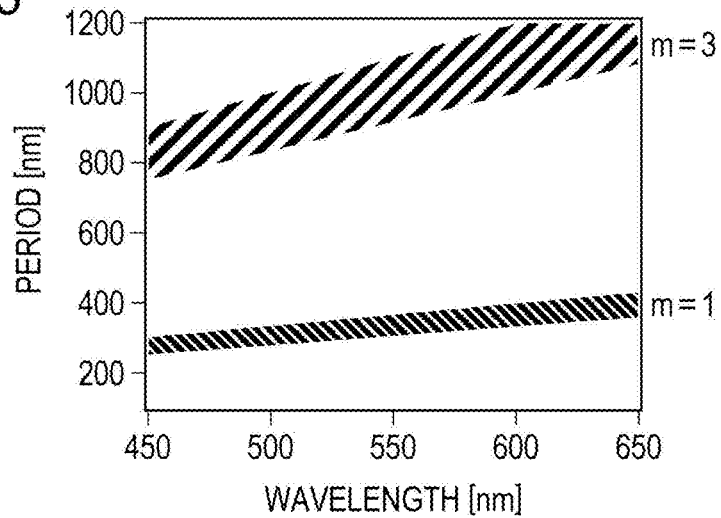
FIG. 15 is a graph illustrating the condition represented by the inequality (15)

To demonstrate this, calculations were performed under the same conditions as in FIG. 2 except that the photoluminescent layer 110 and the periodic structure 120 were assumed to be located on a transparent substrate 140 having a refractive index of 1.5. FIG. 14 shows the results of these calculations. As in the results in FIG. 2, light intensity peaks are observed at particular periods for each wavelength, although the ranges of periods where peaks appear differ from those in FIG. 2. FIG. 15 is a graph illustrating the condition represented by the inequality (15), which is given by substituting $n_{out} = n_s$ into the inequality (10). In FIG. 14, light intensity peaks are observed in the regions corresponding to the ranges shown in FIG. 15.

Thus, for the light-emitting device 100a, in which the photoluminescent layer 110 and the periodic structure 120 are located on the transparent substrate 140, a period p that satisfies the inequality (15) is effective, and a period p that satisfies the inequality (13) is significantly effective.

5-2. Light-Emitting Apparatus Including Excitation Light Source

Figure 16:
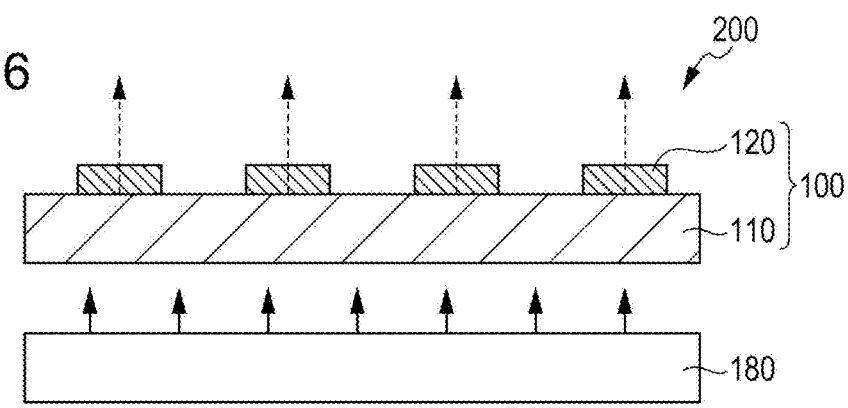
FIG. 16 is a schematic view of a light-emitting apparatus including a light-emitting device illustrated in FIGS. 1A and 1B and a light source that directs excitation light into a photoluminescent layer.

FIG. 16 is a schematic view of a light-emitting apparatus 200 including the light-emitting device 100 illustrated in FIGS. 1A and 1B and a light source 180 that emits excitation light toward the photoluminescent layer 110. In this embodiment, as described above, the photoluminescent layer can be excited with excitation light such as ultraviolet light or blue light to output directional light. The light source 180 can be configured to emit such excitation light to provide a directional light-emitting apparatus 200. Although the wavelength of the excitation light emitted from the light source 180 is typically within the ultraviolet or blue range, it is not necessarily within these ranges, but may be determined depending on the photoluminescent material for the photoluminescent layer 110. Although the light source 180 illustrated in FIG. 16 is configured to direct excitation light into the bottom surface of the photoluminescent layer 110, it may be configured otherwise, for example, to direct excitation light into the top surface of the photoluminescent layer 110.

Figure 17A:
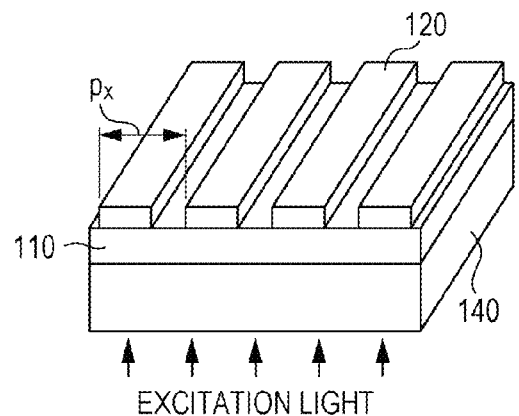
FIGS. 17A to 17D illustrate structures in which excitation light is coupled into a quasi-guided mode to efficiently output light.
Figure 17B:
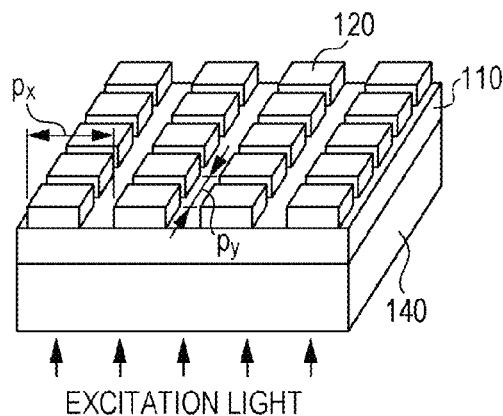

The excitation light may be coupled into a quasi-guided mode to efficiently output light. FIGS. 17A to 17D illustrate this method. In this example, as in the structure illustrated in FIGS. 1C and 1D, the photoluminescent layer 110 and the periodic structure 120 are formed on the transparent substrate 140. As illustrated in FIG. 17A, the period $p_x$ in the x direction is first determined so as to enhance light emission. As illustrated in FIG. 17B, the period $p_y$ in the y direction is then determined so as to couple the excitation light into a quasi-guided mode. The period $p_x$ is determined so as to satisfy the condition given by replacing p in the inequality (10) by $p_x$. The period $p_y$ is determined so as to satisfy the inequality (16):

$$\frac{m\lambda_{ex}}{n_{wav}} < p_y < \frac{m\lambda_{ex}}{n_{out}} \quad (16)$$

wherein m is an integer of 1 or more, $\lambda_{ex}$ is the wavelength of the excitation light, and $n_{out}$ is the refractive index of the medium having the highest refractive index of the media in contact with the photoluminescent layer 110 except the periodic structure 120.

In the example in FIGS. 17A to 17D, $n_{out}$ is the refractive index $n_s$ of the transparent substrate 140. For a structure including no transparent substrate 140, as illustrated in FIG. 16, $n_{out}$ denotes the refractive index of air (approximately 1.0).

In particular, the excitation light can be more effectively converted into a quasi-guided mode if m=1, that is, if the period $p_y$ is determined so as to satisfy the inequality (17):

$$\frac{\lambda_{ex}}{n_{wav}} < p_y < \frac{\lambda_{ex}}{n_{out}} \quad (17)$$

Thus, the excitation light can be converted into a quasi-guided mode if the period $p_y$ is set so as to satisfy the condition represented by the inequality (16) (particularly, the condition represented by the inequality (17)). As a result, the photoluminescent layer 110 can efficiently absorb the excitation light of the wavelength $\lambda_{ex}$.

Figure 17C:
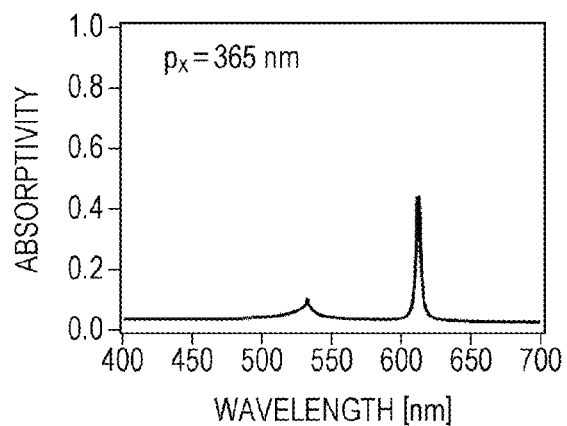
Figure 17D:
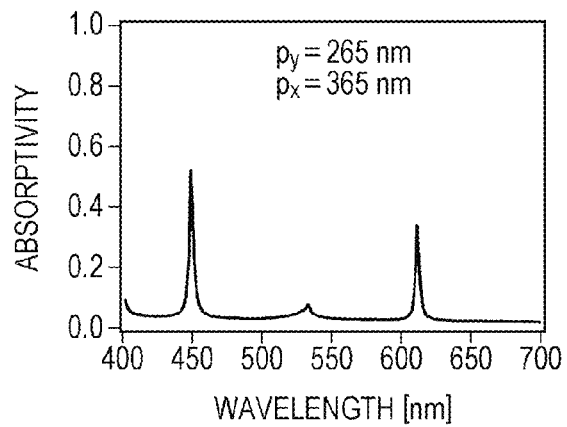

FIGS. 17C and 17D are the calculation results of the proportion of absorbed light to light incident on the structures illustrated in FIGS. 17A and 17B, respectively, for each wavelength. In these calculations, $p_x$=365 nm, $p_y$=265 nm, the photoluminescent layer 110 was assumed to have an emission wavelength λ of about 600 nm, the excitation light was assumed to have a wavelength $\lambda_{ex}$ of about 450 nm, and the photoluminescent layer 110 was assumed to have an extinction coefficient of 0.003. As shown in FIG. 17D, the photoluminescent layer 110 has high absorptivity not only for the light emitted from the photoluminescent layer 110 but also for the excitation light, that is, light having a wavelength of approximately 450 nm. This indicates that the incident light is effectively converted into a quasi-guided mode to increase the proportion of the light absorbed into the photoluminescent layer 110. The photoluminescent layer 110 also has high absorptivity for the emission wavelength, that is, approximately 600 nm. This indicates that light having a wavelength of approximately 600 nm incident on this structure is similarly effectively converted into a quasi-guided mode. The periodic structure 120 shown in FIG. 17B is a two-dimensional periodic structure including structures having different periods (that is, different periodic components) in the x direction and the y direction. Such a two-dimensional periodic structure including periodic components allows for high excitation efficiency and high output intensity. Although the excitation light is incident on the transparent substrate 140 in FIGS. 17A and 17B, the same effect can be achieved even if the excitation light is incident on the periodic structure 120.

Also available are two-dimensional periodic structures including periodic components as shown in FIGS. 18A and 18B. The structure illustrated in FIG. 18A includes periodically arranged projections or recesses having a hexagonal planar shape. The structure illustrated in FIG. 18B includes periodically arranged projections or recesses having a triangular planar shape. These structures have major axes (axes 1 to 3 in the examples in FIGS. 18A and 18B) that can be assumed to be periodic. Thus, the structures can have different periods in different axial directions. These periods may be set so as to increase the directionality of light beams of different wavelengths or to efficiently absorb the excitation light. In any case, each period is set so as to satisfy the condition corresponding to the inequality (10).

5-3. Periodic Structure on Transparent Substrate

Figure 19A:
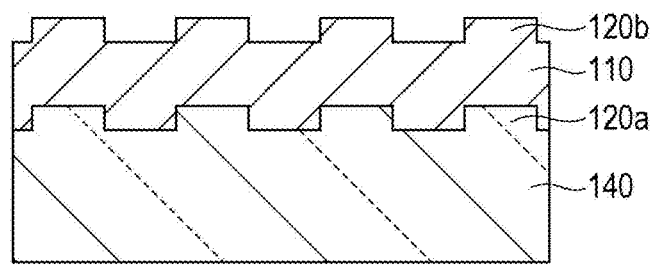
FIG. 19A is a schematic view of a modified example in which a periodic structure is formed on a transparent substrate.
Figure 19B:
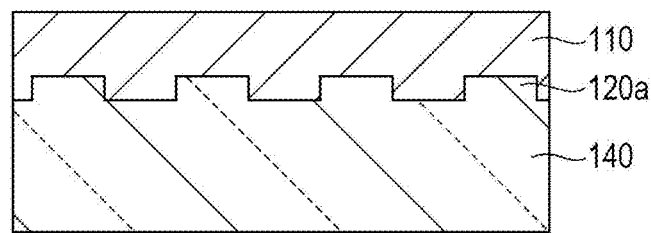
FIG. 19B is a schematic view of another modified example in which a periodic structure is formed on a transparent substrate.

As illustrated in FIGS. 19A and 19B, a periodic structure 120a may be formed on the transparent substrate 140, and the photoluminescent layer 110 may be located thereon. In the example in FIG. 19A, the photoluminescent layer 110 is formed along the texture of the periodic structure 120a on the transparent substrate 140. As a result, a periodic structure 120b with the same period is formed in the surface of the photoluminescent layer 110. In the example in FIG. 19B, the surface of the photoluminescent layer 110 is flattened. In these examples, directional light emission can be achieved by setting the period p of the periodic structure 120a so as to satisfy the inequality (15).

Figure 19C:
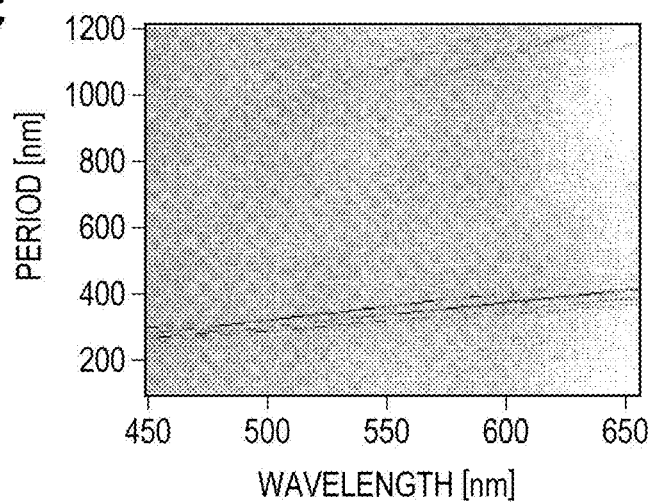
FIG. 19C is a graph showing the calculation results of the enhancement of light output from the structure illustrated in FIG. 19A in the front direction with varying emission wavelengths and varying periods of the periodic structure.

To verify the effect of these structures, the enhancement of light output from the structure in FIG. 19A in the front direction was calculated with varying emission wavelengths and varying periods of the periodic structure. In these calculations, the photoluminescent layer 110 was assumed to have a thickness of 1,000 nm and a refractive index $n_{wav}$ of 1.8, the periodic structure 120a was assumed to be a one-dimensional periodic structure uniform in the y direction having a height of 50 nm, a refractive index $n_p$ of 1.5, and a period of 400 nm, and the polarization of the light was assumed to be the TM mode, which has an electric field component parallel to the y direction. FIG. 19C shows the results of these calculations. In these calculations, light intensity peaks were observed at the periods that satisfy the condition represented by the inequality (15).

5-4. Powder

According to the above embodiment, light of any wavelength can be enhanced by adjusting the period of the periodic structure and the thickness of the photoluminescent layer. For example, if the structure illustrated in FIGS. 1A and 1B is formed using a photoluminescent material that emits light over a wide wavelength range, only light of a certain wavelength can be enhanced. Accordingly, the structure of the light-emitting device 100 as illustrated in FIGS. 1A and 1B may be provided in powder form for use as a fluorescent material. Alternatively, the light-emitting device 100 as illustrated in FIGS. 1A and 1B may be embedded in resin or glass.

Figure 20:
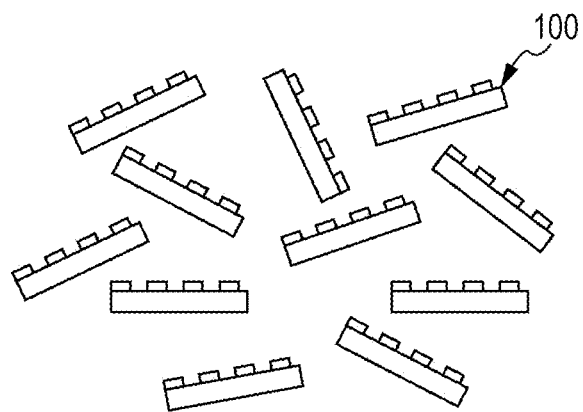
FIG. 20 is a schematic view of a mixture of light-emitting devices in powder form.

The single structure as illustrated in FIGS. 1A and 1B can output only light of a certain wavelength in a particular direction and is therefore not suitable for outputting, for example, white light, which has a wide wavelength spectrum. Accordingly, as shown in FIG. 20, light-emitting devices 100 that differ in the conditions such as the period of the periodic structure and the thickness of the photoluminescent layer may be mixed in powder form to provide a light-emitting apparatus with a wide wavelength spectrum. In such a case, the individual light-emitting devices 100 have sizes of, for example, several micrometers to several millimeters in one direction and can include, for example, one- or two-dimensional periodic structures with several periods to several hundreds of periods.

5-5. Array of Structures with Different Periods

Figure 21:
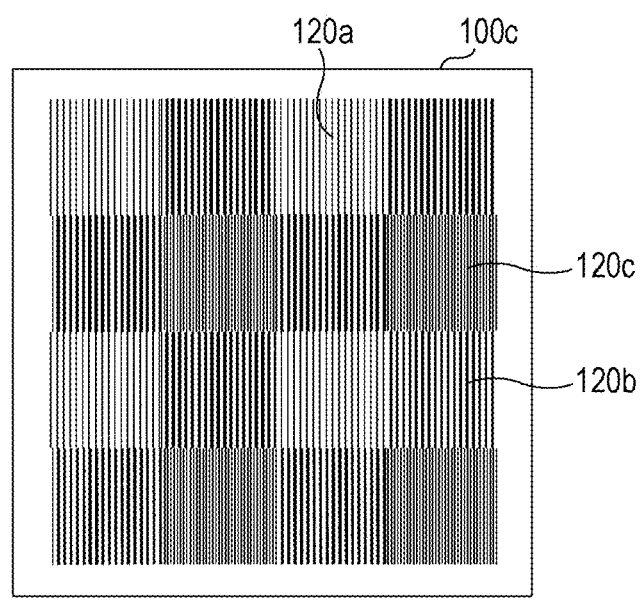
FIG. 21 is a plan view of a two-dimensional array of periodic structures having different periods on the photoluminescent layer.

FIG. 21 is a plan view of a two-dimensional array of periodic structures having different periods on the photoluminescent layer. In this example, three types of periodic structures 120a, 120b, and 120c are arranged without any space therebetween. The periods of the periodic structures 120a, 120b, and 120c are set so as to output, for example, light in the red, green, and blue wavelength ranges, respectively, in the front direction. Thus, structures having different periods can be arranged on the photoluminescent layer to output directional light with a wide wavelength spectrum. The periodic structures are not necessarily configured as described above, but may be configured in any manner.

5-6. Layered Structure

Figure 22:
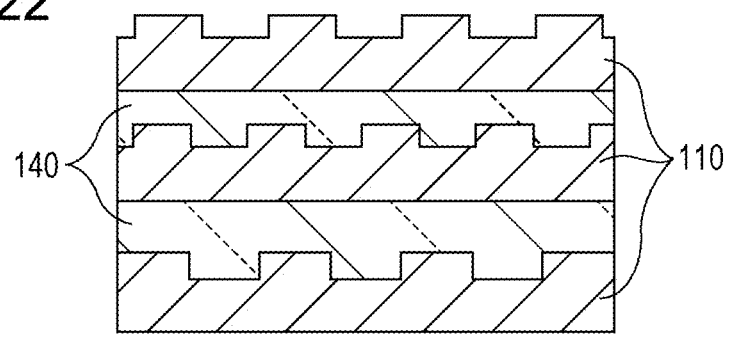
FIG. 22 is a schematic view of a light-emitting device including photoluminescent layers each having a textured surface.

FIG. 22 illustrates a light-emitting device including photoluminescent layers 110 each having a textured surface. A transparent substrate 140 is located between the photoluminescent layers 110. The texture on each of the photoluminescent layers 110 corresponds to the periodic structure or the submicron structure. The example in FIG. 22 includes three periodic structures having different periods. The periods of these periodic structures are set so as to output light in the red, green, and blue wavelength ranges in the front direction. The photoluminescent layer 110 in each layer is made of a material that emits light of the color corresponding to the period of the periodic structure in that layer. Thus, periodic structures having different periods can be stacked on top of each other to output directional light with a wide wavelength spectrum.

The number of layers and the constructions of the photoluminescent layer 110 and the periodic structure in each layer are not limited to those described above, but may be selected as appropriate. For example, for a structure including two layers, first and second photoluminescent layers are formed opposite each other with a light-transmissive substrate therebetween, and first and second periodic structures are formed on the surfaces of the first and second photoluminescent layers, respectively. In such a case, the first photoluminescent layer and the first periodic structure may together satisfy the condition corresponding to the inequality (15), whereas the second photoluminescent layer and the second periodic structure may together satisfy the condition corresponding to the inequality (15). For a structure including three or more layers, the photoluminescent layer and the periodic structure in each layer may satisfy the condition corresponding to the inequality (15). The positional relationship between the photoluminescent layers and the periodic structures in FIG. 22 may be reversed. Although the layers illustrated by the example in FIG. 22 have different periods, they may all have the same period. In such a case, although the spectrum cannot be broadened, the emission intensity can be increased.

5-7. Structure Including Protective Layer

Figure 23:
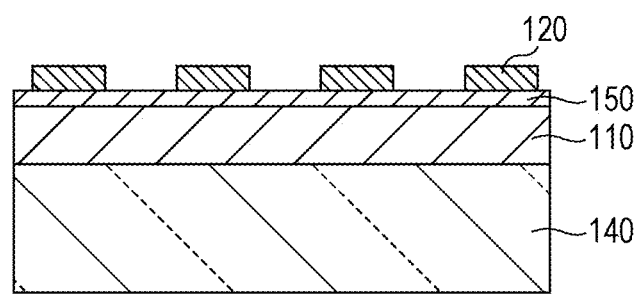
FIG. 23 is a cross-sectional view of a structure including a protective layer between a photoluminescent layer and a periodic structure.

FIG. 23 is a cross-sectional view of a structure including a protective layer 150 between the photoluminescent layer 110 and the periodic structure 120. The protective layer 150 may be provided to protect the photoluminescent layer 110. However, if the protective layer 150 has a lower refractive index than the photoluminescent layer 110, the electric field of the light leaks into the protective layer 150 only by about half the wavelength. Thus, if the protective layer 150 is thicker than the wavelength, no light reaches the periodic structure 120. As a result, there is no quasi-guided mode, and the function of outputting light in a particular direction cannot be achieved. If the protective layer 150 has a refractive index higher than or similar to that of the photoluminescent layer 110, the light reaches the interior of the protective layer 150; therefore, there is no limitation on the thickness of the protective layer 150. Nevertheless, a thinner protective layer 150 is desirable because more light is output if most of the portion in which light is guided (this portion is hereinafter referred to as "waveguide layer") is made of a photoluminescent material. The protective layer 150 may be made of the same material as the periodic structure (light-transmissive layer) 120. In such a case, the light-transmissive layer 120 having the periodic structure functions as a protective layer. The light-transmissive layer 120 desirably has a lower refractive index than the photoluminescent layer 110.

6. MATERIALS AND PRODUCTION METHODS

Directional light emission can be achieved if the photoluminescent layer (or waveguide layer) and the periodic structure are made of materials that satisfy the above conditions. The periodic structure may be made of any material. However, a photoluminescent layer (or waveguide layer) or a periodic structure made of a medium with high light absorption is less effective in confining light and therefore results in a lower peak intensity and Q value. Thus, the photoluminescent layer (or waveguide layer) and the periodic structure may be made of media with relatively low light absorption.

For example, the periodic structure may be formed of a dielectric material having low light absorptivity. Examples of candidate materials for the periodic structure include magnesium fluoride ($MgF_2$), lithium fluoride (LiF), calcium fluoride ($CaF_2$), quartz ($SiO_2$), glasses, resins, magnesium oxide (MgO), indium tin oxide (ITO), titanium oxide ($TiO_2$), silicon nitride (SiN), tantalum pentoxide ($Ta_2O_5$), zirconia ($ZrO_2$), zinc selenide (ZnSe), and zinc sulfide (ZnS). To form a periodic structure having a lower refractive index than the photoluminescent layer, as described above, $MgF_2$, LiF, $CaF_2$, $SiO_2$, glasses, and resins can be used, which have refractive indices of approximately 1.3 to 1.5.

The term "photoluminescent material" encompasses fluorescent materials and phosphorescent materials in a narrow sense, encompasses inorganic materials and organic materials (for example, dyes), and encompasses quantum dots (that is, tiny semiconductor particles). In general, a fluorescent material containing an inorganic host material tends to have a higher refractive index. Examples of fluorescent materials that emit blue light include $M_{10}(PO_4)_6Cl_2:Eu^{2+}$ (wherein M is at least one element selected from Ba, Sr, and Ca), $BaMgAl_{10}O_{17}:Eu^{2+}$, $M_3MgSi_2O_8:Eu^{2+}$ (wherein M is at least one element selected from Ba, Sr, and Ca), and $M_5SiO_4Cl_6:Eu^{2+}$ (wherein M is at least one element selected from Ba, Sr, and Ca). Examples of fluorescent materials that emit green light include $M_2MgSi_2O_7:Eu^{2+}$ (wherein M is at least one element selected from Ba, Sr, and Ca), $SrSi_5AlO_2N_7:Eu^{2+}$, $SrSi_2O_2N_2:Eu^{2+}$, $BaAl_2O_4:Eu^{2+}$, $BaZrSi_3O_9:Eu^{2+}$, $M_2SiO_4:Eu^{2+}$ (wherein M is at least one element selected from Ba, Sr, and Ca), $BaSi_3O_4N_2:Eu^{2+}$, $Ca_8Mg(SiO_4)_4Cl_2:Eu^{2+}$, $Ca_3SiO_4Cl_2:Eu^{2+}$, $CaSi_{12-(m+n)}Al_{(m+n)}O_nN_{16-n}:Ce^{3+}$, and β-SiAlON:$Eu^{2+}$. Examples of fluorescent materials that emit red light include $CaAlSiN_3$:$Eu^{2+}$, $SrAlSi_4O_7$:$Eu^{2+}$, $M_2Si_5N_8$:$Eu^{2+}$ (wherein M is at least one element selected from Ba, Sr, and Ca), $MSiN_2$:$Eu^{2+}$ (wherein M is at least one element selected from Ba, Sr, and Ca), $MSi_2O_2N_2$:$Yb^{2+}$ (wherein M is at least one element selected from Sr and Ca), $Y_2O_2S$:$Eu^{3+}$, $Sm^{3+}$, $La_2O_2S$:$Eu^{3+}$, $Sm^{3+}$, $CaWO_4$:$Li^{1+}$, $Eu^{3+}$, $Sm^{3+}$, $M_2SiS_4$:$Eu^{2+}$ (wherein M is at least one element selected from Ba, Sr, and Ca), and $M_3SiO_5$:$Eu^{2+}$ (wherein M is at least one element selected from Ba, Sr, and Ca). Examples of fluorescent materials that emit yellow light include $Y_3Al_5O_{12}$:$Ce^{3+}$, $CaSi_2O_2N_2$:$Eu^{2+}$, $Ca_3Sc_2Si_3O_{12}$:$Ce^{3+}$, $CaSc_2O_4$:$Ce^{3+}$, α-SiAlON:$Eu^{2+}$, $MSi_2O_2N_2$:$Eu^{2+}$ (wherein M is at least one element selected from Ba, Sr, and Ca), and $M_7(SiO_3)_6Cl_2$:$Eu^{2+}$ (wherein M is at least one element selected from Ba, Sr, and Ca).

Examples of quantum dots include materials such as CdS, CdSe, core-shell CdSe/ZnS, and alloy CdSSe/ZnS. Light of various wavelengths can be emitted depending on the material. Examples of matrices for quantum dots include glasses and resins.

The transparent substrate 140, as shown in, for example, FIGS. 1C and 1D, is made of a light-transmissive material having a lower refractive index than the photoluminescent layer 110. Examples of such materials include magnesium fluoride ($MgF_2$), lithium fluoride (LiF), calcium fluoride ($CaF_2$), quartz ($SiO_2$), glasses, and resins.

Exemplary production methods will be described below.

Figure 24:
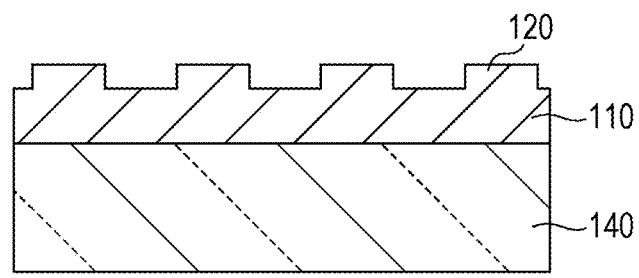
FIG. 24 is a cross-sectional view of a structure including a periodic structure formed by processing only a portion of a photoluminescent layer.

A method for forming the structure illustrated in FIGS. 1C and 1D includes forming a thin film of the photoluminescent layer 110 on the transparent substrate 140, for example, by evaporation, sputtering, or coating of a fluorescent material, forming a dielectric film, and then patterning the dielectric film, for example, by photolithography to form the periodic structure 120. Alternatively, the periodic structure 120 may be formed by nanoimprinting. As shown in FIG. 24, the periodic structure 120 may also be formed by partially processing the photoluminescent layer 110. In such a case, the periodic structure 120 is made of the same material as the photoluminescent layer 110.

The light-emitting device 100 illustrated in FIGS. 1A and 1B can be manufactured, for example, by fabricating the light-emitting device 100a illustrated in FIGS. 1C and 1D and then stripping the photoluminescent layer 110 and the periodic structure 120 from the substrate 140.

The structure shown in FIG. 19A can be manufactured, for example, by forming the periodic structure 120a on the transparent substrate 140 by a process such as a semiconductor manufacturing processes or nanoimprinting and then depositing thereon the material for the photoluminescent layer 110 by a process such as evaporation or sputtering. The structure shown in FIG. 19B can be manufactured by filling the recesses in the periodic structure 120a with the photoluminescent layer 110 by a process such as coating.

The above methods of manufacture are for illustrative purposes only, and the light-emitting devices according to the embodiments of the present disclosure may be manufactured by other methods.

EXPERIMENTAL EXAMPLES

Light-emitting devices according to embodiments of the present disclosure are illustrated by the following examples.

A sample light-emitting device having the structure as illustrated in FIG. 19A was prepared and evaluated for its properties. The light-emitting device was prepared as described below.

Figure 25:
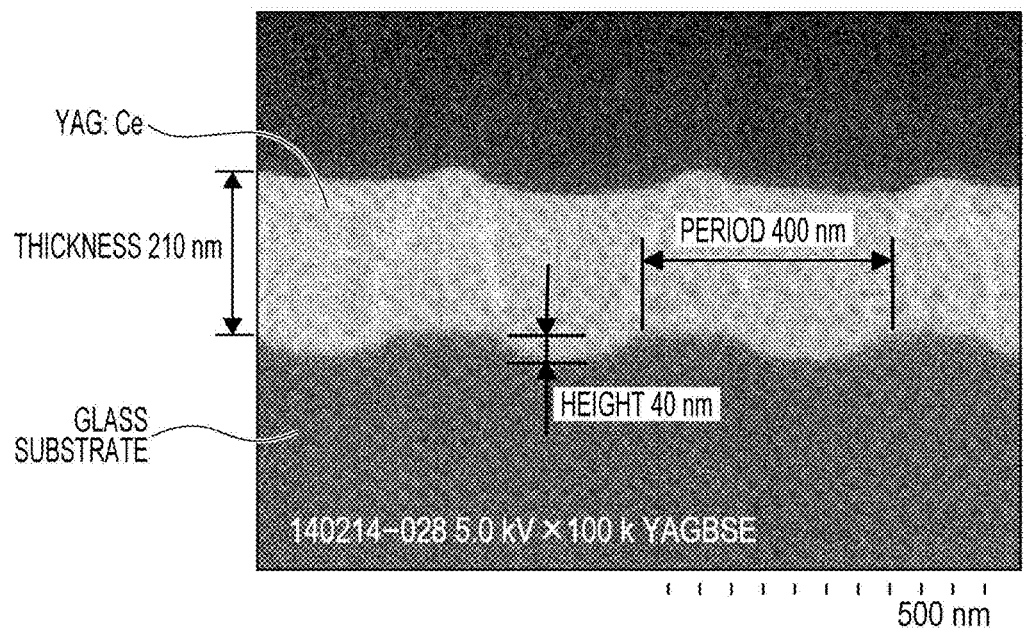
FIG. 25 is a cross-sectional transmission electron microscopy (TEM) image of a photoluminescent layer formed on a glass substrate having a periodic structure.
Figure 26:
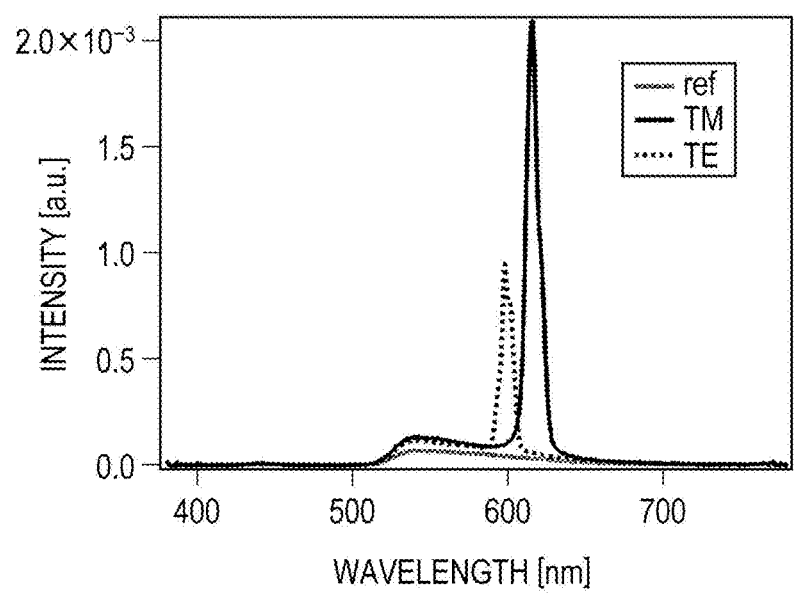
FIG. 26 is a graph showing the results of measurements of the spectrum of light output from a sample light-emitting device in the front direction.

A one-dimensional periodic structure (stripe-shaped projections) having a period of 400 nm and a height of 40 nm was formed on a glass substrate, and a photoluminescent material, that is, YAG:Ce, was deposited thereon to a thickness of 210 nm. FIG. 25 shows a cross-sectional transmission electron microscopy (TEM) image of the resulting light-emitting device. FIG. 26 shows the results of measurements of the spectrum of light emitted from the light-emitting device in the front direction when YAG:Ce was excited with an LED having an emission wavelength of 450 nm. FIG. 26 shows the results (ref) for a light-emitting device including no periodic structure, the results for the TM mode, and the results for the TE mode. The TM mode has a polarization component parallel to the one-dimensional periodic structure. The TE mode has a polarization component perpendicular to the one-dimensional periodic structure. The results show that the intensity of light of a particular wavelength in the case with the periodic structure is significantly higher than without a periodic structure. The results also show that the light enhancement effect is greater for the TM mode, which has a polarization component parallel to the one-dimensional periodic structure.

Figure 27A:
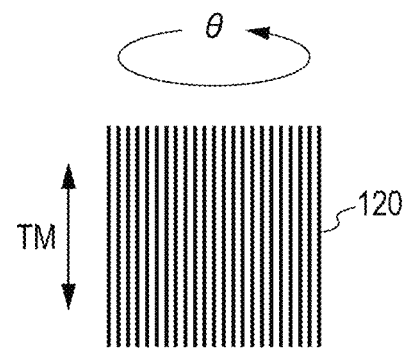
FIG. 27A is a schematic view of a light-emitting device that can emit linearly polarized light of the TM mode, rotated about an axis parallel to the line direction of the one-dimensional periodic structure.
Figure 27B:
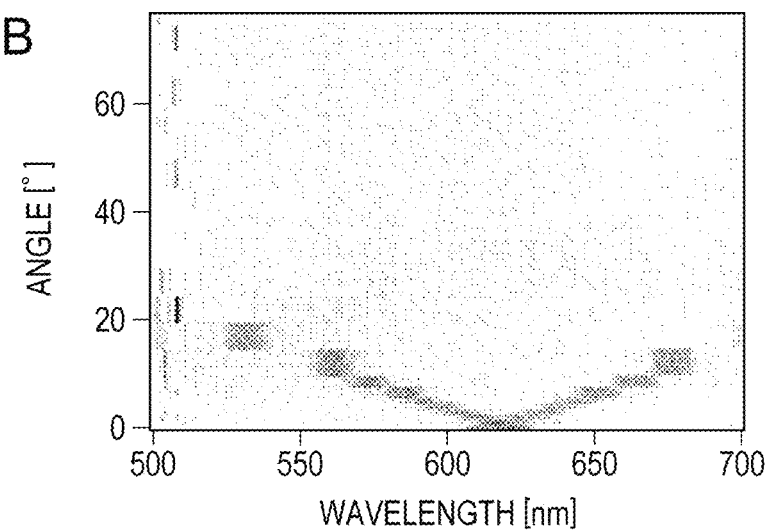
FIG. 27B is a graph showing the results of measurements of the angular dependence of light output from the sample light-emitting device rotated as illustrated in FIG. 27A.
Figure 27C:
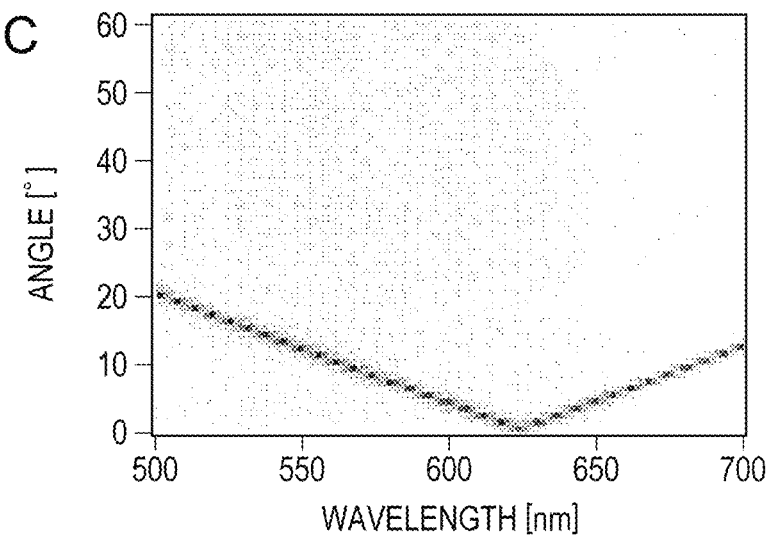
FIG. 27C is a graph showing the results of calculations of the angular dependence of light output from the sample light-emitting device rotated as illustrated in FIG. 27A.
Figure 27D:
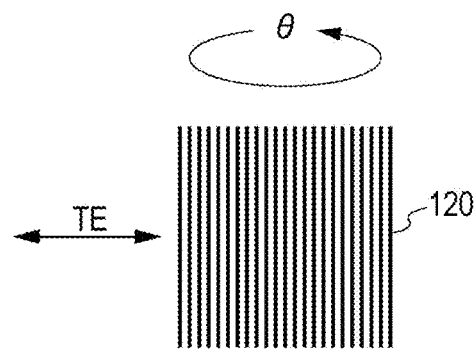
FIG. 27D is a schematic view of a light-emitting device that can emit linearly polarized light of the TE mode, rotated about an axis parallel to the line direction of the one-dimensional periodic structure.
Figure 27E:
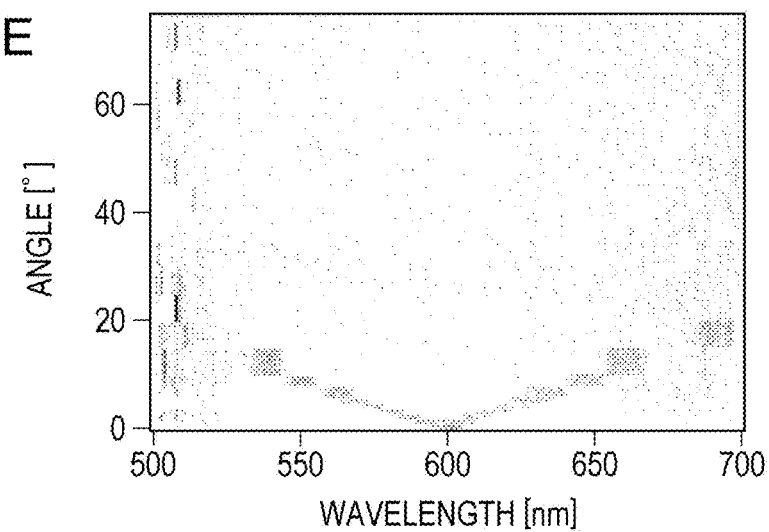
FIG. 27E is a graph showing the results of measurements of the angular dependence of light output from the sample light-emitting device rotated as illustrated in FIG. 27D.
Figure 27F:
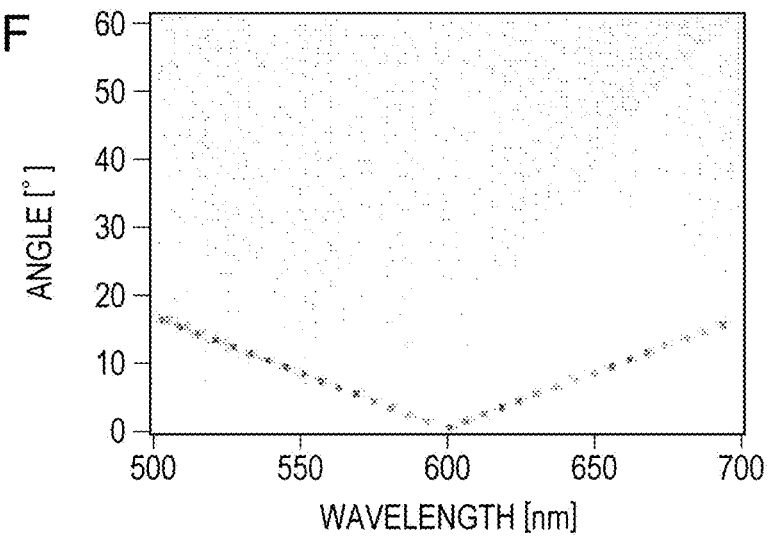
FIG. 27F is a graph showing the results of calculations of the angular dependence of light output from the sample light-emitting device rotated as illustrated in FIG. 27D.
Figure 28A:
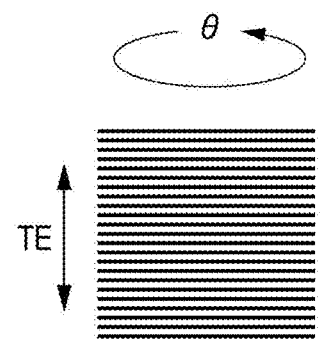
FIG. 28A is a schematic view of a light-emitting device that can emit linearly polarized light of the TE mode, rotated about an axis perpendicular to the line direction of the one-dimensional periodic structure.
Figure 28B:
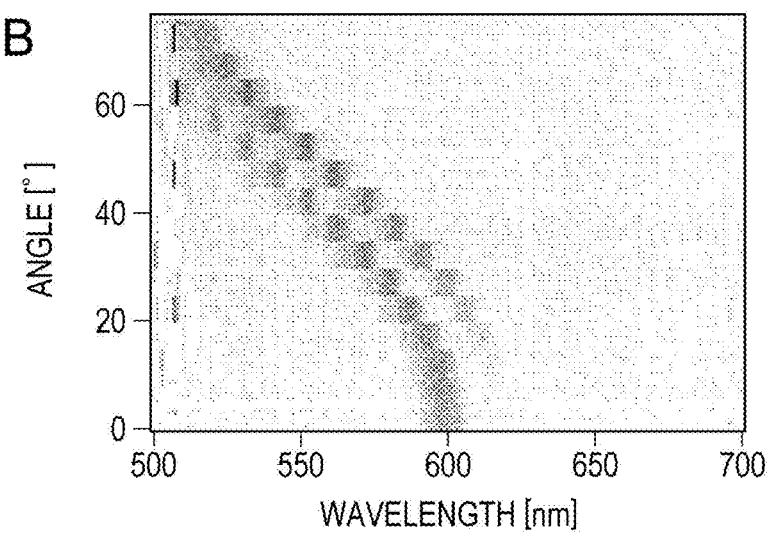
FIG. 28B is a graph showing the results of measurements of the angular dependence of light output from the sample light-emitting device rotated as illustrated in FIG. 28A.
Figure 28C:
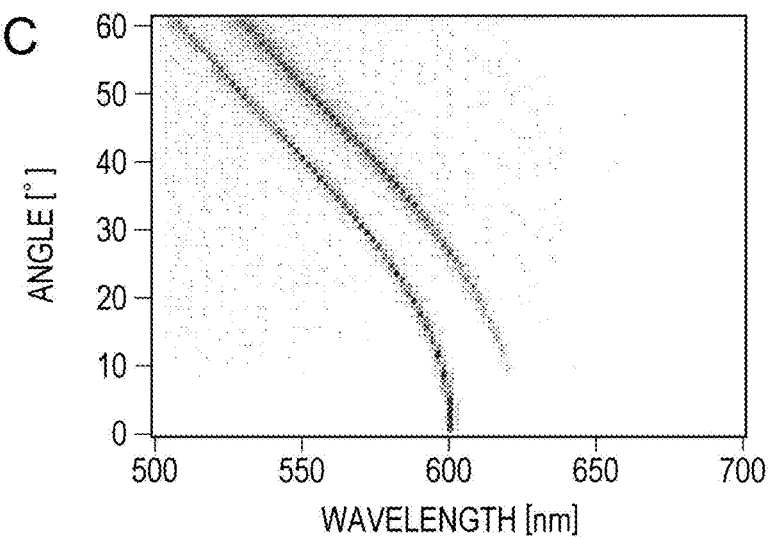
FIG. 28C is a graph showing the results of calculations of the angular dependence of light output from the sample light-emitting device rotated as illustrated in FIG. 28A.
Figure 28D:
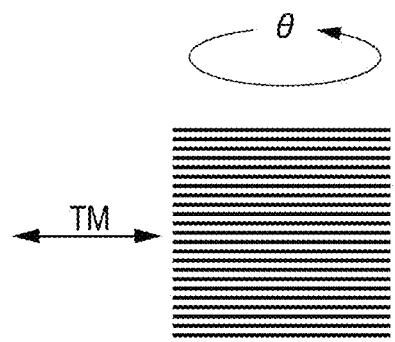
FIG. 28D is a schematic view of a light-emitting device that can emit linearly polarized light of the TM mode, rotated about an axis perpendicular to the line direction of the one-dimensional periodic structure.
Figure 28E:
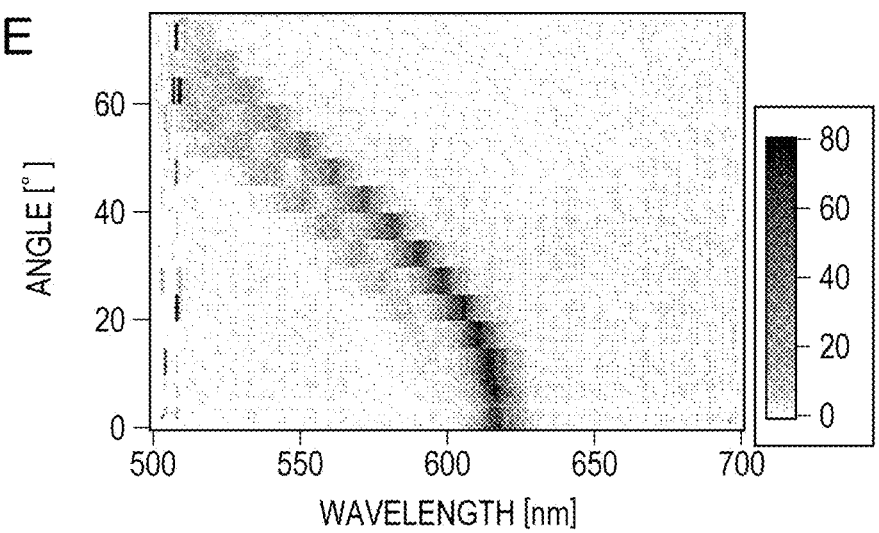
FIG. 28E is a graph showing the results of measurements of the angular dependence of light output from the sample light-emitting device rotated as illustrated in FIG. 28D.
Figure 28F:
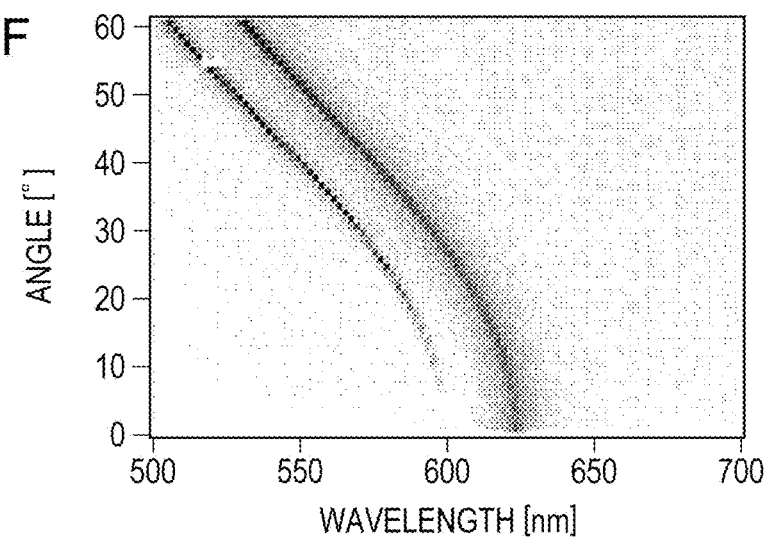
FIG. 28F is a graph showing the results of calculations of the angular dependence of light output from the sample light-emitting device rotated as illustrated in FIG. 28D.

FIGS. 27A to 27F and FIGS. 28A to 28F show the results of measurements and calculations of the angular dependence of the intensity of light output from the same sample. FIGS. 27B and 27E show the results of measurements and FIGS. 27C and 27F show the results of calculations for rotation about an axis parallel to the line direction of the one-dimensional periodic structure (that is, the periodic structure 120). FIGS. 28B and 28E show the results of measurements and FIGS. 28C and 28F show the results of calculations for rotation about an axis perpendicular to the line direction of the one-dimensional periodic structure (that is, the periodic structure 120). FIGS. 27A to 27F and FIGS. 28A to 28F show the results for linearly polarized light in the TM mode and the TE mode. FIG. 27A shows the results for linearly polarized light in the TM mode. FIGS. 27D to 27F show the results for linearly polarized light in the TE mode. FIGS. 28A to 28C show the results for linearly polarized light in the TE mode. FIGS. 28D to 28F show the results for linearly polarized light in the TM mode. As can be seen from FIGS. 27A to 27F and FIGS. 28A to 28F, the enhancement effect is greater for the TM mode, and the enhanced wavelength shifts with angle. For example, light having a wavelength of 610 nm is observed only in the TM mode and in the front direction, indicating that the light is directional and polarized. In addition, the top and bottom parts of each figure match each other. Thus, the validity of the above calculations was experimentally demonstrated.

Figure 29:
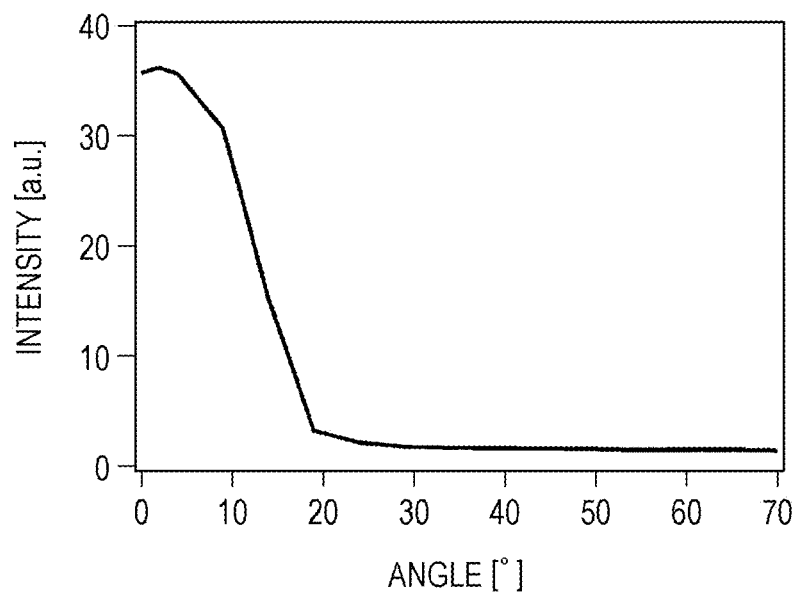
FIG. 29 is a graph showing the results of measurements of the angular dependence of light (wavelength: 610 nm) output from the sample light-emitting device.

Among the above results of measurements, for example, FIG. 29 shows the angular dependence of the intensity of light having a wavelength of 610 nm for rotation about an axis perpendicular to the line direction. As shown in FIG. 29, the light was significantly enhanced in the front direction and was little enhanced at other angles. The directional angle of the light output in the front direction is less than 15 degrees. The directional angle is the angle at which the intensity is 50% of the maximum intensity and is expressed as the angle of one side with respect to the direction with the maximum intensity. This demonstrates that directional light emission was achieved. In addition, all the light was in the TM mode, which demonstrates that polarized light emission was simultaneously achieved.

Although YAG:Ce, which emits light in a wide wavelength range, was used in the above experiment, directional and polarized light emission can also be achieved using a similar structure including a photoluminescent material that emits light in a narrow wavelength range. Such a photoluminescent material does not emit light of other wavelengths and can therefore be used to provide a light source that does not emit light in other directions or in other polarized states.

7. LIGHT-EMITTING APPARATUS INCLUDING LIGHT-EMITTING DEVICE AND EXCITATION LIGHT SOURCE INTEGRALLY FORMED

A light-emitting apparatus according to an embodiment of the present disclosure includes a light-emitting device and an excitation light source. The light-emitting device and the excitation light source are integrally formed. Like components having substantially the same function are denoted by like reference numerals throughout the drawings and may not be further described.

Figure 31A:
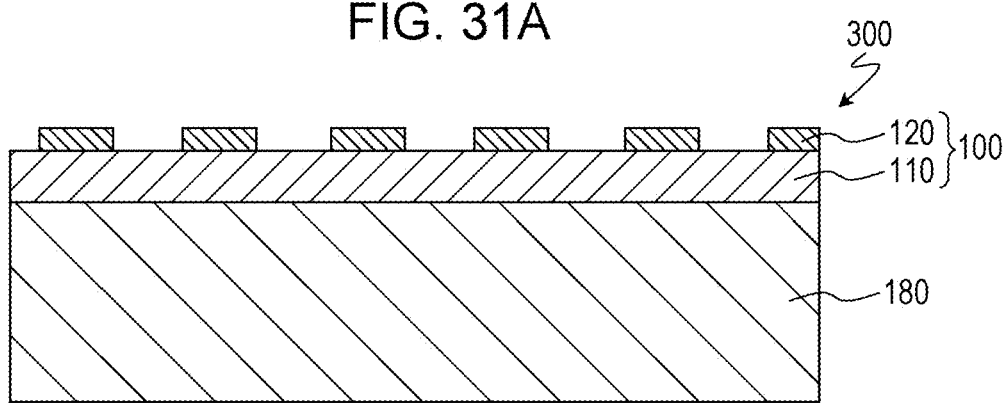
FIG. 31A is a schematic cross-sectional view of a light-emitting apparatus.

A light-emitting apparatus according to an embodiment will be described below with reference to FIG. 31A. FIG. 31A is a schematic cross-sectional view of a light-emitting apparatus 300.

The light-emitting apparatus 300 includes a light-emitting device 100 and an excitation light source 180. The light-emitting device 100 includes a photoluminescent layer 110, a light-transmissive layer 120, and a submicron structure. The light-transmissive layer 120 is located on or near the photoluminescent layer 110. The submicron structure is formed on at least one of the photoluminescent layer 110 and the light-transmissive layer 120 and extends in a plane of the photoluminescent layer 110 or the light-transmissive layer 120. The submicron structure has projections or recesses. The distance between adjacent projections or recesses is denoted by $D_{int}$. Light emitted from the photoluminescent layer 110 includes first light having a wavelength $\lambda_a$ in air. The photoluminescent layer 110 has a refractive index $n_{wav-a}$ for the first light. These satisfy $\lambda_a/n_{wav-a} < D_{int} < \lambda_a$. The excitation light source 180 emits excitation light to be directed into the photoluminescent layer 110. The light-emitting device 100 and the excitation light source 180 are integrally formed. For the sake of simplicity, the excitation light source 180 is denoted by the same reference numeral as the light source 180.

The light-emitting apparatus 300, which includes the light-emitting device 100 and the excitation light source 180 integrally formed, can realize a compact light-emitting apparatus that includes a light-emitting device having high directionality and luminous efficiency and an excitation light source.

As illustrated in FIG. 31A, the excitation light source 180 may be located on the bottom surface of the light-emitting device 100. The light-emitting device 100 may be supported by the excitation light source 180.

Excitation light from the excitation light source 180 typically has a wavelength in an ultraviolet or blue region. Excitation light from the excitation light source 180 may have another wavelength depending on the photoluminescent material of the photoluminescent layer 110. The excitation light source 180 may be a light-emitting diode (LED). The LED may be of a bottom emission type or a top emission type.

Figure 32A:
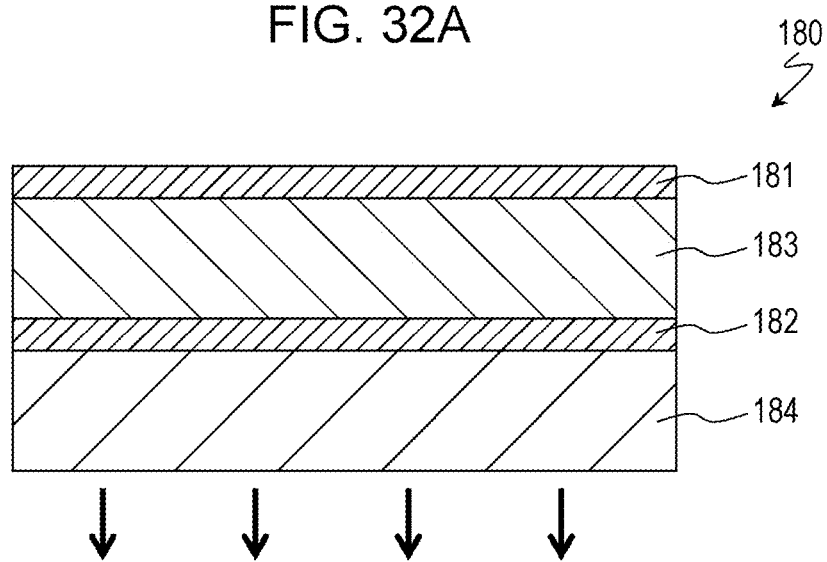
FIG. 32A is a schematic cross-sectional view of the structure of a bottom emission LED.
Figure 32B:
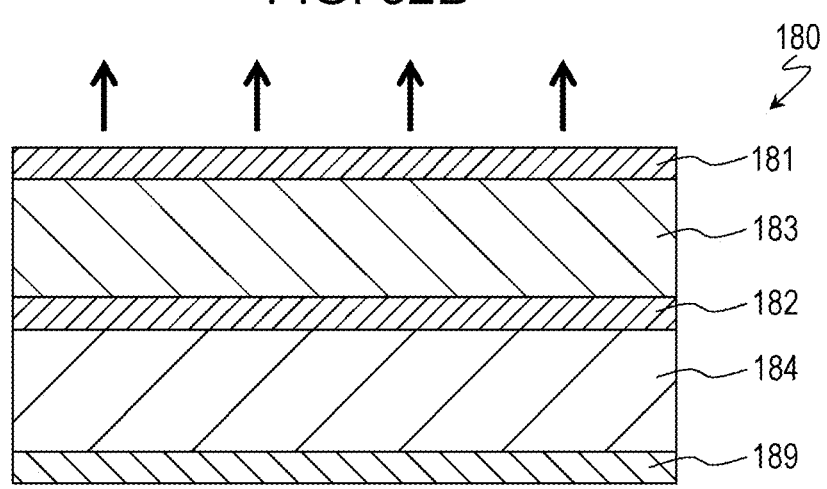
FIG. 32B is a schematic cross-sectional view of the structure of a top emission LED.

The structure of LEDs will be described below with reference to FIGS. 32A and 32B. FIG. 32A is a schematic cross-sectional view of a bottom emission LED. FIG. 32B is a schematic cross-sectional view of a top emission LED. The structure of LEDs is not limited to those illustrated in the figures. The excitation light source 180 may be a known LED. The structure and principle of LEDs are well known and are not described in detail here.

As illustrated in FIG. 32A, the bottom emission LED may include a first electrode 181, a second electrode 182, a semiconductor multilayer structure 183 located between these electrodes, and a substrate 184, which supports these components. If the substrate 184 is formed of a semiconductor, the second electrode 182 may be located on the bottom surface of the substrate 184. The first electrode 181 may reflect light emitted from the semiconductor multilayer structure 183. The first electrode 181 may be formed of a metal having high reflectance. The second electrode 182 and the substrate 184 may transmit light emitted from the semiconductor multilayer structure 183. The second electrode 182 may be formed of a semiconductor doped with an impurity. Light from the semiconductor multilayer structure 183 is emitted from the bottom surface (of the substrate 184) of the LED.

In the case that the excitation light source 180 of the light-emitting apparatus 300 is a bottom emission LED, the light-emitting device 100 may be located on the substrate 184. Thus, the light output side of the excitation light source 180 may be in contact with the light-emitting device 100. The light output side of the excitation light source 180 may be in direct contact with the photoluminescent layer 110 or the light-transmissive layer 120. The light output side of excitation light sources refers to a side from which excitation light is mainly emitted. The light output side is typically perpendicular to the output direction of excitation light. For example, the light-emitting apparatus 300 that includes the light-emitting device 100 supported by the excitation light source 180 can be produced by depositing a photoluminescent material on a substrate of a bottom emission LED.

The direct contact between the light output side of the excitation light source 180 and the photoluminescent layer 110 or the light-transmissive layer 120 can decrease excitation light loss and allows excitation light to be efficiently directed to the photoluminescent layer 110. The excitation light loss refers to light that is not directed to the photoluminescent layer 110, for example, light leaking from the light-emitting apparatus.

In the top emission LED illustrated in FIG. 32B, light from the semiconductor multilayer structure 183 is emitted from the top surface of the LED. The top emission LED differs from the bottom emission LED in the following points. The points of difference are that the first electrode 181 transmits light emitted from the semiconductor multilayer structure 183 and that a reflective film 189 that reflects light emitted from the semiconductor multilayer structure 183 is located on the underside of the semiconductor multilayer structure 183 (opposite the first electrode 181). As illustrated in the figure, the reflective film 189 may be located on the underside of the substrate 184 (opposite the semiconductor multilayer structure 183). The reflective film 189 may be located between the second electrode 182 and the substrate 184. If the second electrode 182 reflects light emitted from the semiconductor multilayer structure 183, the reflective film 189 may be omitted. In the case that the excitation light source 180 is a top emission LED, the light-emitting device 100 may be located on the first electrode 181. The light output side of the excitation light source 180 may be in contact with the light-emitting device 100. The light output side of the excitation light source 180 may be in direct contact with the photoluminescent layer 110 or the light-transmissive layer 120.

In the light-emitting apparatus 300, the refractive index of a layer of the excitation light source 180 in contact with the light-emitting device 100 may be lower than the refractive index of the photoluminescent layer 110. This relationship of the refractive indices holds for first light having a wavelength $\lambda_a$ in air out of light emitted from the photoluminescent layer 110. Thus, the excitation light source 180 probably has a small effect on the quasi-guided mode in the light-emitting device 100. The light-emitting apparatus 300 can realize a compact light-emitting apparatus that includes a light-emitting device and an excitation light source without reducing the directionality and luminous efficiency of the light-emitting device 100. In the case that the excitation light source 180 is a bottom emission LED, a layer of the excitation light source 180 in contact with the light-emitting device 100 may be the substrate 184. The substrate 184 may be formed of sapphire (refractive index: 1.76) or gallium nitride (GaN) (refractive index: 2.4). In the case that the excitation light source 180 is a top emission LED, a layer of the excitation light source 180 in contact with the light-emitting device 100 may be the first electrode 181. The first electrode 181 that transmits light emitted from the semiconductor multilayer structure 183 may be formed of ITO.

The light-emitting apparatus may have another structure. The refractive index of a layer of the excitation light source 180 in contact with the light-emitting device 100 may be higher than the refractive index of the photoluminescent layer 110. For example, as described later with reference to FIGS. 33A to 33C, the light-emitting device may include a low-refractive-index layer between the photoluminescent layer and the excitation light source and between the light-transmissive layer and the excitation light source.

Figure 31B:
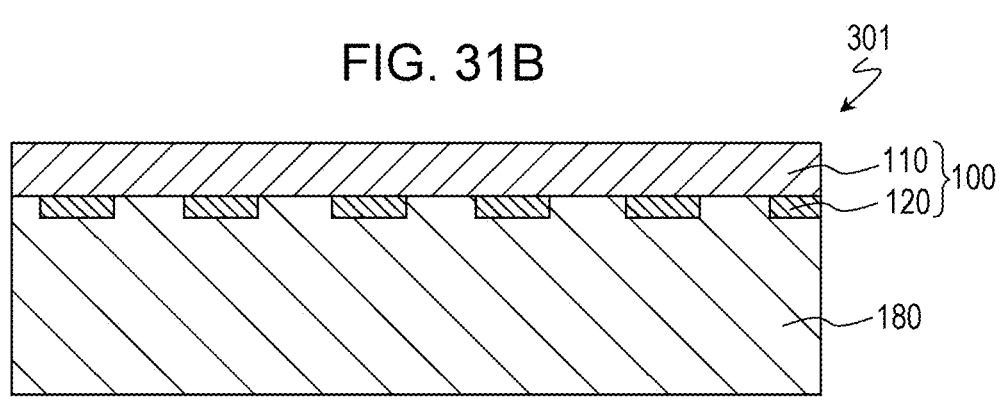
FIG. 31B is a schematic cross-sectional view of a light-emitting apparatus.
Figure 31C:
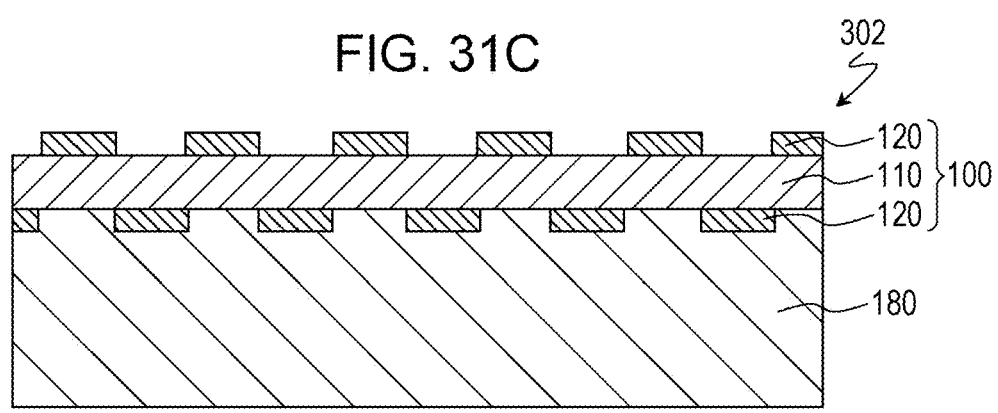
FIG. 31C is a schematic cross-sectional view of a light-emitting apparatus.

A light-emitting apparatus 301 and a light-emitting apparatus 302 according to other embodiments will be described below with reference to FIGS. 31B and 31C. FIG. 31B is a schematic cross-sectional view of the light-emitting apparatus 301. FIG. 31C is a schematic cross-sectional view of the light-emitting apparatus 302. The light-emitting apparatus 301 and the light-emitting apparatus 302 are different from the light-emitting apparatus 300 in the structure of the light-emitting device 100. The light-emitting apparatus 301 and the light-emitting apparatus 302 may be the same as the light-emitting apparatus 300 except the structure of the light-emitting device 100.

In the light-emitting apparatus 300 illustrated in FIG. 31A, the light-transmissive layer 120 is supported by the photoluminescent layer 110. The light-emitting device 100 may have another structure. For example, as in the light-emitting device 100 of the light-emitting apparatus 301 illustrated in FIG. 31B, the photoluminescent layer 110 may be located on the light-transmissive layer 120. For example, as in the light-emitting device 100 of the light-emitting apparatus 302 illustrated in FIG. 31C, the light-transmissive layer 120 may be located on the top and bottom surfaces of the photoluminescent layer 110. Not limited to the embodiments illustrated in the figures, the light-emitting device 100 may be any of the light-emitting devices according to the embodiments of the present disclosure. The light-emitting device 100 may be a combination of two or more of the light-emitting devices according to the embodiments of the present disclosure.

The excitation light source 180 in the light-emitting apparatus 301 and the light-emitting apparatus 302 may be a bottom emission LED. In the light-emitting apparatus 301 and the light-emitting apparatus 302, the refractive index of a layer of the excitation light source 180 in contact with the light-emitting device 100 may be lower than the refractive indices of the photoluminescent layer 110 and the light-transmissive layer 120.

In the production of the light-emitting apparatus 301 and the light-emitting apparatus 302, for example, a bottom emission LED is prepared, and a predetermined texture (pattern) depending on the submicron structure is formed on the substrate of the LED. The texture may be formed by a known semiconductor manufacturing processes. A material for the light-transmissive layer 120 and a material for the photoluminescent layer 110 are then successively deposited on the substrate of the LED to produce the light-emitting apparatus 301 and the light-emitting apparatus 302.

The light-emitting device 100 of the light-emitting apparatus 302 have a plurality of submicron structures. The submicron structures may include periodic structures formed of projections or recesses. The periodic structures may include a periodic structure having a period $p_{ex}$ that satisfies $\lambda_{ex}/n_{wav-ex} < p_{ex} < \lambda_{ex}$. $\lambda_{ex}$ denotes the wavelength of excitation light in air emitted from the excitation light source 180. $n_{wav-ex}$ denotes the refractive index of the photoluminescent layer 110 for excitation light.

Figure 33A:
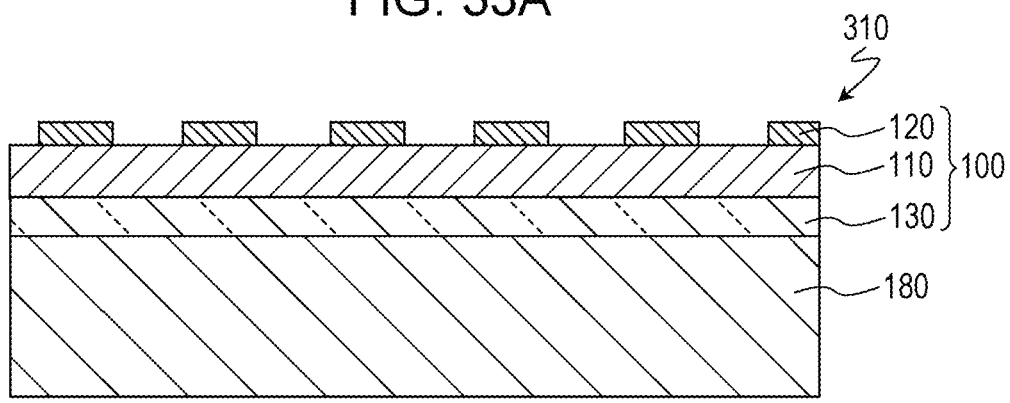
FIG. 33A is a schematic cross-sectional view of a light-emitting apparatus.

A light-emitting apparatus according to still another embodiment will be described below with reference to FIG. 33A. FIG. 33A is a schematic cross-sectional view of a light-emitting apparatus 310.

The light-emitting device 100 of the light-emitting apparatus 310 is different from the light-emitting device 100 of the light-emitting apparatus 300 in that the light-emitting device 100 of the light-emitting apparatus 310 further includes a low-refractive-index layer 130 between the photoluminescent layer 110 and the excitation light source 180 and between the light-transmissive layer 120 and the excitation light source 180. The low-refractive-index layer 130 has a lower refractive index than the photoluminescent layer 110. The light-emitting apparatus 310 may be the same as the light-emitting apparatus 300 except the low-refractive-index layer 130.

The light-emitting apparatus 310, which includes the light-emitting device 100 and the excitation light source 180 integrally formed, can realize a compact light-emitting apparatus that includes a light-emitting device having high directionality and luminous efficiency and an excitation light source.

The low-refractive-index layer 130 has a lower refractive index for the first light than the photoluminescent layer 110. Thus, the excitation light source 180 probably has a small effect on the quasi-guided mode in the light-emitting device 100. The light-emitting apparatus 310 can realize a compact light-emitting apparatus that includes a light-emitting device and an excitation light source without reducing the directionality and luminous efficiency of the light-emitting device 100. In the light-emitting apparatus 310 including the low-refractive-index layer 130, the refractive index of a layer of the excitation light source 180 in contact with the light-emitting device 100 may be higher than the refractive index of the photoluminescent layer 110. As a matter of course, the refractive index of a layer of the excitation light source 180 in contact with the light-emitting device 100 may be lower than the refractive index of the photoluminescent layer 110. In the light-emitting apparatus 310 including the low-refractive-index layer 130, the material of a layer of the excitation light source 180 in contact with the light-emitting device 100 can be selected from a larger number of materials. The low-refractive-index layer 130 may be formed of silicon dioxide ($SiO_2$), $MgF_2$, $CaF_2$, $BaF_2$, $SrF_2$, or room-temperature curing glass (HSQ·SOG). It is desirable that the lowrefractive-index layer 130 have a thickness greater than the wavelength $\lambda_a$ of the first light in air, for example. The thickness of the low-refractive-index layer 130 is a thickness in the direction normal to the photoluminescent layer 110.

In the light-emitting apparatus 310, the light output side of the excitation light source 180 may be in direct contact with the low-refractive-index layer 130. If the light output side of the excitation light source 180 is in direct contact with the low-refractive-index layer 130, excitation light can efficiently reach the low-refractive-index layer 130. This can improve the introduction efficiency of excitation light into the photoluminescent layer 110.

The method for producing the light-emitting apparatus 310 may be the same as the method for producing the light-emitting apparatus 300 except the formation of the low-refractive-index layer 130. The low-refractive-index layer 130 is formed by depositing a material for the low-refractive-index layer 130 on the excitation light source 180.

Figure 33B:
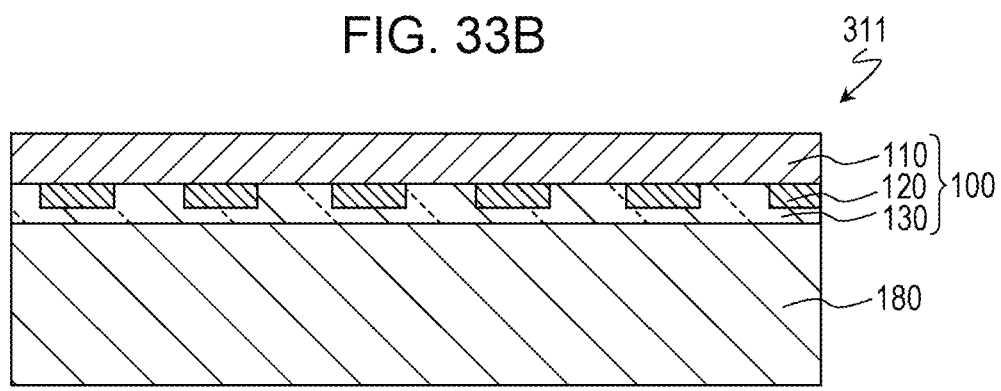
FIG. 33B is a schematic cross-sectional view of a light-emitting apparatus.
Figure 33C:
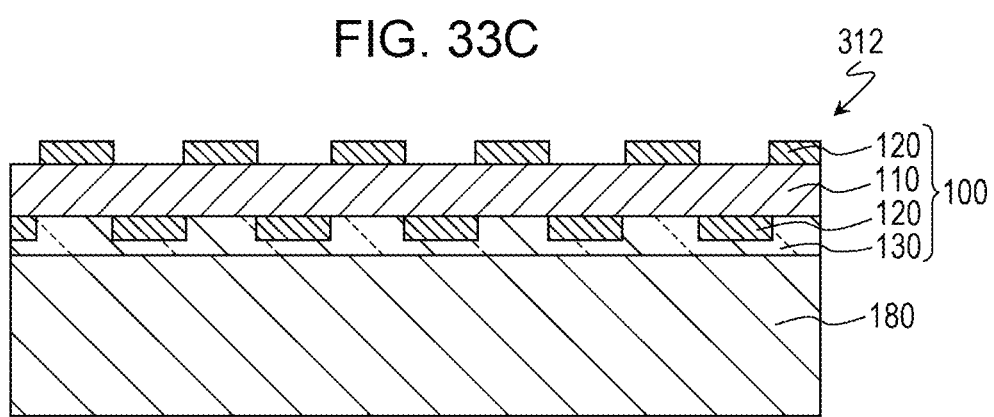
FIG. 33C is a schematic cross-sectional view of a light-emitting apparatus.

A light-emitting apparatus 311 and a light-emitting apparatus 312 according to still other embodiments will be described below with reference to FIGS. 33B and 33C. FIG. 33B is a schematic cross-sectional view of the light-emitting apparatus 311. FIG. 33C is a schematic cross-sectional view of the light-emitting apparatus 312. The light-emitting apparatus 311 and the light-emitting apparatus 312 are different from the light-emitting apparatus 310 in the structure of the light-emitting device 100. The light-emitting apparatus 311 and the light-emitting apparatus 312 may be the same as the light-emitting apparatus 310 except the structure of the light-emitting device 100. The light-emitting apparatus 311 is different from the light-emitting apparatus 301 in that the light-emitting apparatus 311 further includes the low-refractive-index layer 130. The light-emitting apparatus 311 may be the same as the light-emitting apparatus 301 except the low-refractive-index layer 130. The light-emitting apparatus 312 is different from the light-emitting apparatus 302 in that the light-emitting apparatus 312 further includes the low-refractive-index layer 130. The light-emitting apparatus 312 may be the same as the light-emitting apparatus 302 except the low-refractive-index layer 130.

In the light-emitting apparatus 311 and the light-emitting apparatus 312, the low-refractive-index layer 130 has a greater thickness than the light-transmissive layer 120. It is desirable that the low-refractive-index layer 130 have a thickness greater than the sum of the thickness of the light-transmissive layer 120 and the wavelength $\lambda_a$ of the first light in air, for example. This is because if the distance between the light-transmissive layer 120 and the excitation light source 180 is shorter than the wavelength $\lambda_a$ of the first light in air, evanescent light between the light-emitting device 100 and the excitation light source 180 may leak into the excitation light source 180. The thicknesses of the low-refractive-index layer 130 and the light-transmissive layer 120 are thicknesses in the direction normal to the photoluminescent layer 110. In the embodiments illustrated in the figures, the thickness of the low-refractive-index layer 130 refers to the length from the interface between the low-refractive-index layer 130 and the excitation light source 180 to the interface between the low-refractive-index layer 130 and the photoluminescent layer 110 in the direction normal to the photoluminescent layer 110.

In the production process of the light-emitting apparatus 311 and the light-emitting apparatus 312, a material for the low-refractive-index layer 130 is deposited on the excitation light source 180 to form a film, and the low-refractive-index layer 130 is then patterned. The patterning may be performed by a known semiconductor manufacturing processes. The patterning forms the light-transmissive layer 120 (and the submicron structure) under the photoluminescent layer 110.

The excitation light source 180 in the light-emitting apparatus 311 and the light-emitting apparatus 312 may be a bottom emission LED. The excitation light source 180 in the light-emitting apparatus 311 and the light-emitting apparatus 312 may be a top emission LED.

Figure 34A:
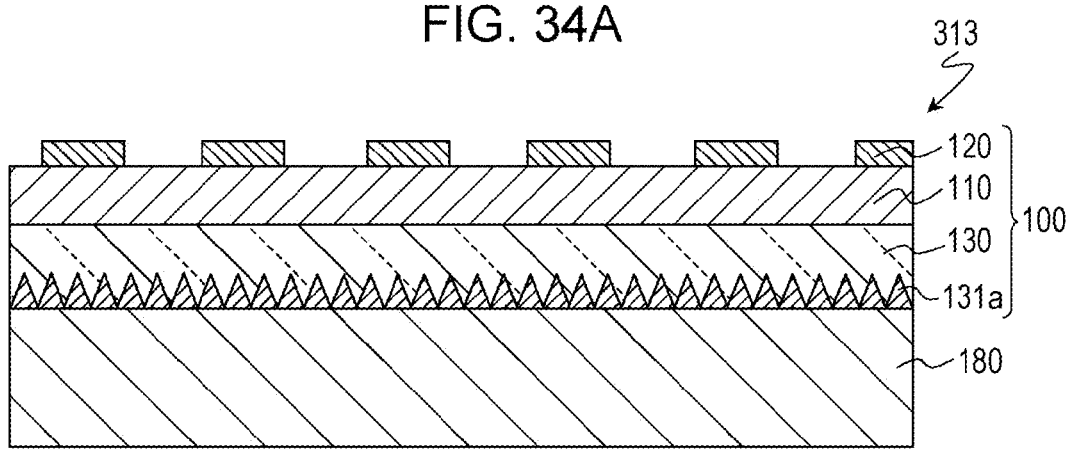
FIG. 34A is a schematic cross-sectional view of a light-emitting apparatus.

A light-emitting apparatus 313 according to still another embodiment will be described below with reference to FIG. 34A. FIG. 34A is a schematic cross-sectional view of the light-emitting apparatus 313.

The low-refractive-index layer 130 of the light-emitting apparatus 313 has second projections 131a adjacent to the excitation light source 180 and is different from the low-refractive-index layer 130 of the light-emitting apparatus 310 in this point. The distance between adjacent second projections 131a may be shorter or longer than $D_{int}$. The light-emitting apparatus 313 may be the same as the light-emitting apparatus 310 except the second projections 131a.

The light-emitting apparatus 313, which includes the light-emitting device 100 and the excitation light source 180 integrally formed, can realize a compact light-emitting apparatus that includes a light-emitting device having high directionality and luminous efficiency and an excitation light source.

The second projections 131a can reduce the reflection of excitation light at the interface between the excitation light source 180 and the low-refractive-index layer 130. In the light-emitting apparatus 313 including the second projections 131a, excitation light from the excitation light source 180 is efficiently directed to the photoluminescent layer 110 through the low-refractive-index layer 130. The reflection of excitation light at the interface includes reflection of excitation light at the interface and total reflection of excitation light at the interface. The second projections 131a reduce reflection loss and/or total reflection loss and allow excitation light to be efficiently directed to the photoluminescent layer 110.

If the distance between adjacent second projections 131a is shorter than $D_{int}$, the second projections 131a may constitute a moth-eye structure. A layer of the excitation light source 180 in contact with the light-emitting device 100 may have a refractive index higher than the refractive index of the low-refractive-index layer 130. The second projections 131a may be formed of the material of a layer of the excitation light source 180 in contact with the light-emitting device 100. The second projections 131a continuously change the effective refractive index for excitation light emitted from the excitation light source 180 in the direction normal to the photoluminescent layer 110 from the refractive index of the excitation light source 180 to the refractive index of the low-refractive-index layer 130. This allows excitation light emitted from the excitation light source 180 to be efficiently directed to the photoluminescent layer 110. The light-emitting device of the light-emitting apparatus 313 has further improved directionality and luminous efficiency.

If the second projections 131a are formed of a material different from the material of a layer of the excitation light source 180 in contact with the light-emitting device 100, the second projections 131a may be formed of a material having a higher refractive index than the low-refractive-index layer 130.

The second projections 131a may be generally conical or generally pyramidal. The second projections 131a may be a cone or pyramid with a rounded top (apex). The second projections 131a may be truncated conical or truncated pyramidal. The second projections 131*a* may be generally hemispherical. The second projections 131*a* may be generally cylindrical or generally prismatic. The second projections 131*a* may be arranged at regular or irregular intervals.

The second projections 131*a* are not limited to the moth-eye structure. The distance between adjacent second projections 131*a* may be longer than $D_{int}$. The second projections 131*a* may have a periodic texture. The second projections 131*a* may constitute a diffraction grating. The second projections 131*a* may be arranged at irregular intervals. The shape, height, size, and period of the second projections 131*a* may be appropriately designed to cause diffraction and/or scattering of excitation light. The second projections 131*a* can effectively reduce total reflection at the interface between the excitation light source 180 and the low-refractive-index layer 130. The second projections 131*a* can cause diffraction and/or scattering of excitation light and allows excitation light emitted from the excitation light source 180 to be efficiently directed to the photoluminescent layer 110 through the low-refractive-index layer 130.

The low-refractive-index layer 130 has a thickness greater than the height of the second projections 131*a*. The second projections 131*a* may have a height in the range of 50 nm to 50 μm. It is desirable that the low-refractive-index layer 130 have a thickness greater than the sum of the height of the second projections 131*a* and the wavelength $\lambda_a$ of the first light in air, for example. The thickness of the low-refractive-index layer 130 and the height of the second projections 131*a* are lengths in the direction normal to the photoluminescent layer 110.

The second projections 131*a* may be arranged at regular intervals. The second projections 131*a* may have a period (pitch) in the range of 200 nm to 50 μm. The period of the second projections 131*a* refers to the distance between adjacent second projections 131*a* in a plane parallel to the photoluminescent layer 110. The size of the second projections 131*a* may be the same as the period of the second projections 131*a*. The size of the second projections 131*a* may be smaller than the period of the second projections 131*a*. The size of the second projections 131*a* is the size of the second projections 131*a* in a plane parallel to the photoluminescent layer 110 (for example, the diameter of the second projections 131*a* having a generally circular bottom, or the length of a side of the second projections 131*a* having a rectangular bottom).

The light-emitting apparatus 313 can be produced as described below. First, the second projections 131*a* are formed on the excitation light source 180, for example, by a semiconductor manufacturing processes or a transfer process (such as nanoimprinting). After the second projections 131*a* are formed, a material for the low-refractive-index layer 130, a material for the photoluminescent layer 110, and a material for the light-transmissive layer 120 are successively deposited on the excitation light source 180. The material for the light-transmissive layer 120 is then patterned to form the submicron structure.

Figure 34B:
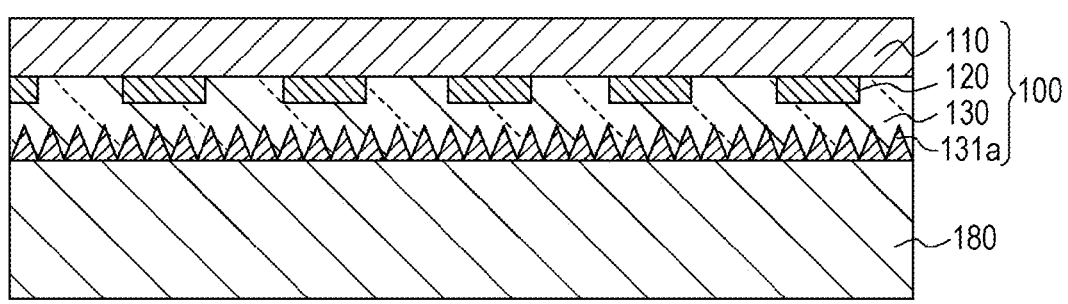
FIG. 34B is a schematic cross-sectional view of a light-emitting apparatus.
Figure 34C:
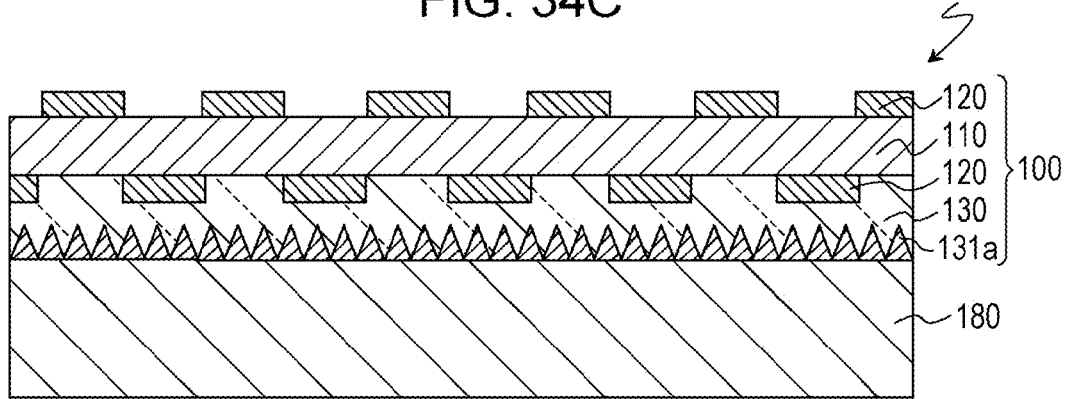
FIG. 34C is a schematic cross-sectional view of a light-emitting apparatus.

A light-emitting apparatus 314 and a light-emitting apparatus 315 according to still other embodiments will be described below with reference to FIGS. 34B and 34C. FIG. 34B is a schematic cross-sectional view of the light-emitting apparatus 314. FIG. 34C is a schematic cross-sectional view of the light-emitting apparatus 315. The light-emitting apparatus 314 and the light-emitting apparatus 315 are different from the light-emitting apparatus 313 in the structure of the light-emitting device 100. The light-emitting apparatus 314 and the light-emitting apparatus 315 may be the same as the light-emitting apparatus 313 except the structure of the light-emitting device 100. The light-emitting apparatus 314 is different from the light-emitting apparatus 311 in that the light-emitting apparatus 314 further includes the second projections 131*a*. The light-emitting apparatus 314 may be the same as the light-emitting apparatus 311 except the second projections 131*a*. The light-emitting apparatus 315 is different from the light-emitting apparatus 312 in that the light-emitting apparatus 315 further includes the second projections 131*a*. The light-emitting apparatus 315 may be the same as the light-emitting apparatus 312 except the second projections 131*a*.

In the light-emitting apparatus 314 and the light-emitting apparatus 315, the low-refractive-index layer 130 has a thickness greater than the sum of the height of the second projections 131*a* and the thickness of the light-transmissive layer 120. The second projections 131*a* may have a height in the range of 50 nm to 50 μm. It is desirable that the low-refractive-index layer 130 have a thickness greater than the sum of the height of the second projections 131*a* and the wavelength $\lambda_a$ of the first light in air, for example. The thickness of the low-refractive-index layer 130, the thickness of the light-transmissive layer 120, and the height of the second projections 131*a* are lengths in the direction normal to the photoluminescent layer 110. In the embodiments illustrated in the figures, the thickness of the low-refractive-index layer 130 refers to the length from the bottom of the second projections 131*a* to the interface between the low-refractive-index layer 130 and the photoluminescent layer 110 in the direction normal to the photoluminescent layer 110.

Figure 35:
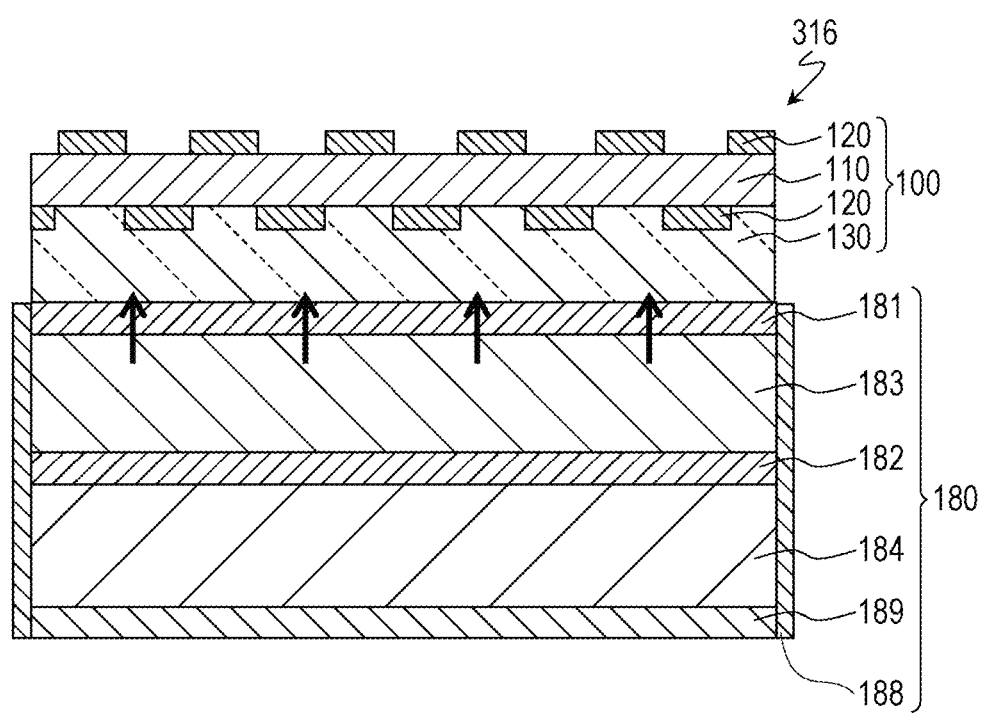
FIG. 35 is a schematic cross-sectional view of a light-emitting apparatus.

FIG. 35 is a schematic cross-sectional view of a light-emitting apparatus 316 according to still another embodiment. As illustrated in FIG. 35, the excitation light source 180 may have a reflective film 188 on its side surfaces. Leakage of excitation light from a side surface of the excitation light source 180 may cause excitation light loss (light not directed to the photoluminescent layer 110). The reflective film 188 on the side surfaces can efficiently direct excitation light to the photoluminescent layer 110. The side surfaces of the excitation light source 180 may be surfaces perpendicular to the light output side. The reflective film 188 may be formed of a dielectric multilayer film or a metal. The reflective film 188 may also be formed of $TiO_2$ or $BaSO_4$.

Although the excitation light source 180 is an LED in these embodiments, the excitation light source 180 may be another device. The excitation light source 180 of the light-emitting apparatuses according to these embodiments may be a laser. In general, laser beams are superior in monochromaticity to LED light and can therefore improve the introduction efficiency of excitation light into the photoluminescent layer 110.

Figure 36A:
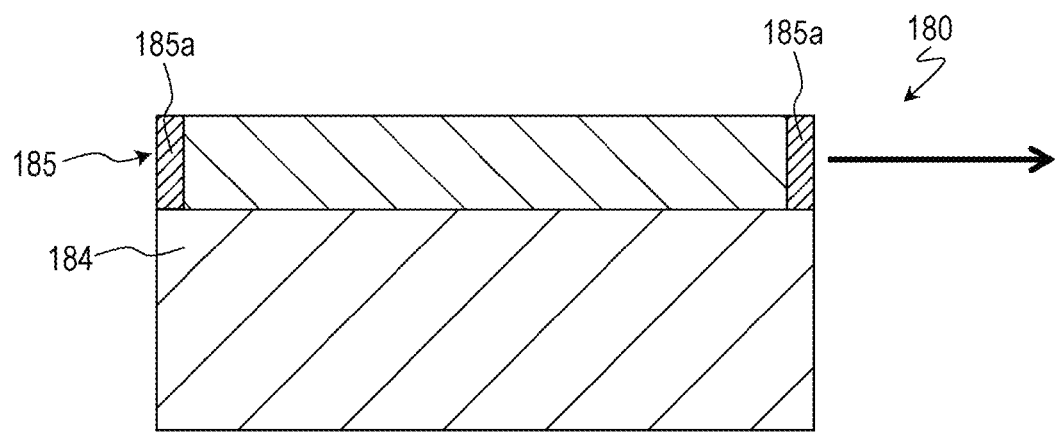
FIG. 36A is an explanatory schematic view of the structure of an edge-emitting laser.
Figure 36B:
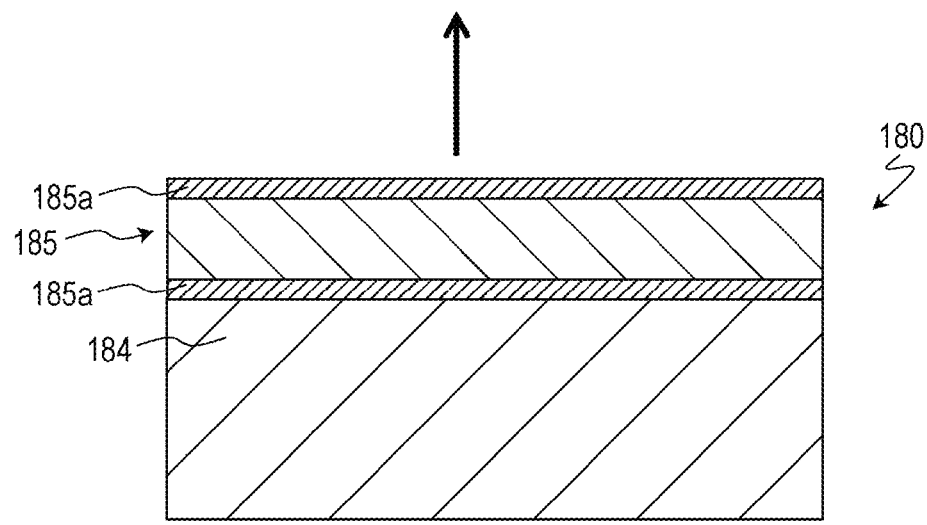
FIG. 36B is an explanatory schematic view of the structure of a surface-emitting laser.

The structure of a laser that can be used as the excitation light source 180 will be described below with reference to FIGS. 36A and 36B. FIG. 36A is an explanatory schematic view of the structure of an edge-emitting laser, and FIG. 36B is an explanatory schematic view of the structure of a surface-emitting laser. The structure of the laser is not limited to those illustrated in the figures. The excitation light source 180 may be a known laser. The structure and principle of lasers are well known and are not described in detail here.

As illustrated in FIG. 36A, for example, the edge-emitting laser includes a resonator 185 on the substrate 184. The resonator 185 may include a reflector 185*a* at each end thereof in a plane parallel to the substrate 184. A cleavage end surface of the substrate 184 may function as a reflector and constitute the resonator 185. In the edge-emitting laser, a laser beam is emitted in a direction parallel to the substrate 184. As illustrated in FIG. 36B, the surface-emitting laser may be used as the excitation light source 180. In the surface-emitting laser, a reflector 185*a* of a resonator 185 may be parallel to the substrate 184. The laser beam is emitted in a direction perpendicular to the substrate 184.

In a light-emitting apparatus including a laser as the excitation light source 180, the light output side of the excitation light source 180 may be in contact with the light-emitting device 100. The light output side of the excitation light source 180 may be in direct contact with the photoluminescent layer 110 or the light-transmissive layer 120. The excitation light source 180 may be a semiconductor laser. In semiconductor lasers, laser oscillation occurs by the application of a voltage to a pn junction. For example, a semiconductor laser containing a gallium nitride semiconductor material may be used.

Figure 37A:
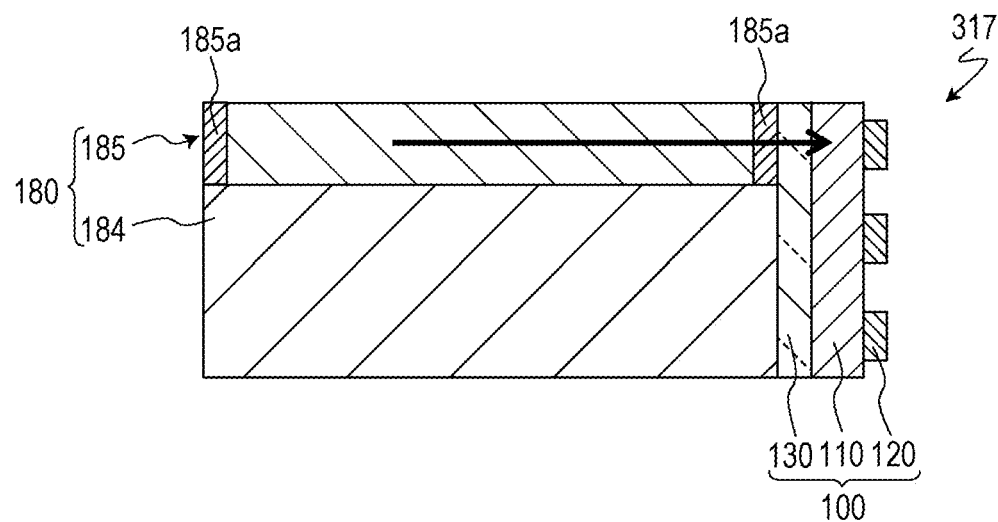
FIG. 37A is a schematic cross-sectional view of a light-emitting apparatus.
Figure 37B:
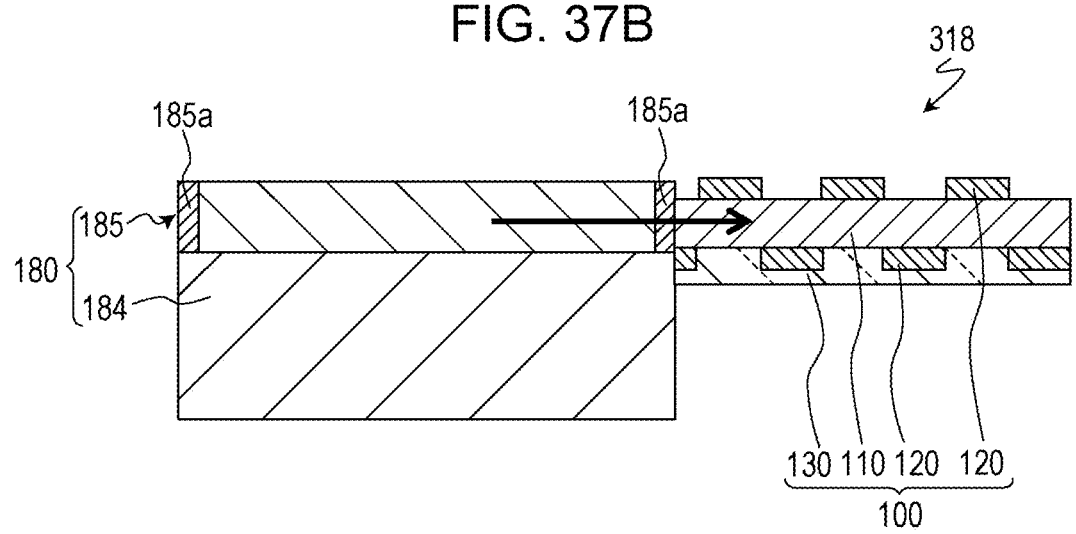
FIG. 37B is a schematic cross-sectional view of a light-emitting apparatus.

FIGS. 37A and 37B are schematic cross-sectional views of a light-emitting apparatus 317 and a light-emitting apparatus 318, respectively, each including an edge-emitting laser as the excitation light source 180. As illustrated in FIG. 37A, the photoluminescent layer 110 may be perpendicular to the direction of excitation light emitted from the excitation light source 180. As illustrated in FIG. 37B, the photoluminescent layer 110 may be parallel to the direction of excitation light emitted from the excitation light source 180.

Figure 38:
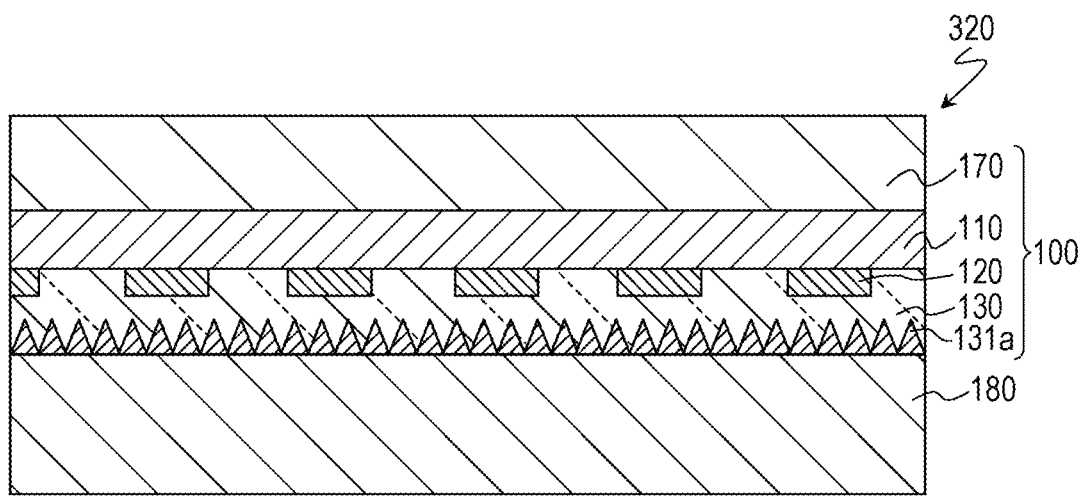
FIG. 38 is a schematic cross-sectional view of a light-emitting apparatus.

The light-emitting apparatuses according to the embodiments may further include a selective reflective layer 170 on the top surface of the photoluminescent layer 110. A light-emitting apparatus 320 will be described below with reference to FIG. 38. FIG. 38 is a schematic cross-sectional view of the light-emitting apparatus 320.

The light-emitting device 100 in the light-emitting apparatus 320 further includes the selective reflective layer 170 on the top surface of the photoluminescent layer 110. In the embodiment illustrated in FIG. 38, the light-emitting apparatus 320 is the same as the light-emitting apparatus 314 except the selective reflective layer 170. The light-emitting apparatus 320 is not limited to this. Except for further including the selective reflective layer 170, the light-emitting apparatus 320 may be any of the light-emitting apparatuses according to the embodiments of the present disclosure or a combination of two or more of the light-emitting apparatuses. Except for further including the selective reflective layer 170, the light-emitting device 100 in the light-emitting apparatus 320 may be any of the light-emitting devices according to the embodiments of the present disclosure or a combination of two or more of the light-emitting devices.

The light-emitting apparatus 320, which includes the light-emitting device 100 and the excitation light source 180 integrally formed, can realize a compact light-emitting apparatus that includes a light-emitting device having high directionality and luminous efficiency and an excitation light source.

The selective reflective layer 170 is an optical filter that can transmit and reflect only light in a particular wavelength region. For example, excitation light emitted from the excitation light source 180 and passing through the photoluminescent layer 110 is reflected from the selective reflective layer 170. This can improve the introduction efficiency of excitation light into the photoluminescent layer 110. The light-emitting device of the light-emitting apparatus 320 can achieve high directionality and luminous efficiency. The selective reflective layer 170 may be configured to transmit light emitted from the photoluminescent layer 110 rather than reflecting the light. This can further improve the directionality and luminous efficiency of the light-emitting device of the light-emitting apparatus 320. The wavelength of light emitted from the light-emitting apparatus 320 can be selected by the selective reflective layer 170. Light from the light-emitting apparatus 320 can have high monochromaticity.

The selective reflective layer 170 is not limited to the embodiments described above and may be configured in any way. For example, the selective reflective layer 170 may be configured to transmit both excitation light passing through the photoluminescent layer 110 and light emitted from the photoluminescent layer 110. The selective reflective layer 170 may be configured such that both excitation light passing through the photoluminescent layer 110 and light emitted from the photoluminescent layer 110 are emitted in the direction normal to the photoluminescent layer 110. In such a case, light beams emitted from the light-emitting apparatus 320 are (directional) light beams emitted in the direction normal to the photoluminescent layer 110 and may have different wavelengths. Thus, the light-emitting apparatus 320 can emit polychromatic light and white light.

The selective reflective layer 170 may have a dielectric multilayer film structure. As is well known, a dielectric multilayer film is formed by alternately stacking dielectric materials having different refractive indices on top of one another. The material (for example, the refractive index) and thickness of each dielectric film depend on the reflectivity and/or optical transparency of the selective reflective layer 170. The selective reflective layer 170 may be a band-pass filter or a dichroic mirror.

Light-emitting devices according to the present disclosure can be used to provide directional light-emitting apparatuses and can be applied to optical devices, such as lighting fixtures, displays, and projectors.

What is claimed is:

1. A light-emitting apparatus comprising a light-emitting device and an excitation light source, wherein the excitation light source is integrally provided with the light-emitting device and emits excitation light, and the light-emitting device includes:

a photoluminescent layer having a first surface perpendicular to a thickness direction thereof, an area of the first surface being larger than a sectional area of the photoluminescent layer perpendicular to the first surface; and a light-transmissive layer located on the photoluminescent layer, wherein at least one of the photoluminescent layer and the light-transmissive layer has a submicron structure having at least projections or recesses arranged perpendicular to the thickness direction of the photoluminescent layer, the photoluminescent layer receives the excitation light and emits light including first light having a wavelength $\lambda_a$ in air, at least one of the photoluminescent layer and the light-transmissive layer has a light emitting surface perpendicular to the thickness direction of the photoluminescent layer, the first light being emitted from the light emitting surface, a distance $D_{int}$ between adjacent projections or recesses and a refractive index $n_{wav-a}$ of the photoluminescent layer for the first light satisfy $\lambda_a/n_{wav-a} < D_{int} < \lambda_a$, and a thickness of the photoluminescent layer, the refractive index $n_{wav-a}$, and the distance $D_{int}$ are set to limit a directional angle of the first light emitted from the light emitting surface.

2. The light-emitting apparatus according to claim 1, wherein the submicron structure includes at least one periodic structure comprising the projections or recesses, and the at least one periodic structure includes a first periodic structure having a period $p_a$ that satisfies $\lambda_a/n_{wav-a} < p_a < \lambda_a$.

3. The light-emitting apparatus according to claim 1, wherein
the light-emitting device further includes a low-refractive-index layer between the photoluminescent layer and the excitation light source and between the light-transmissive layer and the excitation light source, and
the low-refractive-index layer has a lower refractive index for the first light than the photoluminescent layer.

4. The light-emitting apparatus according to claim 3, wherein the low-refractive-index layer has second projections facing the excitation light source.

5. The light-emitting apparatus according to claim 1, wherein a light output side of the excitation light source is in direct contact with the photoluminescent layer or the light-transmissive layer.

6. The light-emitting apparatus according to claim 3, wherein a light output side of the excitation light source is in direct contact with the low-refractive-index layer.

7. The light-emitting apparatus according to claim 1, wherein the light-emitting device further includes a selective reflective layer that selectively reflects light passing through the photoluminescent layer.

8. The light-emitting apparatus according to claim 1, wherein the photoluminescent layer is in contact with the light-transmissive layer.

9. The light-emitting apparatus according to claim 1, wherein the submicron structure has both the projections and the recesses.

10. The light-emitting apparatus according to claim 1, wherein the photoluminescent layer includes a phosphor.

11. The light-emitting apparatus according to claim 1, wherein 380 nm≤$\lambda_a$≤780 nm is satisfied.

12. The light-emitting apparatus according to claim 1, wherein the thickness of the photoluminescent layer, the refractive index $n_{wav-a}$, and the distance $D_{int}$ are set to allow an electric field to be formed in the photoluminescent layer, in which antinodes of the electric field are located in areas, the areas each corresponding to respective one of the projections and/or recesses.

13. The light-emitting apparatus according to claim 1, wherein the light-transmissive layer is located indirectly on the photoluminescent layer.

14. The light-emitting apparatus according to claim 1, wherein the thickness of the photoluminescent layer, the refractive index $n_{wav-a}$, and the distance $D_{int}$ are set to allow an electric field to be formed in the photoluminescent layer, in which antinodes of the electric field are located at, or adjacent to, at least the projections or recesses.

15. The light-emitting apparatus according to claim 1, wherein the light-emitting device further includes a substrate that has a refractive index $n_{s-a}$ for the first light and is located on the photoluminescent layer, wherein $\lambda_a/n_{wav-a} < D_{int} < \lambda_a/n_{s-a}$ is satisfied.

16. A light-emitting apparatus comprising a light-emitting device and an excitation light source, wherein
the excitation light source is integrally provided with the light-emitting device and emits excitation light, and
the light-emitting device includes:
a light-transmissive layer having a submicron structure; and
a photoluminescent layer that is located on the submicron structure and emits light in response to the excitation light, wherein
the photoluminescent layer has a first surface perpendicular to a thickness direction thereof, an area of the first surface being larger than a sectional area of the photoluminescent layer perpendicular to the first surface,
the light emitted from the photoluminescent layer includes first light having a wavelength $\lambda_a$ in air,
at least one of the photoluminescent layer and the light-transmissive layer has a light emitting surface perpendicular to the thickness direction of the photoluminescent layer, the first light being emitted from the light emitting surface,
the submicron structure includes at least one periodic structure comprising at least projections or recesses arranged perpendicular to the thickness direction of the photoluminescent layer,
a refractive index $n_{wav-a}$ of the photoluminescent layer for the first light and a period $p_a$ of the at least one periodic structure satisfy $\lambda_a/n_{wav-a} < p_a < \lambda_a$, and
a thickness of the photoluminescent layer, the refractive index $n_{wav-a}$, and the period $p_a$ are set to limit a directional angle of the first light emitted from the light emitting surface.

17. A light-emitting apparatus comprising a light-emitting device and an excitation light source, wherein
the excitation light source is integrally provided with the light-emitting device and emits excitation light, and
the light-emitting device includes:
a photoluminescent layer emitting light in response to the excitation light; and
a light-transmissive layer that has a higher refractive index than the photoluminescent layer, and has a submicron structure, wherein the light emitted from the photoluminescent layer includes first light having a wavelength $\lambda_a$ in air,
the photoluminescent layer has a first surface perpendicular to a thickness direction thereof, an area of the first surface being larger than a sectional area of the photoluminescent layer perpendicular to the first surface,
at least one of the photoluminescent layer and the light-transmissive layer has a light emitting surface perpendicular to the thickness direction of the photoluminescent layer, the first light being emitted from the light emitting surface,
the submicron structure includes at least one periodic structure comprising at least projections or recesses arranged perpendicular to the thickness direction of the photoluminescent layer,
a refractive index $n_{wav-a}$ of the photoluminescent layer for the first light and a period $p_a$ of the at least one periodic structure satisfy $\lambda_a/n_{wav-a} < p_a < \lambda_a$, and
a thickness of the photoluminescent layer, the refractive index $n_{wav-a}$, and the period $p_a$ are set to limit a directional angle of the first light emitted from the light emitting surface.

18. A light-emitting apparatus comprising a light-emitting device and an excitation light source, wherein
the excitation light source is integrally provided with the light-emitting device and emits excitation light,
the light-emitting device includes a photoluminescent layer emitting light in response to the excitation light, and has a submicron structure, the photoluminescent layer has a first surface perpendicular to a thickness direction thereof, an area of the first surface being larger than a sectional area of the photoluminescent layer perpendicular to the first surface, the submicron structure includes at least one periodic structure comprising at least projections or recesses arranged perpendicular to the thickness direction of the photoluminescent layer, the light emitted from the photoluminescent layer includes first light having a wavelength $\lambda_a$ in air, the photoluminescent layer has a light emitting surface perpendicular to the thickness direction of the photoluminescent layer, the first light being emitted from the light emitting surface, a refractive index $n_{wav-a}$ of the photoluminescent layer for the first light and a period $p_a$ of the at least one periodic structure satisfy $\lambda_a/n_{wav-a} < p_a < \lambda_a$, and a thickness of the photoluminescent layer, the refractive index $n_{wav-a}$, and the period $p_a$ are set to limit a directional angle of the first light emitted from the light emitting surface.

* * * * *